(12) United States Patent
Fuchs et al.

(10) Patent No.: US 12,112,762 B2
(45) Date of Patent: *Oct. 8, 2024

(54) APPARATUS AND METHOD FOR ENCODING OR DECODING DIRECTIONAL AUDIO CODING PARAMETERS USING DIFFERENT TIME/FREQUENCY RESOLUTIONS

(71) Applicant: Fraunhofer-Gesellschaft zur Förderung der angewandten Forschung e.V., Munich (DE)

(72) Inventors: Guillaume Fuchs, Bubenreuth (DE); Jürgen Herre, Erlangen (DE); Fabian Küch, Erlangen (DE); Stefan Döhla, Erlangen (DE); Markus Multrus, Nuremberg (DE); Oliver Thiergart, Erlangen (DE); Oliver Wübbolt, Hannover (DE); Florin Ghido, Nuremberg (DE); Stefan Bayer, Nuremberg (DE); Wolfgang Jaegers, Forchheim (DE)

(73) Assignee: FRAUNHOFER-GESELLSCHAFT ZUR FÖRDERUNG DER ANGEWANDTEN FORSCHUNG E.V., Munich (DE)

( * ) Notice: Subject to any disclaimer, the term of this patent is extended or adjusted under 35 U.S.C. 154(b) by 0 days.

This patent is subject to a terminal disclaimer.

(21) Appl. No.: 18/456,670

(22) Filed: Aug. 28, 2023

(65) Prior Publication Data

US 2023/0410819 A1   Dec. 21, 2023

Related U.S. Application Data

(63) Continuation of application No. 16/871,223, filed on May 11, 2020, now Pat. No. 11,783,843, which is a
(Continued)

(30) Foreign Application Priority Data

Nov. 17, 2017   (EP) .................................. 17202393

(51) Int. Cl.
*G10L 19/008* (2013.01)
*G10L 19/02* (2013.01)
(Continued)

(52) U.S. Cl.
CPC ........ *G10L 19/008* (2013.01); *G10L 19/0204* (2013.01); *G10L 19/032* (2013.01);
(Continued)

(58) Field of Classification Search
None
See application file for complete search history.

(56) References Cited

U.S. PATENT DOCUMENTS 6,446,037 B1   9/2002   Fielder
6,678,647 B1   1/2004   Edler
(Continued)

FOREIGN PATENT DOCUMENTS

CN   101925950 A   12/2010
CN   102422348 A   4/2012
(Continued)

OTHER PUBLICATIONS

Japanese language office action dated Aug. 14, 2023, issued in application No. JP 2022-133236.
(Continued)

*Primary Examiner* — Shaun Roberts
(74) *Attorney, Agent, or Firm* — McClure, Qualey & Rodack, LLP

(57) ABSTRACT

An apparatus for encoding directional audio coding parameters including diffuseness parameters and direction parameters includes: a parameter calculator for calculating the
(Continued)

diffuseness parameters with a first time or frequency resolution and for calculating the direction parameters with a second time or frequency resolution; and a quantizer and encoder processor for generating a quantized and encoded representation of the diffuseness parameters and the direction parameters.

33 Claims, 38 Drawing Sheets

Related U.S. Application Data continuation of application No. PCT/EP2018/081620, filed on Nov. 16, 2018.

(51) Int. Cl.
   *G10L 19/032* (2013.01)
   *G10L 19/038* (2013.01)
   *G10L 19/16* (2013.01)
   *G10L 19/26* (2013.01)
   *H03M 7/30* (2006.01)

(52) U.S. Cl.
   CPC .......... *G10L 19/038* (2013.01); *G10L 19/167* (2013.01); *G10L 19/26* (2013.01); *H03M 7/3082* (2013.01); *H03M 7/6005* (2013.01); *H03M 7/6011* (2013.01)

(56) References Cited

U.S. PATENT DOCUMENTS

| | | |
|---|---|---|
| 8,712,059 B2 | 4/2014 | Del Galdo et al. |
| 8,804,970 B2 | 8/2014 | Grill et al. |
| 8,891,797 B2 | 11/2014 | Thiergart et al. |
| 8,897,455 B2 | 11/2014 | Msser et al. |
| 9,154,896 B2 | 10/2015 | Mahabub et al. |
| 9,196,257 B2 | 11/2015 | Schultz-Amling et al. |
| 9,466,305 B2 | 10/2016 | Sen et al. |
| 9,530,421 B2 | 12/2016 | Jot et al. |
| 9,805,729 B2 | 10/2017 | Shi et al. |
| 10,483,913 B2 | 11/2019 | Najafi et al. |
| 2005/0108002 A1 | 5/2005 | Nagai et al. |
| 2007/0043575 A1 | 2/2007 | Onuma et al. |
| 2008/0232601 A1 | 9/2008 | Pulkki |
| 2008/0232616 A1 | 9/2008 | Pulkki |
| 2009/0164226 A1 | 6/2009 | Boehm et al. |
| 2009/0296808 A1 | 12/2009 | Regunathan et al. |
| 2010/0166191 A1 | 7/2010 | Herre |
| 2010/0286990 A1 | 11/2010 | Biswas et al. |
| 2010/0286991 A1 | 11/2010 | Hedelin et al. |
| 2011/0106545 A1 | 5/2011 | Disch et al. |
| 2011/0112843 A1 | 5/2011 | Shimada et al. |
| 2012/0101610 A1 | 4/2012 | Ojala et al. |
| 2012/0114126 A1 | 5/2012 | Thiergart et al. |
| 2013/0003998 A1 | 1/2013 | Kirkeby et al. |
| 2013/0022206 A1 | 1/2013 | Thiergart et al. |
| 2014/0355766 A1 | 12/2014 | Morrell et al. |
| 2014/0358565 A1 | 12/2014 | Peters et al. |
| 2014/0358567 A1 | 12/2014 | Koppens et al. |
| 2015/0127354 A1 | 5/2015 | Peters et al. |
| 2015/0332682 A1 | 11/2015 | Kim et al. |
| 2020/0273473 A1 | 8/2020 | Fuchs et al. |
| 2022/0036906 A1 | 2/2022 | Vasilache |

FOREIGN PATENT DOCUMENTS

| | | |
|---|---|---|
| CN | 102760437 A | 10/2012 |
| CN | 103428497 A | 12/2013 |
| CN | 106023999 A | 10/2016 |
| CN | 111656442 A | 9/2020 |
| CN | 113228168 A | 8/2021 |
| EP | 2154910 A1 | 2/2010 |
| EP | 2249334 A1 | 11/2010 |
| EP | 2346028 A1 | 7/2011 |
| EP | 2 437 257 A1 | 4/2012 |
| GB | 2554446 A | 4/2018 |
| JP | 2005-148274 A | 6/2005 |
| JP | 2006-003580 A | 1/2006 |
| JP | 2007-034230 A | 2/2007 |
| JP | 2007-532934 A | 11/2007 |
| JP | 2011-530720 A | 12/2011 |
| JP | 2012-526296 A | 10/2012 |
| JP | 2013-514696 A | 4/2013 |
| JP | 2013-524267 A | 6/2013 |
| JP | 2014-506416 A | 3/2014 |
| JP | 2020-526987 A | 8/2020 |
| RU | 2388068 C2 | 4/2010 |
| RU | 2011145865 C2 | 5/2013 |
| RU | 2586842 C2 | 6/2016 |
| TW | 201007702 A | 2/2010 |
| TW | 201142830 A | 12/2011 |
| TW | 201303851 A | 1/2013 |
| WO | 2001097511 A1 | 12/2001 |
| WO | 2009/086919 A1 | 7/2009 |
| WO | 2010/005050 A1 | 1/2010 |
| WO | 2011/120800 A1 | 10/2011 |
| WO | 2014/135235 A1 | 9/2014 |
| WO | 2014/192602 A1 | 12/2014 |

OTHER PUBLICATIONS

English language translation of office action dated Aug. 14, 2023 (pp. 1-10 of attachment).
Korean language Notice of Allowance dated Feb. 22, 2023, issued in application No. KR 10-2020-7017280.
Del Galdo, G., et al.; "Efficient methods for high quality merging of spatial audio streams in directional audio coding;" Audio Engineering Society Convention; May 2009; pp. 1-14.
Pulkki, V.; "Spatial sound reproduction with directional audio coding;" Journal of the Audio Engineering Society; Apr. 2007; pp. 503-516.
Ahonen J et al: "Diffuseness estimation using temporal variation of intensity vectors"; Applications of Signal Processing to Audio and Acoustics, 2009. WASPAA '09. IEEE Workshop on, IEEE, Piscataway, NJ, USA, Oct. 18, 2009 (Oct. 18, 2009), pp. 285-288, XP031575121.
Robert L. Bleidt et al: "Development of the MPEG-H TV Audio System for ATSC 3.0"; IEEE Transactions on Broadcasting., vol. 63, No. 1, Mar. 2, 2017 (Mar. 2, 2017), pp. 202-236, XP055545453.
V. Pulkki, M-V. Laitinen, J. Vilkamo, J. Ahonen, T. Lokki, and T. Pihlajamäki, "Directional audio coding—perception-based reproduction of spatial sound", International Workshop on the Principles and Application on Spatial Hearing, Nov. 2009, Zao; Miyagi, Japan.
V. Pulkki, "Virtual source positioning using vector base amplitude panning", J. Audio Eng. Soc., 45(6):456-466, Jun. 1997.
T. Hirvonen, J. Ahonen, and V. Pulkki, "Perceptual compression methods for metadata in Directional Audio Coding applied to audiovisual teleconference", AES 126th Convention, 2009, May 7-10, Munich, Germany.
Chinese language Official Letter and Search Report, Jun. 10, 2019 in Taiwan application No. 107141081.
English Translation of Official Letter and Search Report, Jun. 10, 2019 in Taiwan application No. 107141081.
Chinese language First Office Action, Jun. 16, 2020 from Taiwan application No. 107141081.
English Translation of First Office Action, Jun. 16, 2020 from Taiwan application No. 107141081.
Official Letter and Search Report, Jun. 10, 2019 from Taiwan application No. 107141079.
English Translation of Official Letter and Search Report, Jun. 10, 2019 from Taiwan application No. 107141079.
Written opinion, in PCT/2018/081620, dated Feb. 19, 2019.
International Search Report, in PCT/2018/081620, dated Feb. 19, 2019.
Indian Office Action, dated Mar. 13, 2021, parallel patent application No. 202017020129.

(56) References Cited

OTHER PUBLICATIONS

Li, G., et al.; "The perceptual lossless quantization of spatial parameter for 3D audio signals;" International conference on multimedia modeling, MMM 2017: MultiMedia Modeling; Jan. 2017, Proceedings, Part II; pp. 381-392.
Japanese language office action dated Jul. 12, 2021, issued in application No. JP 2020-526987.
English language translation of office action dated Jul. 12, 2021, issued in application No. JP 2020-526987.
Japanese language office action dated Jul. 12, 2021, issued in application No. JP 2020-526994.
English language translation of office action dated Jul. 12, 2021, issued in application No. JP 2020-526994.
Korean language office action dated Apr. 1, 2022, issued in application No. KR 10-2020-7017247.
Gray, R.M., et al.; "Quantization;" IEEE transactions on information theory; vol. 44; No. 6; Oct. 1998; pp. 2325-2383.
Chinese language office action dated Dec. 13, 2022, issued in application No. CN 201880086689.0.
English language translation of office action dated Dec. 13, 2022, issued in application No. CN 201880086689.0 (pp. 14-23 of attachment).
Pulkki, V.; Directional Audio Coding in Spatial Sound Reproduction and Stereo Upmixing; Conference: Audio Engineering Society Conference: 28th International Conference: The Future of Audio Technology-Surround and Beyond; Jun. 2006; pp. 1-8.
Pulkki, V., et al.; "Directional audio coding-perception-based reproduction of spatial sound;" International Workshop on the Principles and Application on Spatial Hearing; Nov. 2009; pp. 1-4.
Non-Final Office Action dated Jul. 27, 2023, issued in U.S. Appl. No. 17/571,970.
Korean language Notice of Allowance dated Aug. 4, 2023, issued in application No. KR 10-2020-7017247.
Russian Office Action, dated Dec. 30, 2021, parallel patent application No. 2020119761.
English Translation of Russian Office Action, dated Dec. 30, 2021, parallel patent application No. 2020119761.
Russian Office Action, dated Dec. 25, 2021, parallel patent application No. 2020119762.
English Translation of Russian Office Action, dated Dec. 25, 2021, parallel patent application No. 2020119762.
Search Report, accompanying Office Action dated Dec. 30, 2021, in parallel patent application No. 2020119761.
Search Report, accompanying Office Action dated Dec. 25, 2021, parallel patent application No. 2020119762.
Non-Final Office Action dated Aug. 10, 2021, issued in U.S. Appl. No. 16/867,856.
Chinese language office action dated Mar. 15, 2023, issued in application No. CN 201880086690.3.
English language translation of office action dated Mar. 15, 2023 (pp. 1-6 of attachment).
Xu, J., et al.; "DRA Multi-channel Digital Audio Signal Coding Algorithm;" Digital Signal Pocessing; Jun. 2013; pp. 54-57.
English language translation of abstract of "DRA Multi-channel Digital Audio Signal Coding Algorithm" (p. 1 of attachment).

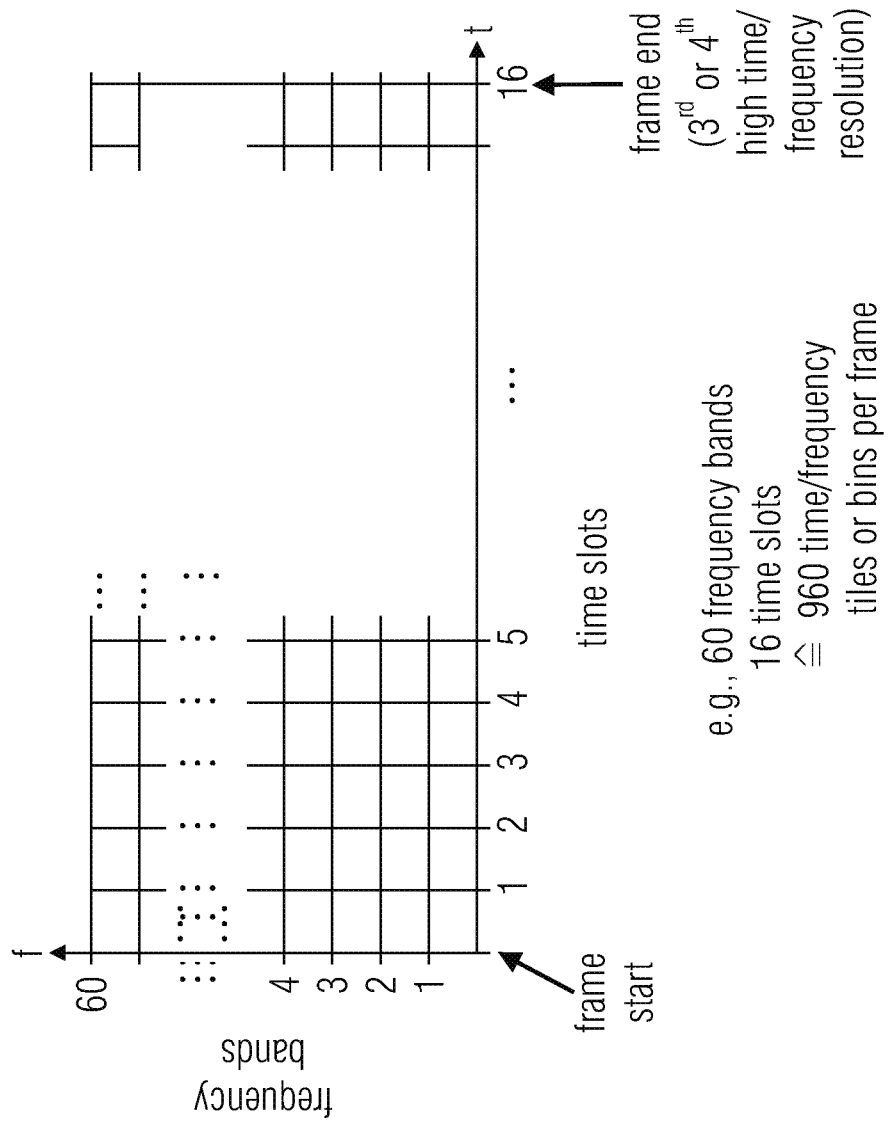

(low resolution)

(medium resolution)

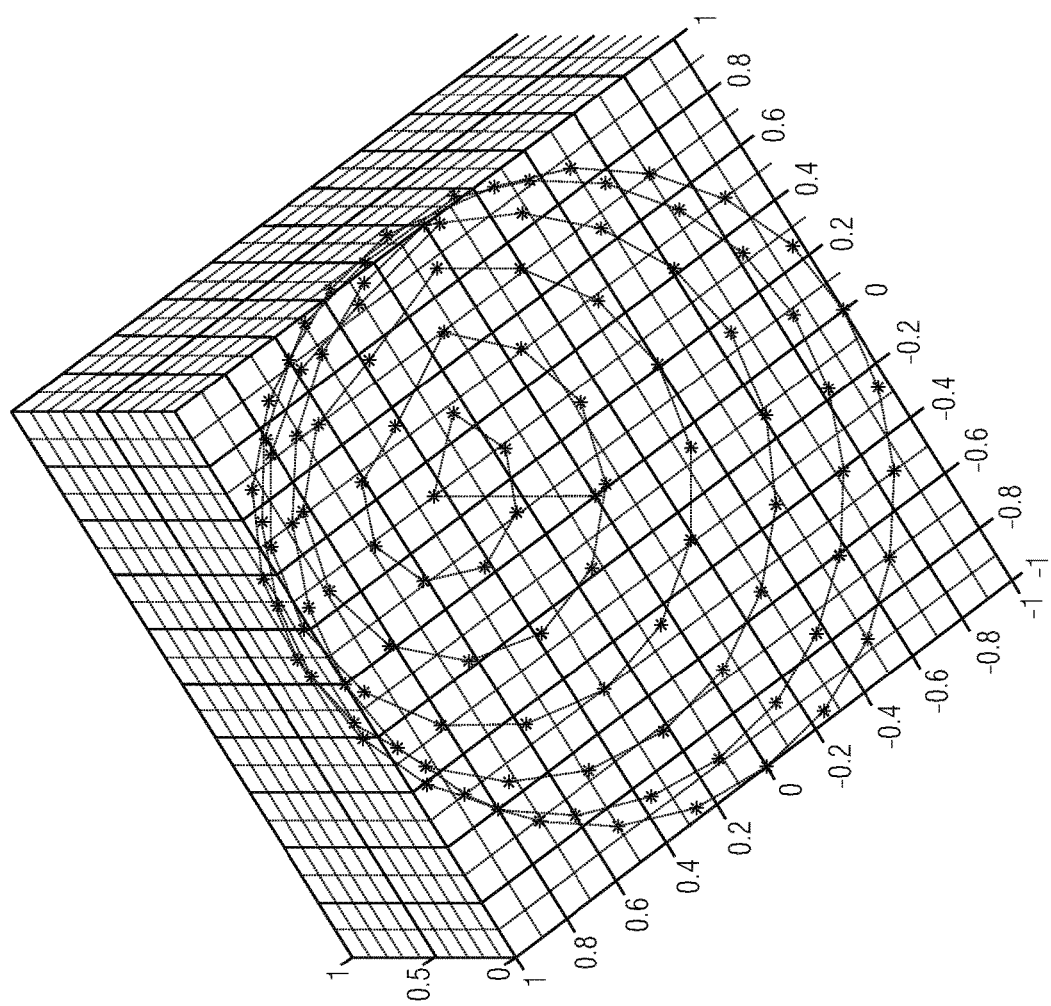

(optional pre-processing
of direction indexes for
both modes)

(modeling with projection for prediction)

(encoding, i.e., conversion into bits for transmission storage)

Encoder

Encoder/Decoder

Encoder

Encoder

Encoder

Encoder

Encoder
encoding of the average direction

Decoder

Decoder

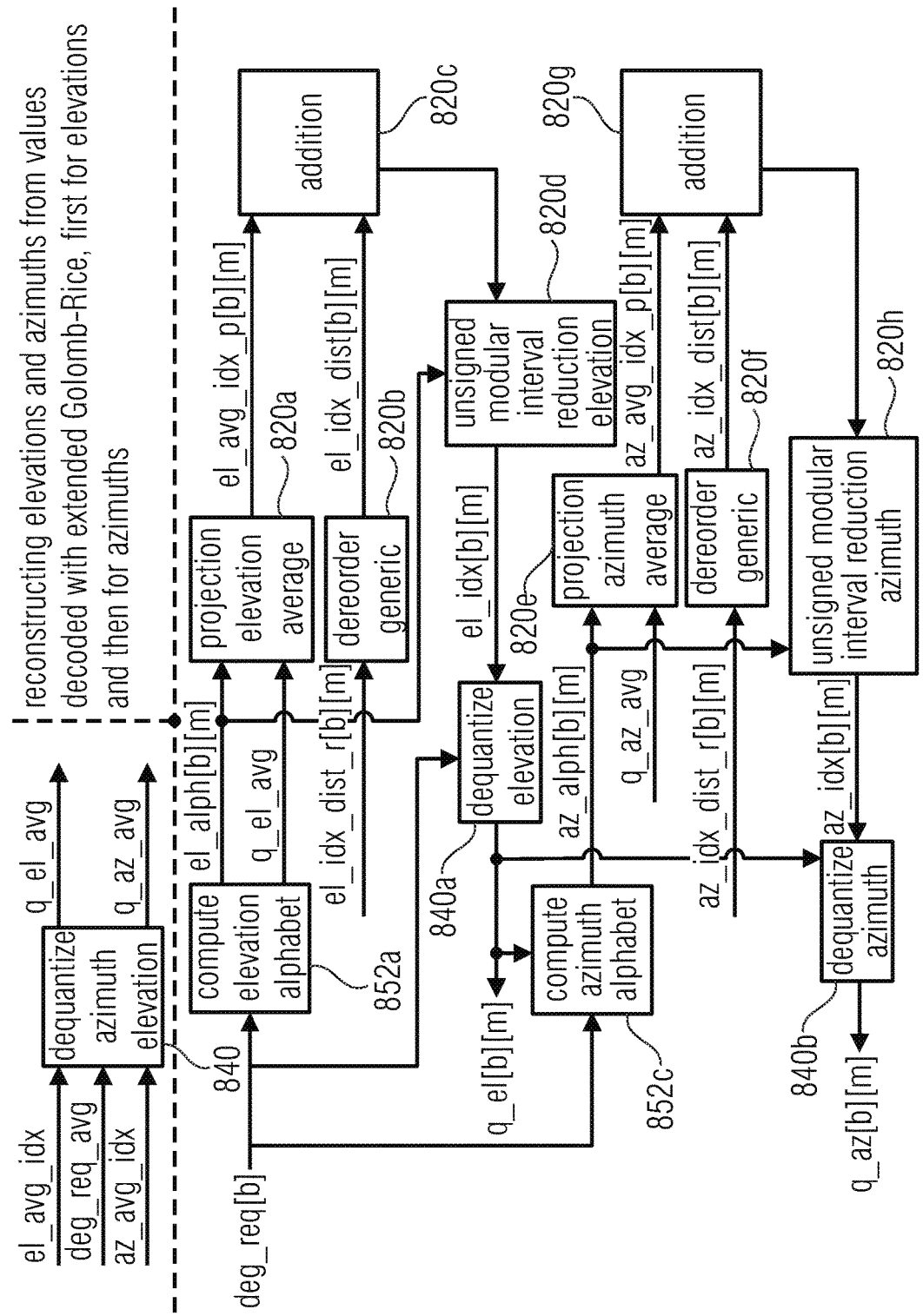

APPARATUS AND METHOD FOR ENCODING OR DECODING DIRECTIONAL AUDIO CODING PARAMETERS USING DIFFERENT TIME/FREQUENCY RESOLUTIONS

CROSS-REFERENCE TO RELATED APPLICATIONS

This application is a continuation of copending U.S. application Ser. No. 16/871,223, filed May 11, 2020, which is incorporated herein by reference in its entirety, which in turn is a continuation of copending International Application No. PCT/EP2018/081620, filed Nov. 16, 2018, which is incorporated herein by reference in its entirety, and additionally claims priority from European Application No. 17202393.9, filed Nov. 17, 2017, which is also incorporated herein by reference in its entirety.

TECHNICAL FIELD

The present invention is directed to audio signal processing and particularly to efficient coding schemes of directional audio coding parameters such as DirAC metadata.

The present invention aims to propose a low bit-rate coding solution for coding spatial metadata from a 3D audio scene analysis done by Directional Audio Coding (DirAC), a perceptually motivated technique for spatial audio processing.

BACKGROUND OF THE INVENTION

Transmitting an audio scene in three dimensions involves handling multiple channels which usually engenders a large amount of data to transmit. Directional Audio Coding (DirAC) technique [1] is an efficient approach for analyzing the audio scene and representing it parametrically. DirAC uses a perceptually motivated representation of the sound field based on direction of arrival (DOA) and diffuseness measured per frequency band. It is built upon the assumption that at one time instant and for one critical band, the spatial resolution of the auditory system is limited to decoding one cue for direction and another for inter-aural coherence. The spatial sound is then reproduced in frequency domain by cross-fading two streams: a non-directional diffuse stream and a directional non-diffuse stream.

The present invention discloses a 3D audio coding method based on the DirAC sound representation and reproduction for achieving transmission of immersive audio content at low bit-rates.

DirAC is a perceptually motivated spatial sound reproduction. It is assumed that at one time instant and for one critical band, the spatial resolution of the auditory system is limited to decoding one cue for direction and another for inter-aural coherence.

Based on these assumptions, DirAC represents the spatial sound in one frequency band by cross-fading two streams: a non-directional diffuse stream and a directional non-diffuse stream. The DirAC processing is performed in two phases: the analysis and the synthesis as pictured in FIGS. 10a and 10b.

In the DirAC analysis stage, a first-order coincident microphone in B-format is considered as input and the diffuseness and direction of arrival of the sound is analyzed in frequency domain.

In the DirAC synthesis stage, sound is divided into two streams, the non-diffuse stream and the diffuse stream. The non-diffuse stream is reproduced as point sources using amplitude panning, which can be done by using vector base amplitude panning (VBAP) [2]. The diffuse stream is responsible for the sensation of envelopment and is produced by conveying to the loudspeakers mutually decorrelated signals.

The DirAC parameters, also called spatial metadata or DirAC metadata in the following, consist of tuples of diffuseness and direction. Direction can be represented in spherical coordinates by two angles, the azimuth and the elevation, while the diffuseness is a scalar factor between 0 and 1.

FIG. 10a shows a filter bank 130 receiving the B-format input signal. An energy analysis 132 and an intensity analysis 134 are performed. A temporal averaging for the energy results indicated at 136 and a temporal averaging for the intensity results indicated at 138 are performed and, from the average data, the diffuseness values for the individual time/frequency bins are calculated as indicated at 110. The direction values for the time/frequency bins given by the time or frequency resolution of the filter bank 130 are calculated by block 120.

In the DirAC synthesis illustrated at FIG. 10b, again an analysis filter bank 431 is used. A virtual microphone processing block 421 is applied, where the virtual microphones correspond to, for example, loudspeaker positions of a 5.1 loudspeaker setup, for example. The diffuseness metadata are processed by corresponding processing blocks 422 for the diffuseness and by a VBAP (vector based amplitude panning) gain table indicated at block 423. A loudspeaker averaging block 424 is configured to perform gain averaging and a corresponding normalization block 425 is applied so as to have corresponding defined loudness levels in the individual final loudspeaker signals. A microphone compensation is performed in block 426.

The resulting signals are used for generating, on the one hand, a diffuse stream 427 that comprises a decorrelation stage and, additionally, a non-diffuse stream 428 is generated as well. Both the streams are added in adder 429 for the corresponding sub-band and in block 431, an addition with other sub-bands, i.e., a frequency-to-time conversion is performed. Thus, block 431 can also be considered to be a synthesis filter bank. Similar processing operations are done for the other channels from a certain loudspeaker setup, where, for a different channel, the setting of the virtual microphones in block 421 will be different.

In the DirAC analysis stage, a first-order coincident microphone in B-format is considered as input and the diffuseness and direction of arrival of the sound is analyzed in frequency domain.

In the DirAC synthesis stage, sound is divided into two streams, the non-diffuse stream and the diffuse stream. The non-diffuse stream is reproduced as point sources using amplitude panning, which can be done by using vector base amplitude panning (VBAP) [2]. The diffuse stream is responsible for the sensation of envelopment and is produced by conveying to the loudspeakers mutually decorrelated signals.

The DirAC parameters, also called spatial metadata or DirAC metadata in the following, consist of tuples of diffuseness and direction. Direction can be represented in spherical coordinates by two angles, the azimuth and the elevation, while the diffuseness is a scalar factor between 0 and 1.

If a STFT is considered as the time-frequency transform with a time resolution of 20 ms, which is usually recommended in several papers, and with an overlap of 50% between adjacent analysis windows, DirAC analysis will produce, for an input sampled at 48 kHz, 288000 values per second, which corresponds if angles are quantized on 8 bits to a total bit-rate of about 2.3 Mbit/s. The amount of data is not suitable for achieving low bit-rate spatial audio coding, and an efficient coding scheme of the DirAC metadata is therefore needed.

Previous works regarding the reduction of metadata were mainly focused on teleconference scenarios, where the capability of DirAC was greatly reduced for allowing a minimal data-rate of its parameters [4]. Indeed, it is proposed to limit the directional analysis to the azimuth in the horizontal plane for reproducing only a 2D audio scene. Moreover, diffuseness and azimuth are only transmitted up to 7 kHz, limiting the communication to wideband speech. Finally, the diffuseness is coarsely quantized on one or two bits, turning sometimes only on or off the diffuse stream in the synthesis stage, which is not generic enough when considering multiple audio sources and more than single speech over background noise. In [4], the azimuth was quantized on 3 bits and it was assumed that the source, in that case the speaker, has a very static position. Therefore, parameters are only transmitted with a 50 ms update frequency. Based on these many strong assumptions, the demand for bits can be reduced to about 3 kbit/s.

SUMMARY

According to an embodiment, an apparatus for encoding directional audio coding parameters having diffuseness parameters and direction parameters may have: a parameter calculator for calculating the diffuseness parameters with a first time or frequency resolution and for calculating the direction parameters with a second time or frequency resolution; and a quantizer and encoder processor for generating a quantized and encoded representation of the diffuseness parameters and the direction parameters.

According to another embodiment, a method for encoding directional audio coding parameters having diffuseness parameters and direction parameters may have the steps of: calculating the diffuseness parameters with a first time or frequency resolution and for calculating the direction parameters with a second time or frequency resolution; and generating a quantized and encoded representation of the diffuseness parameters and the direction parameters.

According to still another embodiment, a decoder for decoding an encoded audio signal having directional audio coding parameters having encoded diffuseness parameters and encoded direction parameters may have: a parameter processor for decoding the encoded directional audio coding parameters to acquire decoded diffuseness parameters with a first time or frequency resolution and decoded direction parameters with a second time or frequency resolution; and a parameter resolution converter for converting the encoded or decoded diffuseness parameters or the encoded or decoded direction parameters into converted diffuseness parameters or converted direction parameters having a third time or frequency resolution.

According to another embodiment, a method of decoding an encoded audio signal having directional audio coding parameters having encoded diffuseness parameters and encoded direction parameters may have the steps of: decoding the encoded directional audio coding parameters to acquire decoded diffuseness parameters with a first time or frequency resolution and decoded direction parameters with a second time or frequency resolution; and converting the encoded or decoded diffuseness parameters or the encoded or decoded direction parameters into converted diffuseness parameters or converted direction parameters having a third time or frequency resolution.

Another embodiment may have a non-transitory digital storage medium having a computer program stored thereon to perform the method for encoding directional audio coding parameters having diffuseness parameters and direction parameters, the method having the steps of: calculating the diffuseness parameters with a first time or frequency resolution and for calculating the direction parameters with a second time or frequency resolution; and generating a quantized and encoded representation of the diffuseness parameters and the direction parameters, when said computer program is run by a computer.

Another embodiment may have a non-transitory digital storage medium having a computer program stored thereon to perform the method of decoding an encoded audio signal having directional audio coding parameters having encoded diffuseness parameters and encoded direction parameters, the method having the steps of: decoding the encoded directional audio coding parameters to acquire decoded diffuseness parameters with a first time or frequency resolution and decoded direction parameters with a second time or frequency resolution; and converting the encoded or decoded diffuseness parameters or the encoded or decoded direction parameters into converted diffuseness parameters or converted direction parameters having a third time or frequency resolution, when said computer program is run by a computer.

In accordance with one aspect, the present invention is based on the finding that an enhanced quality on the one hand and, at the same time, a reduced bitrate for encoding the spatial audio coding parameters on the other hand is obtained when the diffuseness parameters on the one hand and the direction parameters on the other hand are provided with different resolutions and the different parameters with different resolutions are quantized and encoded to obtain the encoded directional audio coding parameters.

In an embodiment, the time or frequency resolution for the diffuseness parameters is lower than the time or frequency resolution of the directional parameters. In a further embodiment, a grouping not only over frequency but also over time is performed. The original diffuseness/directional audio coding parameters are calculated with a high resolution, for example, for high resolution time/frequency bins, and a grouping and advantageously a grouping with averaging is performed for calculating a resulting diffuseness parameter with a low time or frequency resolution and for calculating a resulting directional parameter with a medium time or frequency resolution, i.e., with a time or frequency resolution being in between of the time or frequency resolution for the diffuseness parameter and the original high resolution, with which the original raw parameters have been calculated.

In embodiments, the first and second time resolutions are different and the first and second frequency resolutions are the same or vice versa, i.e., that the first and second frequency resolutions are different but the first and second time resolutions are the same. In a further embodiment, both the first and second time resolutions are different and the first and second frequency resolutions are different as well. Hence, the first time or frequency resolution can also be considered a first time-frequency resolution and the second time or frequency resolution can also be considered a second time-frequency resolution.

In a further embodiment, grouping of the diffuseness parameters is done with a weighted addition, where the weighting factors for the weighted addition are determined based on the power of the audio signal so that time/frequency bins having a higher power or, generally, a higher amplitude-related measure for the audio signal have a higher influence on the result than a diffuseness parameter for a time/frequency bin, in which the signal to be analyzed has a lower power or lower energy-related measure.

It is additionally advantageous to perform a two-fold weighted averaging for the calculation of the grouped directional parameters. This two-fold weighted averaging is done in such a way that directional parameters from time/frequency bins have a higher influence on the final result, when the power of the original signal was quite high in this time/frequency bin. At the same time the diffuseness value for the corresponding bin is also taken into account so that, in the end, a directional parameter from a time/frequency bin having associated a high diffuseness has a lower impact on the final result compared to a directional parameter having a low diffuseness, when the power was the same in both time/frequency bins.

It is advantageous to perform a processing of the parameters in frames, where each frame is organized in a certain number of bands, where each band comprises at least two original frequency bins, in which the parameters have been calculated. The bandwidth of the bands, i.e., the number of original frequency bins increases with an increasing band number so that higher frequency bands are broader than lower frequency bands. It has been found that, in embodiments, the number of diffuseness parameters per band and frame is equal to one while the number of directional parameters per frame and band is two or even greater than two such as four, for example. It has been found that the same frequency resolution, but a different time resolution, for the diffuseness and directional parameters is useful, i.e., the number of bands for the diffuseness parameters and the directional parameters in a frame are equal to each other. These grouped parameters are then quantized and encoded by a quantizer and encoder processor.

In accordance with a second aspect of the present invention, the object of providing an improved processing concept for the spatial audio coding parameters is achieved by a parameter quantizer for quantizing the diffuseness parameters and the direction parameters and the subsequently connected parameter encoder for encoding the quantized diffuseness parameters and the quantized direction parameters and the corresponding output interface for generating the encoded parameter representation comprising information on encoded diffuseness parameters and encoded direction parameters. Thus, by quantization and subsequent entropy coding, a significant data rate reduction is obtained.

The diffuseness parameters and the direction parameters input into the encoder can be high resolution diffuseness/direction parameters or grouped or non-grouped low resolution directional audio coding parameters. One feature of a parameter quantizer is that the quantization precision for quantizing direction parameters is derived from the diffuseness value of the diffuseness parameter associated with the same time/frequency region. Thus, in one feature of the second aspect, the direction parameters that are associated with diffuseness parameters having a high diffuseness are quantized less precisely compared to direction parameters being associated with time/frequency regions having a diffuseness parameter indicating a low diffuseness.

The diffuseness parameters themselves can be entropy encoded in a raw coding mode, or can be encoded in a single value encoding mode when the diffuseness parameters for the bands of a frame have the same value throughout the frame. In other embodiments, the diffuseness values can be encoded in a two consecutive values only procedure.

Another feature of the second aspect is that the direction parameters are converted into an azimuth/elevation representation. In this feature, the elevation value is used to determine the alphabet for the quantization and encoding of the azimuth value. The azimuth alphabet has the greatest amount of different values when the elevation indicates a zero angle or generally an equator angle on the unit sphere. The smallest amount of values in the azimuth alphabet is when the elevation indicates the north or south pole of the unit sphere. Hence, the alphabet value decreases with an increasing absolute value of the elevation angle counted from the equator.

This elevation value is quantized with a quantization precision determined from the corresponding diffuseness value, and, the quantization alphabet on the one hand and the quantization precision on the other hand determine the quantization and typically entropy coding of the corresponding azimuth values.

Thus, an efficient and parameter-adapted processing is performed that removes as much irrelevance as possible and, at the same time, applies a high resolution or high precision to regions where it is worth to do so while in other regions such as the north pole or south pole of the unit sphere, the precision is not so high, compared to the equator of the unit sphere.

The decoder-side operating in accordance with the first aspect performs whatever kind of decoding and performs a corresponding de-grouping with the encoded or decoded diffuseness parameters and the encoded or decoded direction parameters. Thus, a parameter resolution conversion is performed to enhance the resolution from the encoded or decoded directional audio coding parameter to a resolution that is finally used by an audio renderer to perform rendering of an audio scene. In the course of this resolution conversion, a different resolution conversion is performed for the diffuseness parameters on the one hand and the direction parameters on the other hand.

The diffuseness parameters typically are encoded with a low resolution and, therefore one diffuseness parameter has to be multiplied or copied several times to obtain a high resolution representation. On the other hand, a corresponding directional parameter has to be copied less often or multiplied less often compared to a diffuseness parameter, since the resolution of the directional parameters is already greater than the resolution of the diffuseness parameters in the encoded audio signal.

In an embodiment, the copied or multiplied directional audio coding parameters are applied as they are or are processed such as smoothed or low pass filtered in order to avoid artifacts caused by parameters strongly changing over frequency and/or time. However, since in an embodiment, the application of the resolution-converted parametric data is performed in the spectral domain, the corresponding frequency-time conversion of the rendered audio signal from the frequency domain into the time domain performs an inherent averaging due to a applied overlap and add procedure that is a feature typically included in synthesis filter banks.

On the decoder-side in accordance with the second aspect, the specific procedures performed on the encoder side with respect to entropy coding on the one hand and quantization on the other hand are undone. It is advantageous to determine the dequantization precision on the decoder side from the typically quantized or dequantized diffuseness parameter associated with the corresponding direction parameter.

It is advantageous to determine the alphabet for the elevation parameter from the corresponding diffuseness value and its related dequantization precision. It is also advantageous for the second aspect to perform the determination of dequantization alphabet for the azimuth parameter based on the value of the quantized or dequantized elevation parameter.

In accordance with the second aspect, a raw coding mode on the one hand or an entropy coding mode on the other hand is performed on the encoder side and the mode resulting in a lower number of bits is selected within the encoder and signaled to the decoder via some side information. Typically, the raw encoding mode is performed for directional parameters having associated therewith high diffuseness values while the entropy coding mode is tried for directional parameters having associated therewith lower diffuseness values. In the entropy coding mode with raw coding, the azimuth and elevation values are merged into a sphere index and the sphere index is then encoded using a binary code or a punctured code and, on the decoder-side this entropy coding is undone accordingly.

In the entropy coding mode with modeling, an average elevation and azimuth value are calculated for the frame, and residual values with respect to these average values are actually calculated. Thus, a kind of prediction is performed and the prediction residual values, i.e., the distance for elevation and azimuth are entropy encoded. For this purpose, it is advantageous to perform an extended Golomb-Rice procedure relying on a Golomb-Rice parameter that is determined on the encoder side and encoded, in addition to the signed distances and the average values. On the decoder-side as soon as entropy coding with modeling, i.e., this decoding mode, is signaled and determined by the side information evaluation in the decoder, the decoding with the extended Golomb-Rice procedure is done using the encoded averages, the encoded signed distances and the corresponding Golomb-Rice parameters for elevation and azimuth.

BRIEF DESCRIPTION OF THE DRAWINGS

Embodiments of the present invention will be detailed subsequently referring to the appended drawings, in which:

FIG. 2b illustrates an implementation of parameter calculator of FIG. 2a;

FIG. 2d illustrates a further implementation of the parameter calculator 100 of FIG. 2a;

FIG. 3a illustrates a time/frequency representation as obtained by the analysis filter bank 130 of FIG. 1a or 430 of FIG. 1b with a high time or frequency resolution;

FIG. 4d illustrates a quasi-uniform coverage of the unit sphere as applied for the purpose of quantization in an embodiment;

FIG. 5b illustrates a pre-processing of direction indices for both modes 30 of FIG. 5a;

FIG. 6a illustrates an implementation of the parameter quantizer of FIG. 4a;

FIG. 9c illustrates the reconstruction of the elevations and azimuths, when the decoding mode with modeling is active, and the subsequent dequantization;

DETAILED DESCRIPTION OF THE INVENTION

The present invention generalizes the compression of the DirAC metadata to any kind of scenario. The present invention is applied in a spatial coding system illustrated in FIG. 1a and FIG. 1b, where a DirAC-based spatial audio encoder and decoder are depicted.

The encoder analyses usually the spatial audio scene in B-format. Alternatively, DirAC analysis can be adjusted to analyze different audio formats like audio objects or multichannel signals or the combination of any spatial audio formats. The DirAC analysis extracts a parametric representation from the input audio scene. A direction of arrival (DOA) and a diffuseness measured per time-frequency unit form the parameters. The DirAC analysis is followed by a spatial metadata encoder, which quantizes and encodes the DirAC parameters to obtain a low bit-rate parametric representation. The latter module is the subject of this invention.

Along with the parameters, a down-mix signal derived from the different sources or audio input signals is coded for transmission by a conventional audio core-coder. In the embodiment, an EVS audio coder is advantageous for coding the down-mix signal, but the invention is not limited to this core-coder and can be applied to any audio core-coder. The down-mix signal consists of different channels, called transport channels: the signal can be, e.g., the four coefficient signals composing a B-format signal, a stereo pair or a monophonic down-mix depending of the targeted bit-rate. The coded spatial parameters and the coded audio bitstream are multiplexed before being transmitted over the communication channel.

In the decoder, the transport channels are decoded by the core-decoder, while the DirAC metadata is first decoded before being conveyed with the decoded transport channels to the DirAC synthesis. The DirAC synthesis uses the decoded metadata for controlling the reproduction of the direct sound stream and its mixture with the diffuse sound stream. The reproduced sound field can be reproduced on an arbitrary loudspeaker layout or can be generated in Ambisonics format (HOA/FOA) with an arbitrary order.

Figure 1A:
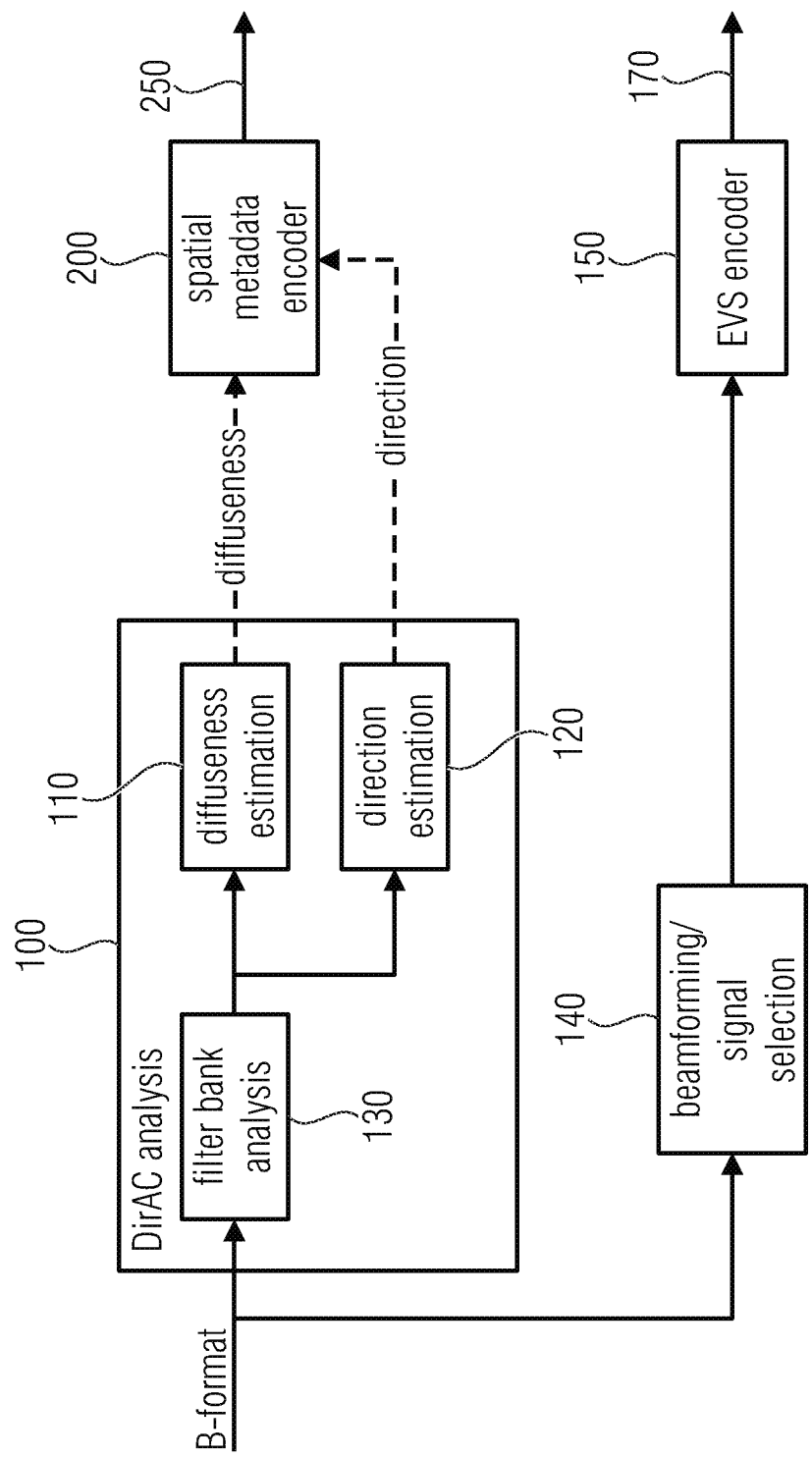
FIG. 1a illustrates an embodiment of the encoder side of the first aspect or the second aspect.

An audio encoder for encoding an audio signal such as the B-format input signal is illustrated in FIG. 1a. The audio encoder comprises a DirAC analyzer 100. The DirAC analyzer 100 may include an analysis filter bank 130, a diffuseness estimator 110, and a direction estimator 120. The diffuseness data and the direction data are output to a spatial metadata encoder 200 that, finally, outputs encoded metadata on line 250. The B-format signal may also be forwarded to a beam former/signal selector 140 that generates, from the input signal, a mono or stereo transport audio signal which is then encoded in an audio encoder 150 that is an EVS (Enhanced Voice Services) encoder. The encoded audio signal is output at 170. The encoded coding parameters indicated at 250 are input into a spatial metadata decoder 300. The encoded audio signal 170 is input into an audio decoder 340 that is implemented, in an embodiment and in line with the encoder-side implementation, as an EVS decoder.

The decoded transport signal is input into a DirAC synthesizer 400 together with the decoded directional audio coding parameters. In the embodiment illustrated in FIG. 1b, the DirAC synthesizer comprises an output synthesizer 420, an analysis filter bank 430 and a synthesis filter bank 440. At the output of the synthesis filter bank 400, the decoded multichannel signal 450 is obtained that can be forwarded to loudspeakers or that can, alternatively, be an audio signal in any other format such as a first order Ambisonics (FOA) or a high order Ambisonics (HOA) format. Naturally, any other parametric data such as MPS (MPEG Surround) data or SAOC (Spatial Audio Object Coding) data can be generated together with a transport channel being a mono-channel or a stereo-channel.

Generally, the output synthesizer operates by calculating, for each time-frequency bin as determined by the analysis filter bank 430, a direct audio signal on the one hand and a diffuse audio signal on the other hand. The direct audio signal is calculated based on the direction parameters and the relation between the direct audio signal and the diffuse audio signal in the final audio signal for this time/frequency bin, determined based on the diffuseness parameter so that a time/frequency bin having a high diffuseness parameter results in an output signal that has a high amount of the diffuse signal and a low amount of the direct signal while, a time/frequency bin having a low diffuseness results in an output signal having a high amount of the direct signal and a low amount of the diffuse signal.

Figure 2A:
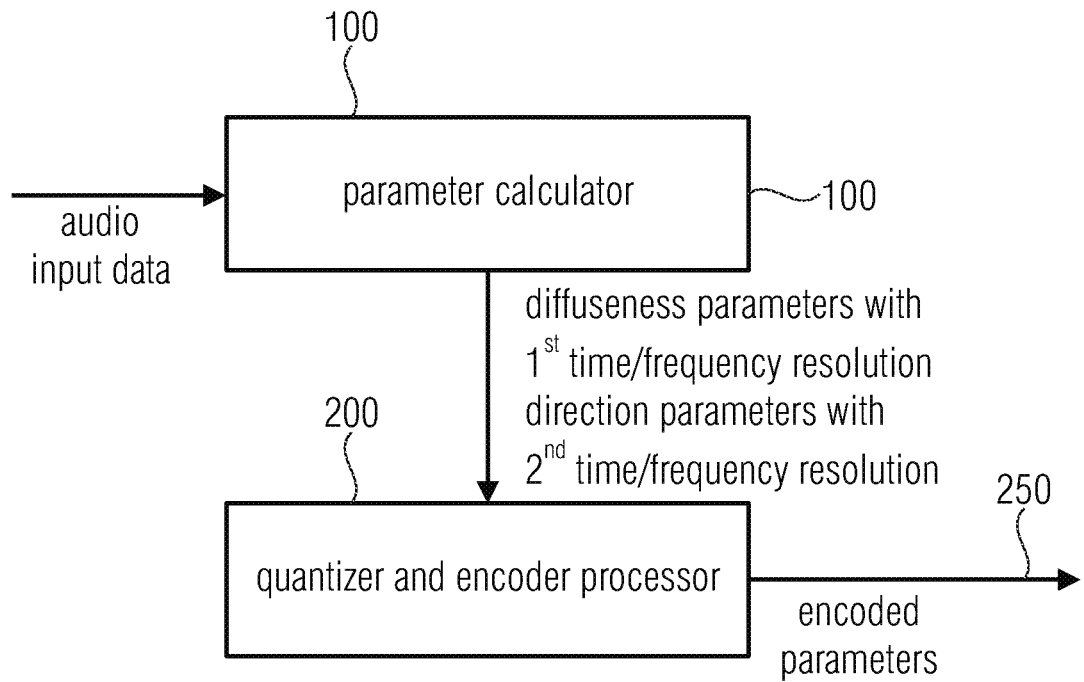
FIG. 2a illustrates an embodiment of an apparatus for encoding in accordance with the first aspect.

FIG. 2a illustrates an apparatus for encoding directional audio coding parameters comprising diffuseness parameters and direction parameters in accordance with the first aspect. The apparatus comprises a parameter calculator 100 for calculating the diffuseness parameters with a first time or frequency resolution and for calculating the direction parameters with a second time or frequency resolution. The apparatus comprises a quantizer and encoder processor 200 for generating a quantized and encoded representation of the diffuseness parameters and the direction parameters illustrated at 250. The parameter calculator 100 may comprise elements 110, 120, 130 of FIG. 1a, where the different parameters are already calculated in the first or the second time or frequency resolution.

Figure 2B:
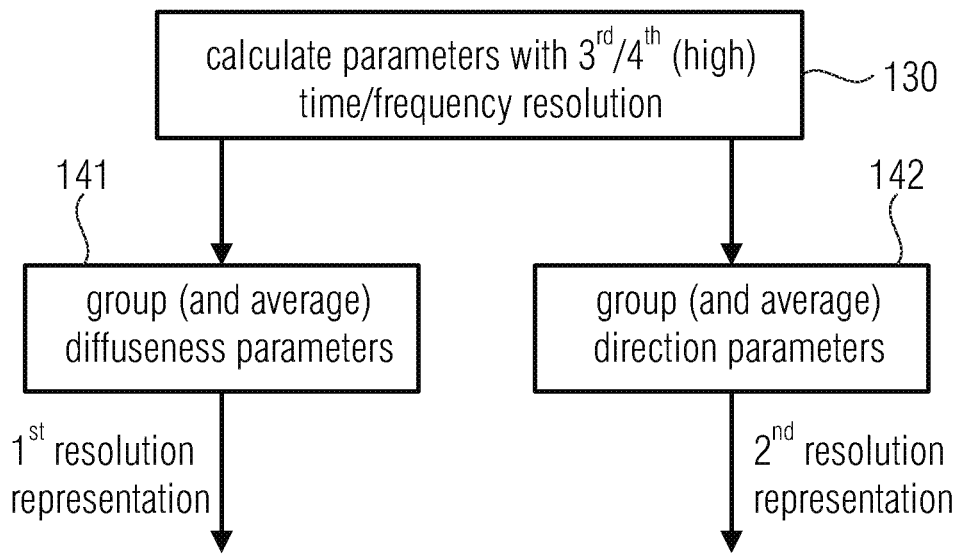

Alternatively, the implementation is illustrated in FIG. 2b. Here, the parameter calculator and, particularly, blocks 110, 120 in FIG. 1a are configured as illustrated in item 130 of FIG. 2b, i.e., that they calculate parameters with a third or fourth typically high time or frequency resolution. A grouping operation is performed. In order to calculate the diffuseness parameters, a grouping and averaging is done as illustrated in block 141 in order to obtain the diffuseness parameter representation with the first time or frequency resolution and, for the calculation of the direction parameters, a grouping (and averaging) is done in block 142 in order to obtain the direction parameter representation in the second time or frequency resolution.

The diffuseness parameters and the direction parameters are calculated so that the second time or frequency resolution is different from the first time or frequency resolution and the first time resolution is lower than the second time resolution or the second frequency resolution is greater than the first frequency resolution or, again alternatively, the first time resolution is lower than the second time resolution and the first frequency resolution is equal to the second frequency resolution.

Typically, the diffuseness parameters and the direction parameters are calculated for a set of frequency bands, where a band having a lower center frequency is narrower than a band having a higher center frequency. As already discussed with respect to FIG. 2b, the parameter calculator 100 is configured to obtain initial diffuseness parameters having a third time or frequency resolution and the parameter calculator 100 is also configured to obtain initial direction parameters having a fourth time or frequency resolution where, typically, the third and the fourth time or frequency resolutions are equal to each other.

The parameter calculator is then configured to group and average the initial diffuseness parameters so that the third time or frequency resolution is higher than the first time or frequency resolution, i.e., a resolution reduction is performed. The parameter calculator is also configured to group and average the initial direction parameters so that the fourth time or frequency resolution is higher than the second time or frequency resolution, i.e., a resolution reduction is performed. The third time of frequency resolution is a constant time resolution so that each initial diffuseness parameter is associated with a time slot or a frequency bin having the same size. The fourth time or frequency resolution is also a constant frequency resolution so that each initial direction parameter is associated with a time slot or a frequency bin having the same size.

The parameter calculator is configured to average over a first plurality of diffuseness parameters associated with a first plurality of time slots. The parameter calculator 100 is also configured to average over a second plurality of diffuseness parameters associated with the second plurality of frequency bins, and the parameter calculator is also configured to average over a third plurality of direction parameters associated with a third plurality of time slots or the parameter calculator is also configured to average over a fourth plurality of direction parameters associated with the four plurality of frequency bins.

Figure 2C:
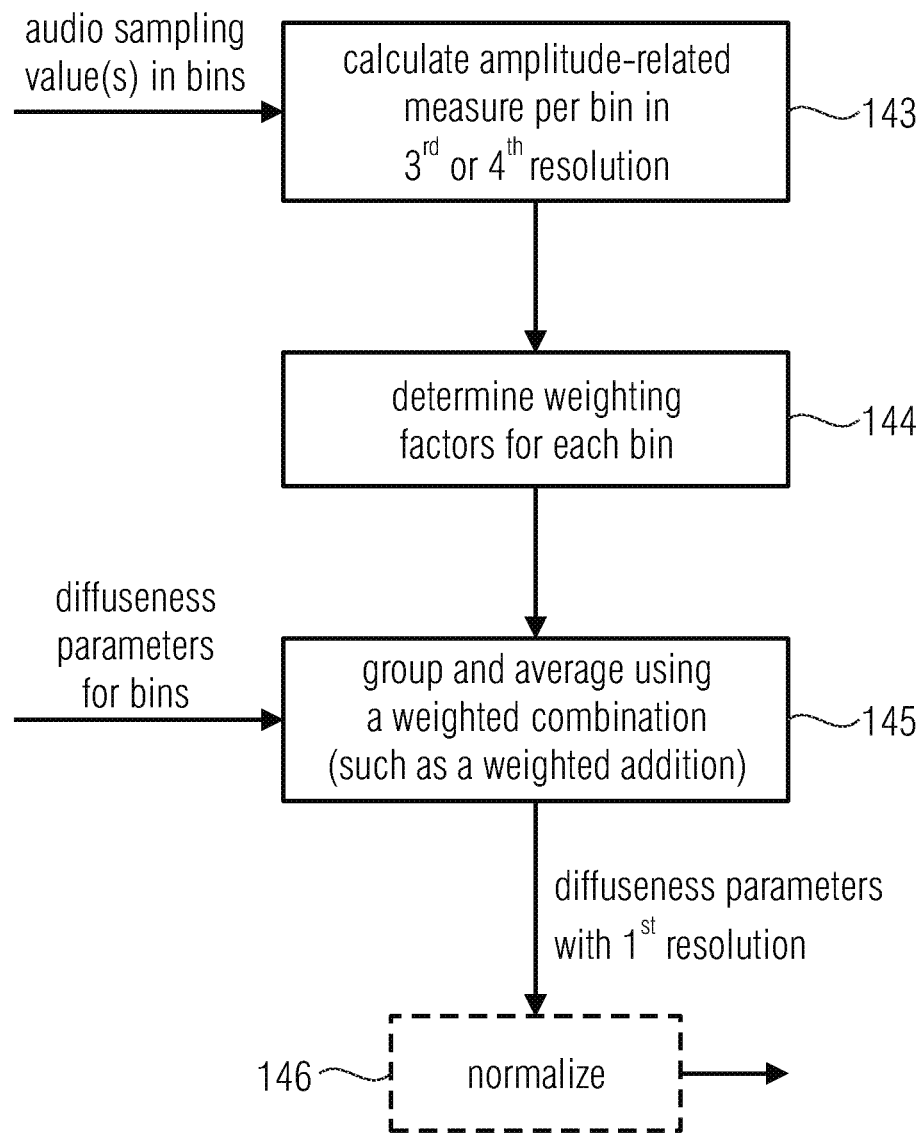
FIG. 2c illustrates a further implementation for the calculation of the diffuseness parameter.

As will be discussed with respect to FIG. 2c and FIG. 2d, the parameter calculator 100 is configured to perform a weighted average calculation where a diffuseness parameter or a direction parameter derived from an input signal portion having a higher amplitude-related measure is weighted using a higher weighting factor compared to a diffuseness parameter or a direction parameter derived from an input signal portion having a lower amplitude-related measure. The parameter calculator 100 is configured to calculate 143 and the amplitude related measure per bin in the third or the fourth time or frequency resolution as illustrated in FIG. 2c, item 143. In block 144, weighting factors for each bin are calculated and, in block 145, a grouping and averaging is performed using a weighted combination such as a weighted addition where the diffuseness parameters for the individual bins are input into block 145. At the output of block 145, the diffuseness parameters with the first time or frequency resolution are obtained that can, subsequently be normalized in block 146 but this procedure is only optional.

Figure 2D:
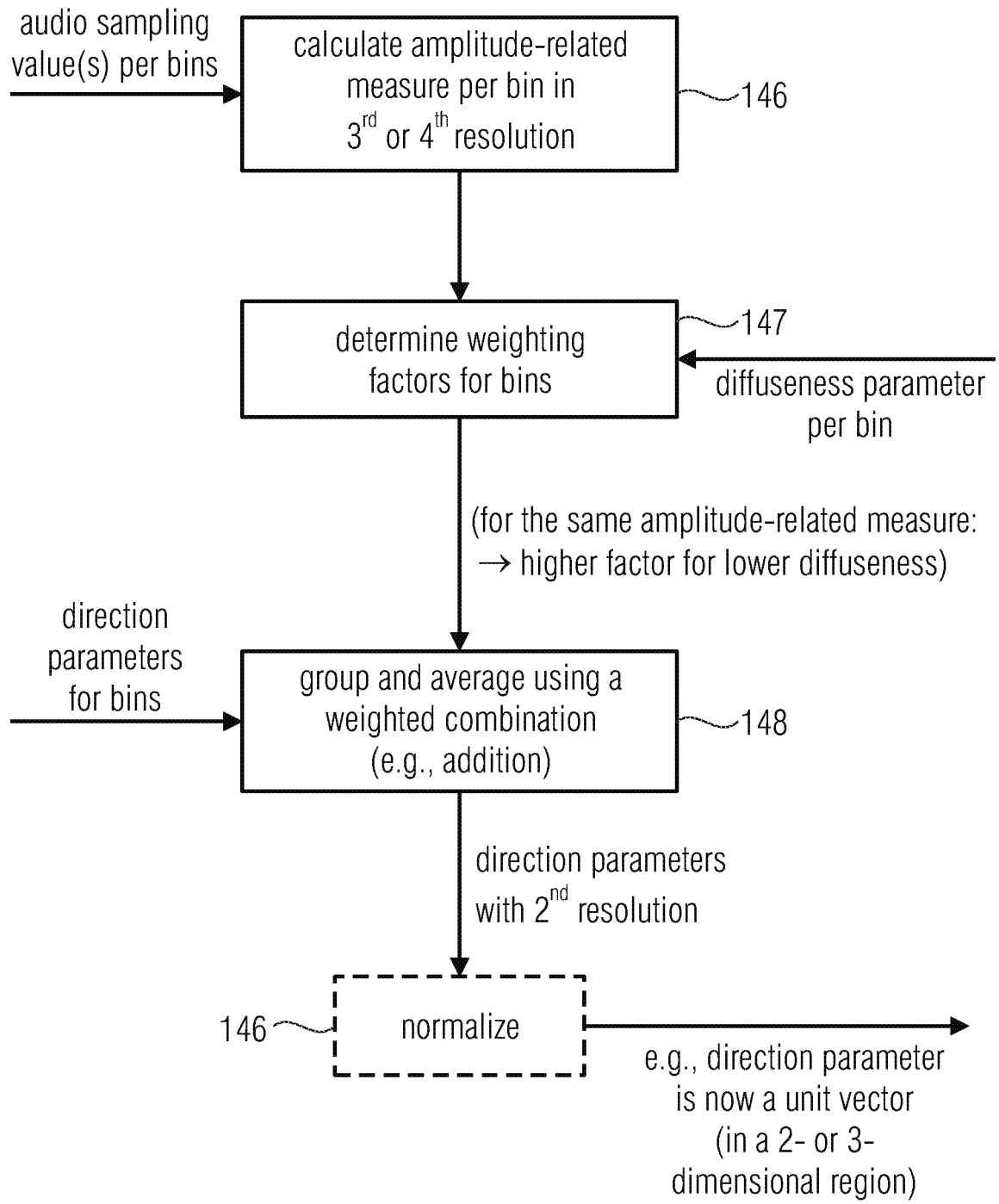

FIG. 2d illustrates the calculation of the direction parameters with the second resolution. In block 146, the amplitude-related measure is calculated per bin in the third or fourth resolution similar to item 143 of FIG. 2c. In block 147, weighting factors are calculated for each bin, but not only dependent on the amplitude-related measure obtained from block 147 but also using the corresponding diffuseness parameter per bin as illustrated in FIG. 2d. Thus, for the same amplitude-related measure, a higher factor is typically calculated for a lower diffuseness. In block 148, a grouping and averaging is performed using a weighted combination such as an addition and the result can be normalized as illustrated in optional block 146. Thus, at the output of block 146, the direction parameter is obtained as a unit vector corresponding to a two-dimensional or three-dimensional region such as a Cartesian vector that can easily be converted into a polar form having an azimuth value and an elevation value.

Figure 1B:
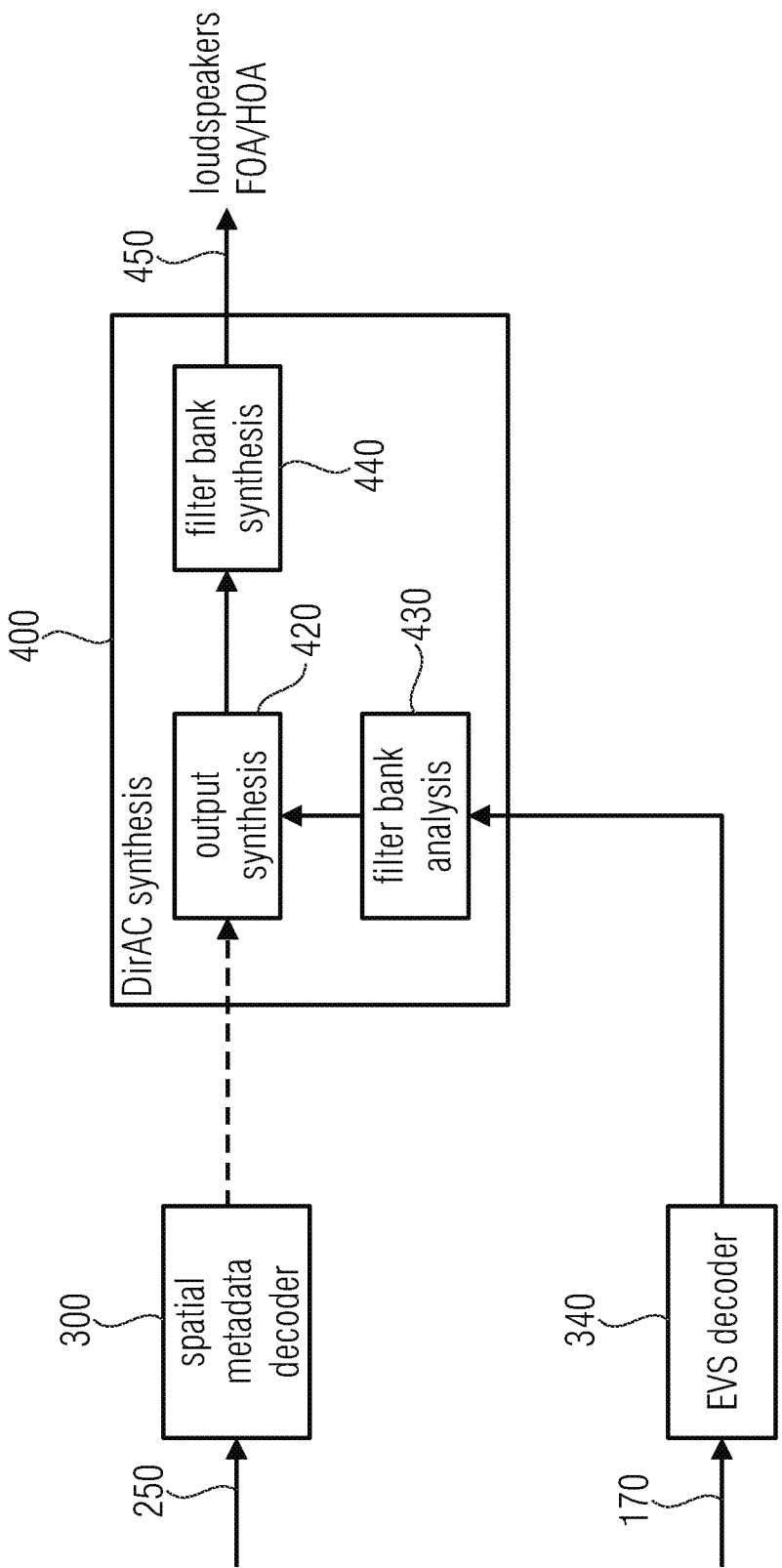
FIG. 1b illustrates an embodiment of the decoder side of the first aspect or the second aspect.

FIG. 3a illustrates a time/frequency raster as obtained by the filter bank analysis 430 of FIG. 1a and FIG. 1b or as applied by the filter bank synthesis 440 of FIG. 1b. In an embodiment, the whole frequency range is separated in 60 frequency bands and a frame additionally has 16 time slots. This high time or frequency resolution is the third or the fourth high time or frequency resolution. Thus, starting from 60 frequency bands and 16 time slots, 960 time/frequency tiles or bins per frame are obtained.

Figure 3B:
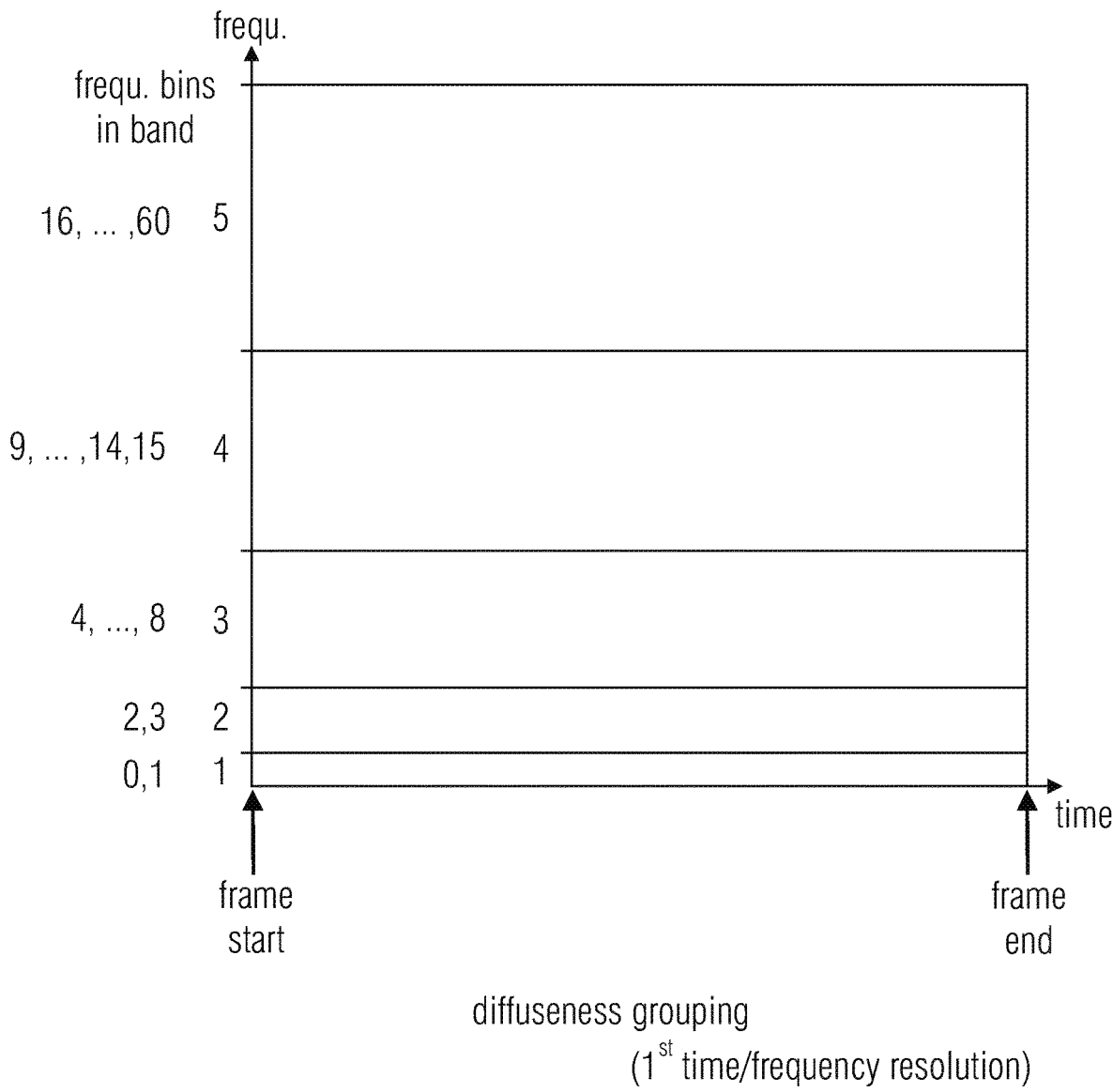
FIG. 3b illustrates an implementation of a diffuseness grouping with a low time or frequency resolution and, particularly, a specific low time resolution of a single diffuseness parameter per frame.

FIG. 3b illustrates the resolution reduction performed by the parameter calculator and, particularly, by block 141 of FIG. 2b in order to obtain the first time or frequency resolution representation for the diffuseness values. In this embodiment, the whole frequency bandwidth is separated into five grouping bands and only a single time slot. Thus, for one frame, one obtains, in the end, only five diffuseness parameters per each frame which are then further quantized and encoded.

Figure 3C:
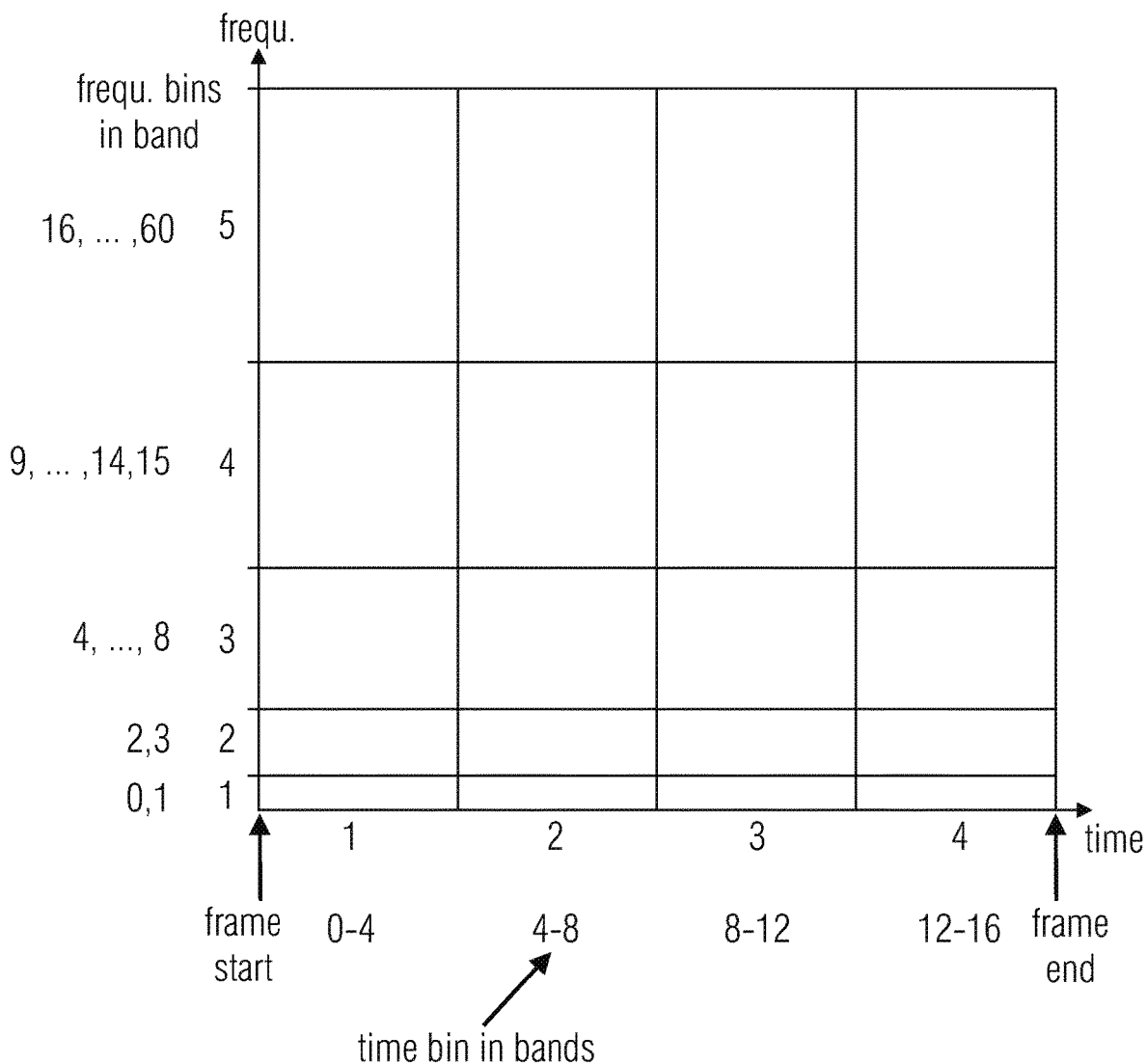
FIG. 3c illustrates an illustration of the medium resolution for the direction parameters having five bands on the one hand and four time regions on the other hand resulting in 20 time/frequency regions.

FIG. 3c illustrates the corresponding procedure performed by block 142 of FIG. 2b. The high resolution direction parameters from FIG. 3a where one direction parameter is calculated for each bin are grouped and averaged into the medium resolution representation in FIG. 3c where one has, for each frame, five frequency bands but, in contrast to FIG. 3a, now four time slots. Thus, in the end, one frame receives 20 direction parameters, i.e., 20 grouped bins per frame for the direction parameters and only five grouped bins per frame for the diffuseness parameters of FIG. 3b. In an embodiment, the frequency band edges are exclusive in their upper edges, so that When comparing FIG. 3b and FIG. 3c, it is to be noted that the diffuseness parameter for the first band, i.e., diffuseness parameter 1 corresponds to four direction parameters for the first band or is associated with them. As will be outlined later on, the quantization precision for all the direction parameters in the first band are determined by the diffuseness parameter for the first band or, exemplarily, the quantization precision for the direction parameters for the fifth band, i.e., for the corresponding four direction parameters covering the fifth band and the four time slots in the fifth band are determined by the single diffuseness parameter for the fifth band.

Thus, in this embodiment, where only a single diffuseness parameter consists per band, all direction parameters in one band have the same quantization/dequantization precision. As will be outlined later on, the alphabet for quantizing and encoding an azimuth parameter depends on the value of the original/quantized/dequantized elevation parameter. Thus, although each direction parameter for each band has the same quantization/dequantization parameter, each azimuth parameter for each grouped bin or time/frequency region of FIG. 3c can have a different alphabet for quantization and encoding.

Figure 3D:
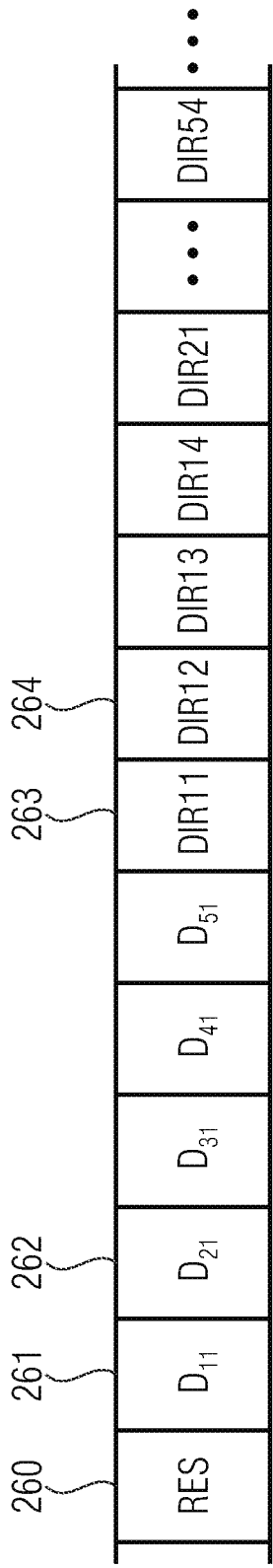
FIG. 3d illustrates an output bitstream with encoded diffuseness parameters and encoded direction parameters.

The resulting bitstream generated by the quantizer and encoder processor 200 illustrated at 250 in FIG. 2a is illustrated in more detail in FIG. 3d. The bitstream may comprise a resolution indication 260 indicating the first resolution and the second resolution. However, when the first resolution and the second resolution are fixedly set by the encoder and the decoder, then this resolution indication is not needed. Items 261, 262 illustrate the encoded diffuseness parameters for the corresponding bands. Since FIG. 3d illustrates only five bands, only five diffuseness parameters are included in the encoded data stream. Items 363, 364 illustrate the encoded direction parameters. For the first band, there are four encoded direction parameters, where the first index of the direction parameter indicates the band and the second parameter indicates the time slot. The direction parameter for the fifth band and the fourth time slot, i.e., for the upper right frequency bin in FIG. 3c is indicated as DIR54.

Subsequently, the further implementation is discussed in detail.

Time-Frequency Decomposition

In DirAC both analysis and synthesis are performed in frequency domain. The time-frequency analysis and synthesis can be performed using various block transforms, like short-term Fourier Transform (STFT), or filterbanks, like complex-modulated Quadrature Mirror Filterbank (QMF). In our embodiment, we aim to share the framing between the DirAC processing and the core encoder. Since the core encoder is based on the 3GPP EVS codec, a framing of 20 ms is desired. Moreover, important criteria such as time and frequency resolutions and robustness for aliasing are relevant for very active time-frequency processing in DirAC. Since the system is designed for communications, the algorithmic delay is another import aspect.

For all these reasons, the Complex modulated low-delay filterbank (CLDFB) is the choice. The CLDFB has a time resolution of 1.25 ms and divides the 20 ms frame into 16 timeslots. The frequency resolution is 400 Hz, which means that the input signal is decomposed into (fs/2)/400 frequency bands. The filter bank operation is described in a general form by the following formula:

$$X_{CR}(t, k) = \sqrt{\frac{80}{L_c}} \cdot \sum_{n=0}^{n=10L_C-1} -w_C(10Lc - n) \cdot s_{HP}(10Lc - n + t \cdot L_C)$$
$$\cos\left[\frac{\pi}{L_C}\left(n + \frac{1}{2} + \frac{L_C}{2}\right)\left(k + \frac{1}{2}\right)\right]$$

$$X_{CI}(t, k) = \sqrt{\frac{80}{L_c}} \cdot \sum_{n=0}^{n=10L_C-1} -w_C(10Lc - n) \cdot s_{HP}(10Lc - n + t \cdot L_C)$$
$$\sin\left[\frac{\pi}{L_C}\left(n + \frac{1}{2} + \frac{L_C}{2}\right)\left(k + \frac{1}{2}\right)\right]$$

where $x_{CR}$ and $X_{CI}$ are the real and the imaginary sub-band values, respectively, t is the sub-band time index with $0 \leq t \leq 15$ and k is the sub-band index with $0 \leq k \leq L_C - 1$. The analysis prototype $w_c$ is an asymmetric low-pass filter with an adaptive length depending on $s_{HP}$. The length of $w_c$ is given by $L_{w_c} = 10 \cdot L_c$ meaning that the filter spans over 10 consecutive blocks for the transformation.

For instance, CLDFB will decompose a signal sampled at 48 kHz into 60×16=960 time-frequency tiles per frame. The delay after analysis and synthesis can be adjusted by selecting different prototype filters. It was found that a delay of 5 ms (analysis and synthesis) was a good compromise between delivered quality and engendered delay. For each time-frequency tile, a diffuseness and direction is computed.

DirAC Parameter Estimation

In each frequency band, the direction of arrival of sound together with the diffuseness of the sound are estimated. From the time-frequency analysis of the input B-format components $w^i(n)$, $x^i(n)$, $y^i(n)$, $z^i(n)$, pressure and velocity vectors can be determined as:

$$P^i(n,k) = W^i(n,k)$$

$$U^i(n,k) = X^i(n,k)e_x + Y^i(n,k)e_y + Z^i(n,k)e_z$$

where i is the index of the input, n and k the time and frequency indices of the time-frequency tile, and $e_x$, $e_y$, $e_z$ represent the Cartesian unit vectors. P(n, k) and U(n, k) are needed to compute the DirAC parameters, namely DOA and diffuseness through the computation of the intensity vector:

$$I(n, k) = \frac{1}{2}\Re\{P(n, k) \cdot \overline{U(n, k)}\},$$

where $\overline{(.)}$ denotes complex conjugation. The diffuseness of the combined sound field is given by:

$$\psi(n, k) = 1 - \frac{\|E\{I(n, k)\}\|}{cE\{E(n, k)\}}$$

where E{.} denotes the temporal averaging operator, c the speed of sound and E(k, n) the sound field energy given by:

$$E(n, k) = \frac{\rho_0}{4}\|U(n, k)\|^2 + \frac{1}{\rho_0 c^2}|P(n, k)|^2$$

The diffuseness of the sound field is defined as the ratio between sound intensity and energy density, having values between 0 and 1.

The direction of arrival (DOA) is expressed by means of the unit vector direction(n,k), defined as $$\text{direction}(n, k) = -\frac{I(n, k)}{\|I(n, k)\|}$$

The direction of arrival is determined by an energetic analysis of the B-format input and can be defined as opposite direction of the intensity vector. The direction is defined in Cartesian coordinates but can be easily transformed in spherical coordinates defined by a unity radius, the azimuth angle and the elevation angle.

In total, if the parameter values are directly converted into bits, for each time-frequency tile, 3 values have to be coded: azimuth angle, elevation angle, and diffuseness. The metadata consists then in the example of CLDFB of 2880 values per frame, i.e. 144000 values per second. This huge amount of data needs to be drastically reduced for achieving low bit-rate coding.

Grouping and Averaging of DirAC Metadata

For reducing the number of parameters, the parameters computed in each time-frequency tile are first grouped and averaged along frequency parameter bands and over several time slots. The grouping is decoupled between the diffuseness and direction, which is an important aspect of the invention. Indeed, the decoupling exploits the fact that diffuseness retains a longer term characteristic of the sound field than direction, which is a more reactive spatial cue.

The parameter bands constitute a non-uniform and non-overlapping decomposition of the frequency bands following roughly an integer number of times the Equivalent Rectangular Bandwidth (ERB) scale. By default, a 9 times ERB scale is adopted for a total of 5 parameter bands for an audio bandwidth of 16 kHz.

The diffuseness is computed as:

$$diff[g, b] = \frac{\sum_{n=slot_{diff}[g]}^{slot_{diff}[g+1]-1} \sum_{k=band_{diff}[b]}^{band_{diff}[b+1]-1} \text{diffuseness}(n, k) \cdot \text{power}(n, k)^\alpha}{\sum_{n=slot_{diff}[g]}^{slot_{diff}[g+1]-1} \sum_{k=band_{diff}[b]}^{band_{diff}[b+1]-1} \text{power}(n, k)^\alpha},$$

where power(n, k)$^\alpha$ is the energy of the input signal measured in the time-frequency tile of indices (t,k) and raised to the power of $\alpha$, and diffusess(n, k) is the diffuseness of the input signal measured in the time-frequency tile of indices (n,k), and where band$_{diff}$[ ] defines the limit of the parameter bands in terms of frequency band indices, and slot$_{diff}$[ ] defines the limit of grouping over time in time slots indices. For example, tables can be defined for 5 parameters bands and 1 time group as:

Slot$_{diff}$=[0,16]

band$_{diff}$=[0,1,3,7,15,60]

The direction vector in Cartesian coordinates is computed as:

$$dv[g, b] =$$

$$\frac{\sum_{n=slot_{dv}[g]}^{slot_{dv}[g+1]-1} \sum_{k=band_{dv}[b]}^{band_{dv}[b+1]-1} \text{direction}(n, k) \cdot (1 - \text{diffuseness}(n, k)) \cdot \text{power}(n, k)^\alpha}{\sum_{n=slot_{dv}[g]}^{slot_{dv}[g+1]-1} \sum_{k=band_{dv}[b]}^{band_{dv}[b+1]-1} (1 - \text{diffuseness}(n, k)) \cdot \text{power}(n, k)^\alpha},$$

where power(n, k)$^\alpha$ is the energy of the input signal measured in the time-frequency tile of indices (t,k) and raised to the power of $\alpha$, diffuseness(n, k) is the diffuseness of the input signal measured in the time-frequency tile of indices (n,k), and direction(n,k) is the direction measured in the time-frequency tile of indices (n,k) in three-dimensional Cartesian coordinates, and where band$_{dv}$[ ] defines the limit of the parameter bands in terms of frequency band indices, and slot$_{dv}$[ ] defines the limit of grouping over time in time slots indices. For example, tables can be defined for 5 parameters bands and 4 time groups as:

slot$_{dv}$=[0,4,8,12,16]

band$_{dv}$=[0,1,3,7,15,60]

The parameter $\alpha$ allows for compressing or expanding the power-based weights in the weighting sum performed for averaging the parameters. In the mode, $\alpha=1$.

Generally this value can be a real non-negative number, since an exponent smaller than 1 could be also useful. For example 0.5 (square root) will still give more weight to higher amplitude-related signals, but more moderately when compared to an exponent of 1 or greater than 1.

After grouping and averaging, the resulting directional vector dv[g,b] is no longer a unit vector in general. Normalization is therefore needed:

$$dv[g, b] = \frac{dv[g, b]}{\|dv[g, b]\|}$$

Figure 4A:
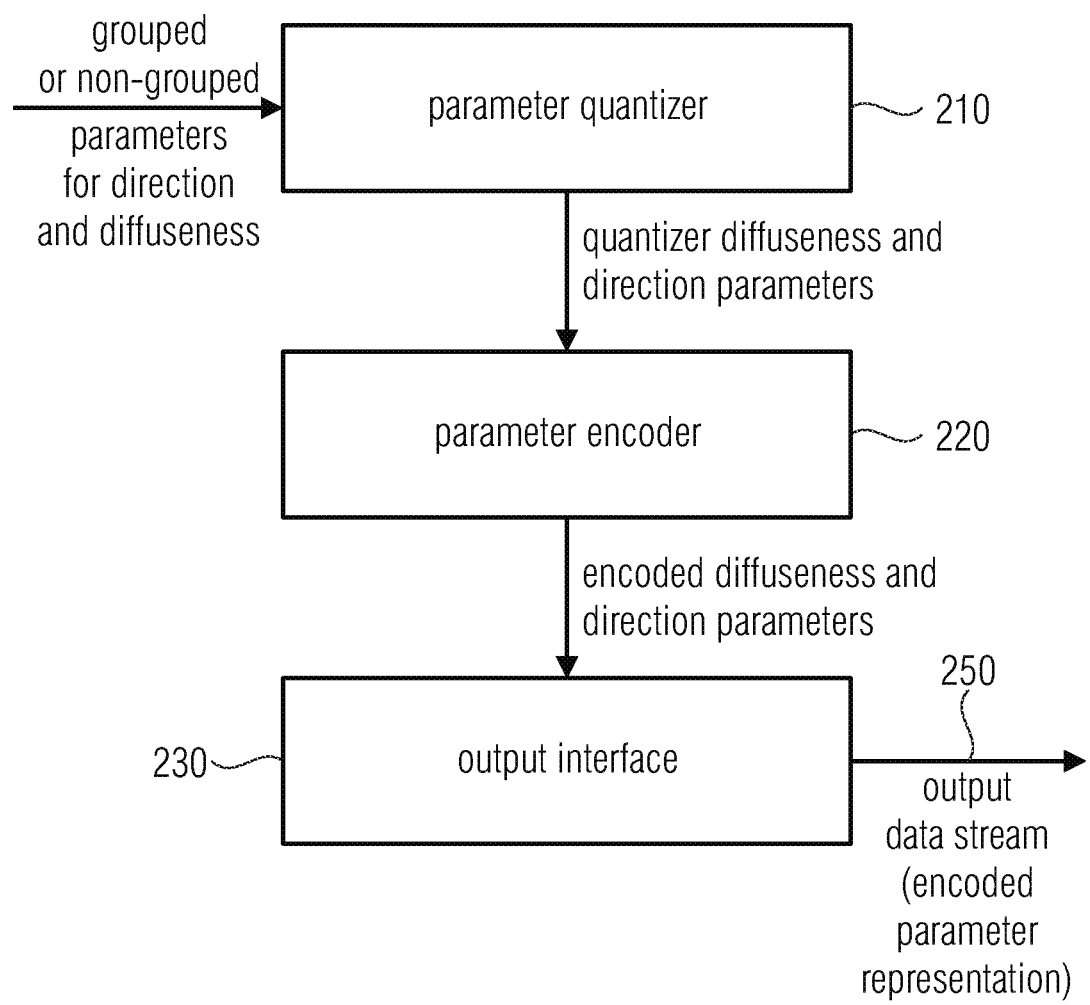
FIG. 4a illustrates an apparatus for encoding directional audio coding parameters in accordance with the second aspect.

Subsequently, an embodiment of the second aspect of the present invention is discussed. FIG. 4a illustrates an apparatus for encoding directional audio coding parameters comprising diffuseness parameters and direction parameters in accordance with the further second aspect. The apparatus comprises a parameter quantizer 210 receiving, at its input, the grouped parameters as discussed with respect to the first aspect or parameters that have not been grouped or that have been grouped differently.

Hence, the parameter quantizer 210 and the subsequently connected parameter encoder 220 for encoding quantized diffuseness parameters and quantized direction parameters are included together with the output interface for generating an encoded parameter representation comprising information on encoded diffuseness parameters and encoded direction parameters within the block 200 of FIG. 1a for example. The quantizer and encoder processor 200 of FIG. 2a may be implemented as, for example, discussed subsequently with respect to the parameter quantizer 210 and the parameter encoder 220, but the quantizer and encoder processor 200 can also be implemented in any different way for the first aspect.

Figure 4B:
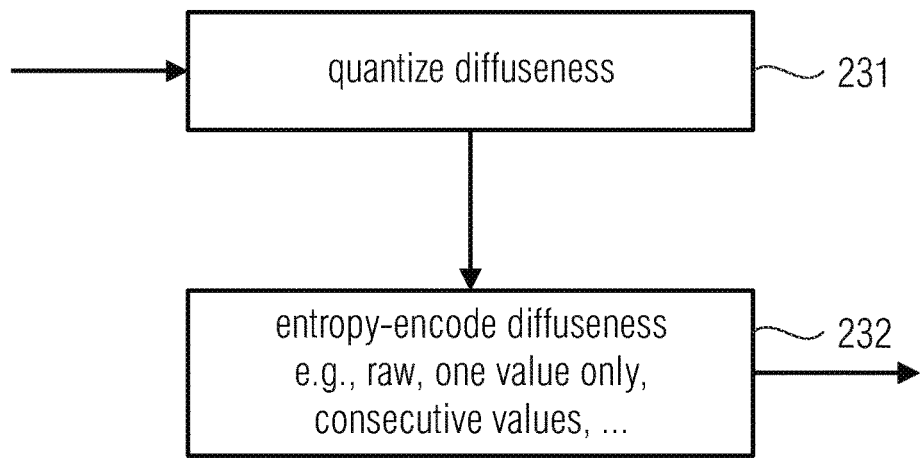
FIG. 4b illustrates an implementation of the parameter quantizer and the parameter encoder for the calculation of the encoded diffuseness parameters.

The parameter quantizer 210 of FIG. 4a is configured to quantize the diffuseness parameter as illustrated at 231 in FIG. 4b using a non-uniform quantizer to produce diffuseness indices. The parameter encoder 220 of FIG. 4a is configured as illustrated in item 232, i.e., to entropy-encode the diffuseness values obtained for a frame using three different modes, although a single mode can be used as well or only two different modes. One mode is the raw mode that is done in such a way that each individual diffuseness value is encoded using, for example, a binary code or a punctured binary code. Alternatively, a differential encoding can be performed so that each difference and the original absolute value are encoded using the raw mode. However, the situation can be that the same frame has the same diffuseness over all frequency bands and a one value only code can be used. Again, alternatively, the situation can be that there are only consecutive values for diffusenesses, i.e., consecutive diffuseness indexes in one frame, and then the third encoding mode can be applied as illustrated in block 232.

Figure 4C:
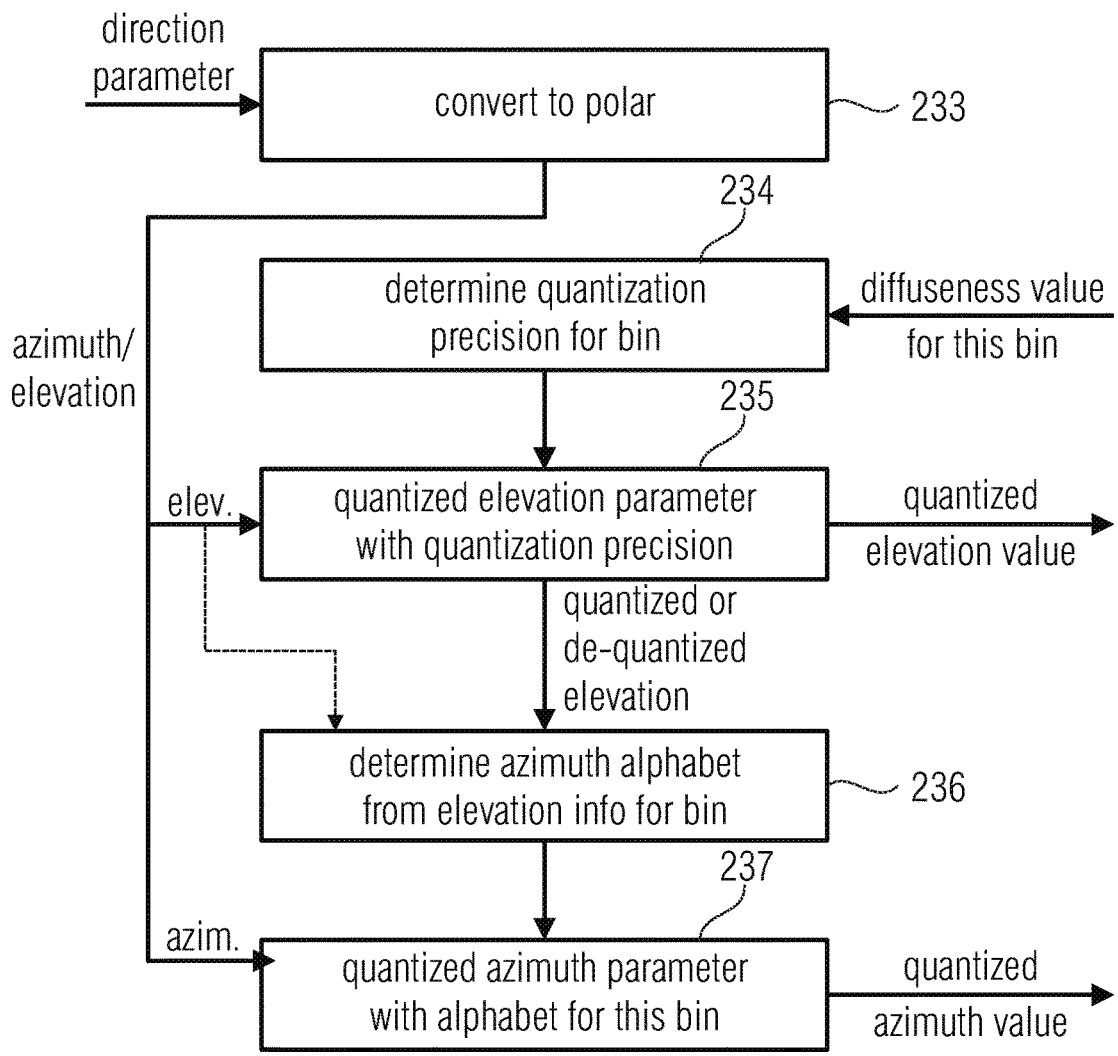
FIG. 4c illustrates an implementation of the FIG. 4a encoder with respect to the cooperation of different elements.

FIG. 4c illustrates an implementation of the parameter quantizer 210 of FIG. 4a. The parameter quantizer 210 of FIG. 4a is configured to convert the direction parameter into a polar form as illustrated at 233. In block 234, a quantization precision for a bin is determined. This bin can be an original high resolution bin or, alternatively, a low resolution grouped bin.

As discussed before with respect to FIG. 3b and FIG. 3c, each band has the same diffuseness value but has four different direction values. The same quantization precision is determined for the whole band, i.e., for all direction parameters within a band. In block 235, the elevation parameter as output by block 233 is quantized using the quantization precision. The quantization alphabet for quantizing the elevation parameter is also obtained from the quantization precision for the bin as determined in block 234.

For the purpose of processing the azimuth value, the azimuth alphabet is determined 236 from the elevation information for the corresponding (grouped) time/frequency bin. Elevation information may be the quantized elevation value, the original elevation value or the quantized and again dequantized elevation value where the latter value, i.e., the quantized and again dequantized elevation value is advantageous in order to have the same situation on the encoder side and at the decoder side. In block 237, the azimuth parameter is quantized with the alphabet for this time/frequency bin. While one can have the same quantization precision of a band as discussed before with respect to FIG. 3b, one can nevertheless have different azimuth alphabets for each individual grouped time/frequency bin associated with a direction parameter.

DirAC Metadata Coding

For each frame, the DirAC spatial parameters are computed on a grid consisting of nbands bands across frequency and, for each frequency band b, the num_slots time slots are grouped into a number of equally sized nblocks(b) time groups. A diffuseness parameter is sent for each frequency band, and a direction parameter for each time group of each frequency band.

For example, if nbands=5 and nblocks(b)=4, with num_slots=16, this will result in 5 diffuseness parameters and 20 direction parameters per frame, which will be further quantized and entropy coded.

Quantization of Diffuseness Parameters

Each diffuseness parameter diff(b) is quantized to one of the diff_alph discrete levels, using a non-uniform quantizer producing the diffuseness index diff_idx(b). For example, the quantizer may be derived from the ICC quantization table used in the MPS standard, for which the thresholds and reconstruction levels are computed by the generate_diffuseness_quantizer function.

Only the non-negative values from the ICC quantization table are used, as icc=[1.0, 0.937, 0.84118, 0.60092, 0.36764, 0.0], containing only 6 levels of the original 8. Because an ICC of 0.0 corresponds to a diffuseness of 1.0, and an ICC of 1.0 corresponds to a diffuseness of 0.0, a set of y coordinates are created as y=1.0−icc, with a corresponding set of x coordinates as x=[0.0, 0.2, 0.4, 0.6, 0.8, 1.0]. A shape-preserving piecewise cubic interpolation method, known as Piecewise Cubic Hermite Interpolating Polynomial (PCHIP), is used to derive a curve passing through the set of points defined by x and y. The number of steps of the diffuseness quantizer is diff_alph, which in the proposed implementation is 8, but it has no relation to the total number of levels of the ICC quantization table, which is also 8.

A new set of diff_alph equally spaced coordinates x_interpolated from 0.0 to 1.0 (or close to, but smaller than 1.0, when the case of pure diffuseness of 1.0 is avoided because of sound rendering considerations) are generated, and the corresponding y values on the curve are used as the reconstruction values, those reconstruction values being non-linearly spaced. Points half-way between consecutive x_interpolated values are also generated, and the corresponding y values of the curve are used as threshold values to decide which values map to a particular diffuseness index and therefore reconstruction value. For the proposed implementation, the generated reconstruction and threshold values (rounded to 5 digits), computed by the generate_diffuseness_quantizer function are:

reconstructions=[0.0,0.03955,0.08960,0.15894, 0.30835,0.47388,0.63232,0.85010]

thresholds=[0.0,0.01904,0.06299,0.11938,0.22119, 0.39917,0.54761,0.73461,2.0]

A placeholder out-of-range large threshold value (2.0) is added at the end of thresholds to make searching it simpler. For exemplification, if diff(b)=0.33, for a particular band b, then thresholds[4]<=diff(b)<thresholds[5], therefore diff_idx(b)=4, and the corresponding reconstruction value is reconstructions[4]=0.30835.

The above procedure is just one possible choice of a non-linear quantizer for the diffuseness values.

Entropy Coding of Diffuseness Parameters

The EncodeQuasiUniform(value, alphabet_sz) function is used to encode value with quasi-uniform probability using a punctured code. For value∈{0, . . . , alphabet_sz−1}, a number of the smallest ones are encoded using [log₂alpbabet_sz] bits, and the rest using [log₂alphabet_sz]+1 bits. If alphabet_sz is a power of two, binary coding results.

Depending on their values, the quantized diffuseness indexes can be entropy coded using one of the three available methods: raw coding, one value only, and two consecutive values only. The first bit (diff_use_raw_coding) indicates whether the raw coding method is used. For raw coding, each diffuseness index value is encoded using the EncodeQuasiUniform function.

If all index values are equal, the one value only method is used. A second bit (diff_have_unique_value) is used to indicate this method, then the unique value is encoded using the EncodeQuasiUniform function. If all index values consist only of two consecutive values, the two consecutive values only method is used, indicated by the above second bit. The smaller of the two consecutive values is encoded using the EncodeQuasiUniform function, taking into account that its alphabet size is reduced to diff_alph−1. Then, for each value, the difference between it and the minimum value is encoded using one bit.

An EncodeQuasiUniform(value, alphabet_sz) function implements what is called a punctured code. It can be defined in pseudo-code as:

```
bits = floor(log2(alphabet_sz))
thresh = 2 ^ (bits + 1) − alphabet_sz
if (value < thresh)
    write_bits(value, bits)
else
    write_bits(value + thresh, bits + 1)
```

If alphabet_sz is a power of 2, then alphabet_sz=2^ bits, and thresh=2^ bits, therefore the else branch is never used, and binary coding results. Otherwise, the first thresh smallest values are encoded using a binary code having bits bits, and the rest, starting with value=thresh, are encoded using a binary code having bits+1 bits. The first binary code encoded using bits+1 bits has the value value+thresh=thresh+thresh=thresh*2, therefore the decoder can figure out, by reading only the first bits bits and comparing its value with thresh, if it needs to read one more additional bit. The decoding function, DecodeQuasiUniform(alphabet_sz) can be defined in pseudo-code as:

```
bits = floor(log2(alphabet_sz))
thresh = 2 ^ (bits + 1) − alphabet_sz
value = read_bits(bits)
if (value >= thresh)
    value = (value * 2 + read_bits(1)) − thresh
return value
```

Conversion of Direction Parameters to Polar Coordinates

Each 3-dimensional direction vector dv, which is normalized, such that $dv[0]^2+dv[1]^2+dv[2]^2=1$, is converted to a polar representation consisting of an elevation angle el∈[−

90,90] and an azimuth angle az∈[0,360], using the function DirectionVector2AzimuthElevation. The reverse direction conversion, from polar coordinates to a normalized direction vector, is achieved using the function AzimuthElevation2DirectionVector.

Quantization of Direction Parameters

A direction, represented as an elevation and azimuth pair, is further quantized. For each quantized diffuseness index level, a needed angular precision is selected from the angle_spacing configuration vector as deg_req=angle_spacing(diff_idx(b)) and used to generate a set of quasi-uniformly distributed quantization points on the unit sphere.

The angle spacing value deg_req is not computed from the diffuseness diff(b), but from the diffuseness index diff_idx(b). Therefore, there are diff_alph possible deg_req values, one for each possible diffuseness index. At the decoder side, the original diffuseness diff(b) is not available, only the diffuseness index diff_idx(b), which can be used for selecting the same angle spacing value like in the encoder. In the proposed implementation, the angle spacing table is:

angle_spacing_table=[5.0,5.0,7.5,10.0,18.0,30.0,45.0, 90.0]

The quasi-uniformly distributed points on the unit sphere are generated in such a way to satisfy several important desirable properties. The points should be distributed symmetrically with respect to the X, Y, and Z axes. The quantization of a given direction to the closest point and mapping to an integer index should be a constant time operation. Finally, computing the corresponding point on the sphere from the integer index and dequantization to a direction should be a constant or logarithmic time operation with respect to the total number of points on the sphere.

There are two types of symmetry with respect to an axis for points on a horizontal plane: with two points present where the orthogonal axis intersects the unit sphere on the current plane, and without any points present. As an example for an arbitrary horizontal plane, there are three possible cases. If the number of points is a multiple of 4, like 8, there is symmetry with respect to the X (left-right) axis and two points present at 90 and 270 degrees on the Y axis, and symmetry with respect to the Y (front-back) axis and two points present at 0 and 180 degrees on the X axis. If the number of points is only a multiple of 2, like 6, there is symmetry with respect to the X axis but no points at 90 and 270 degrees on the Y axis, and symmetry with respect to the Y axis and two points present at 0 and 180 degrees on the X axis. Finally, when the number of points is an arbitrary integer, like 5, there is symmetry with respect to the X axis but no points at 90 and 270 degrees on the Y axis, and no symmetry with respect to the Y axis.

In the embodiment, having points at 0, 90, 180, and 270 degrees on all horizontal planes (corresponding to all quantized elevations) was considered useful from a psychoacoustic perspective, implying that the number of points on each horizontal plane is a multiple of 4. However, depending on the particular application, the condition on the number of points on each horizontal plane can be relaxed to be only a multiple of 2, or an arbitrary integer.

Additionally, in the embodiment, for each elevation an "origin" azimuth point exists at the 0 degrees privileged direction (towards front). This property can be relaxed by selecting a precomputed quantization offset angle for each elevation separately, with the azimuth points distributed relative to it instead of the 0 degrees direction. It can be easily implemented by adding the offset before quantization, and subtracting it after dequantization.

The needed angular precision is deg_req and should be a divisor of 90 degrees. Otherwise, it is recomputed before actual usage as deg_req=90÷⌈90÷deg_req⌉. For example, the list of possible values is {90, 45, 30, 22.5, 18, 15, 12.86, 11.25, 10, . . . , 5, . . . }. The elevation angle el is uniformly quantized, with step size deg_req, producing el_idx=round(el÷deg_req)+n_points, one of the el_alph=2·n_points+1 quantization indexes, where n_points=⌈90÷deg_req⌉. This index corresponds to a dequantized elevation of q_el=(el_idx−n_points)·deg_req. Equivalently, based only on alphabet size, el_idx=round(((el+90)÷180)·(el_alph−1)) for quantization and q_el=(el_idx÷(el_alph−1))·180−90 for dequantization.

At equator, the azimuth angle az is uniformly quantized, with step size deg_req, producing az_idx, one of the 4·n_points quantization indexes. For other elevations, the horizontal angle spacing as seen from the center of the unit sphere, which corresponds to the chord length between two consecutive points, can be approximated by the arc length on the horizontal circle situated at the q_el elevation. Therefore, the number of points corresponding to 90 degrees on this horizontal circle is reduced, relative to the equator circle, proportionally with its radius, so that the arc length between two consecutive points remains approximately the same everywhere. At the poles, the total number of points becomes one.

There are az_alph=max(4·round(radius_len·n_points), 1) quantization indexes, corresponding to the q_el elevation, where radius_len=cos(q_el). The corresponding quantization index is az_idx=round((az÷360)·az_alph), where a resulting value of az_alph is replaced with 0. This index corresponds to a dequantized azimuth of q_az=az_idx·(360÷az_alph). As a note, excluding the poles where az_alph=1, the smallest values near the poles are az_alph=4 for deg_req=90 and deg_req=45, and az_alph=8 for all the rest.

If the condition on the number of points on each horizontal plane is relaxed to be only a multiple of 2, the azimuth alphabet becomes az_alph=max(2·round(radius_len·(2·n_points)), 1), because there are 2·n_points corresponding to 180 degrees on the equatorial plane. If the condition on the number of points is relaxed to be an arbitrary integer, the azimuth alphabet becomes az_alph=max(round(radius_len·(4·n_points)), 1), because there are 4·n_points corresponding to 360 degrees on the equatorial plane. In both cases, on the equatorial plane the number of points is a multiple of 4, because radius_len=1 and n_points is an integer.

The quantization and dequantization process described above is achieved using the QuantizeAzimuthElevation and DequantizeAzimuthElevation functions, respectively.

The round(x) function rounds x to the closest integer, usually implemented in fixed-point as round(x)=floor(x+0.5). The rounding for ties, which are values exactly halfway between integers, like 1.5, can be done in several ways. The above definition rounds ties towards+infinity (1.5 gets rounded to 2, 2.5 gets rounded to 3). Floating-point implementations usually have a native rounding to integer function, rounding ties to even integers (1.5 gets rounded to 2, 2.5 gets rounded to 2).

FIG. 4d indicated as "Quasi Uniform Coverage of the Unit Sphere" illustrates an example of a quasi-uniform coverage of the unit sphere using 15 degrees angular precision, showing the quantized directions. The 3D view is from above, only the upper hemisphere is drawn for better visualization, and the connecting dotted spiral line is just for easier visual identification of the points from the same horizontal circle or plane.

Figure 5A:
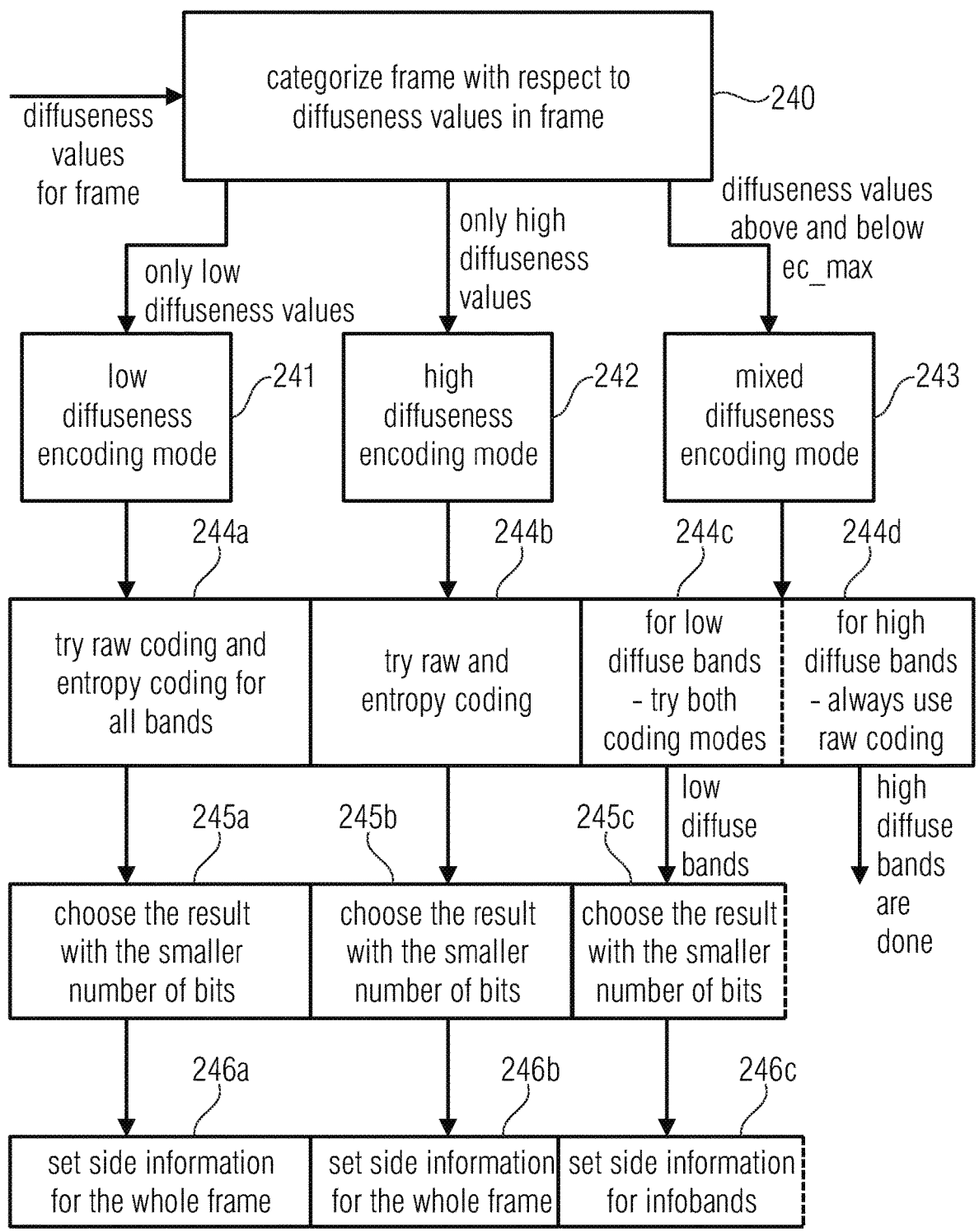
FIG. 5a illustrates an overview over the operation of the parameter encoder of FIG. 4a operating in different encoding modes.

Subsequently, an implementation of the parameter encoder 220 of FIG. 4a for the purpose of encoding the quantized direction parameters, i.e., the quantized elevation indexes and the quantized azimuth indexes is illustrated. As illustrated in FIG. 5a, the encoder is configured to categorize 240 each frame with respect to the diffuseness values in the frame. Block 240 receives the diffuseness values which are, in the FIG. 3b embodiment, only five diffuseness values for the frame. If the frame is only comprised of low diffuseness values, the low diffuseness encoding mode 241 is applied. When the five diffuseness values in the frame are only high diffuseness values, then the high diffuseness encoding mode 242 is applied. When it is determined that the diffuseness values in the frame are both below and above the diffuseness threshold ec_max, then the mixed diffuseness encoding mode 243 is applied. In both the low diffuseness encoding mode 241 and the high diffuseness encoding mode 242, and also for the low diffuseness bands, with respect to a mixed diffuseness frame, the raw coding on the one hand and the entropy encoding on the other hand are tried, i.e., performed as indicated at 244a, 244b and 244c. However, for the high diffuseness bands in a mixed diffuseness frame, raw coding mode is used as indicated at 244d.

In the case where the different encoding modes, i.e., the raw coding mode and the entropy coding mode (with modeling) are used, the result is chosen by an encoder controller that selects the mode that results in a smaller number of bits for encoding the quantized indexes. This is indicated at 245a, 245b and 245c.

On the other hand, one could only use the raw coding mode for all frames and bands or only the entropy coding mode with modeling for all bands or any other coding mode for coding the indexes such as a Huffman coding mode or an arithmetic coding mode with or without context adaption.

Depending on the result of the chosen procedure in blocks 245a, 245b and 245c, the side information is set for the whole frame as illustrated in blocks 246a, 246b or is set only for the corresponding bands, i.e., the low diffuseness bands in block 246c.

Alternatively the side information can also be set for the whole frame in the case of item 246c. In this case, the determination of the high diffuseness bands can be done in the decoder alone so that even though the side information is set for the whole frame, the decoder nevertheless determines that there is a mixed diffuseness frame and that the direction parameters for the bands having a high diffuseness value in this mixed diffuseness frame are encoded with the raw encoding mode although the side information for the frame indicates the entropy encoding mode with modeling.

In an embodiment, diff_alph=8. Then, the ec_max threshold value was chosen to be 5, by means of minimizing the average compressed size on a large test corpus. This threshold value ec_max is used in the following mode, depending on the range of values for the diffuseness indexes of the current frame:

for low to medium diffuseness frames, where diff_idx(b) <=ec_max, for all bands b, all directions are encoded using both raw and entropy coding and the best is chosen and is indicated by one bit as side information (identified above as dir_use_raw_coding);

for mixed diffuseness frames, where diff_idx(b)<=ec_max, for some bands b, the directions corresponding to those bands are encoded exactly as in the first case; however, for the other high diffuseness bands b, where diff_idx(b)>ec_max, the directions corresponding to these other bands are encoded as raw (to avoid mixing entropy coding statistics of directions having low to medium diffuseness with directions having high diffuseness, which are also very coarsely quantized);

for high diffuseness frames, where diff_idx(b)>ec_max, for all bands b, the ec_max threshold is set in advance to ec_max=diff_alph for the current frame (because the diffuseness indexes are coded before directions, this setting can be done in advance identically at the decoder side), therefore this case is reduced to the first case.

Figure 5B:
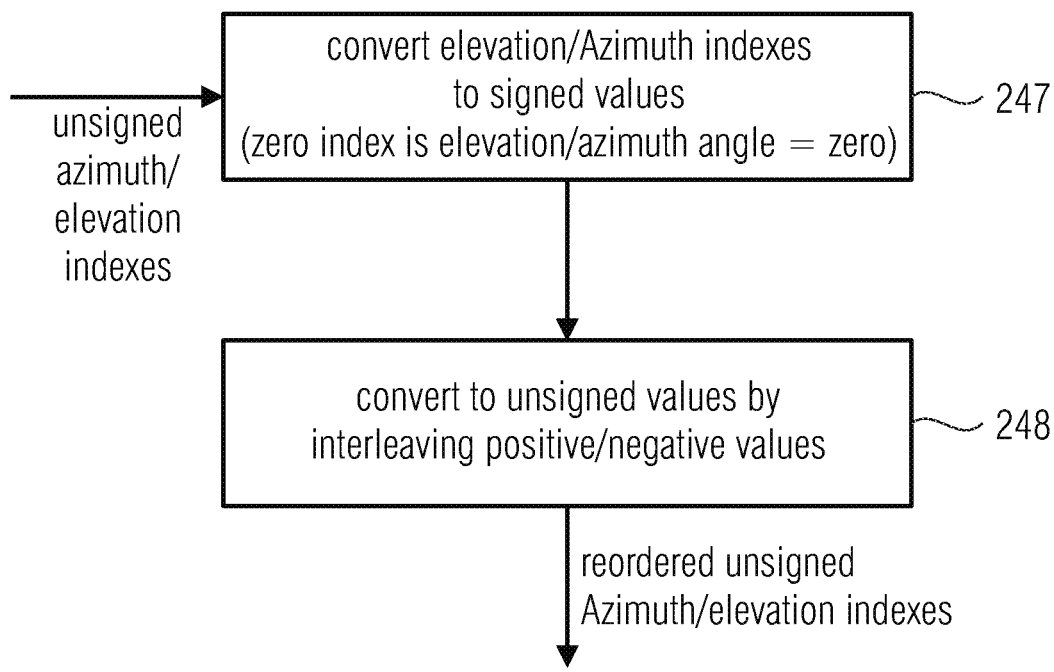

FIG. 5b illustrates optional preprocessing of direction indexes for both modes. For both modes, the quantized direction indexes, i.e., the quantized azimuth indexes and the quantized elevation indexes are processed in block 247 into a conversion of elevation/azimuth indexes resulting in signed values, where the zero index corresponds to an elevation or azimuth angle of zero. A subsequent conversion 248 to unsigned values comprising an interleaving of positive/negative values is performed in order to have a more compact representation of the reordered unsigned azimuth/elevation indexes.

Figure 5C:
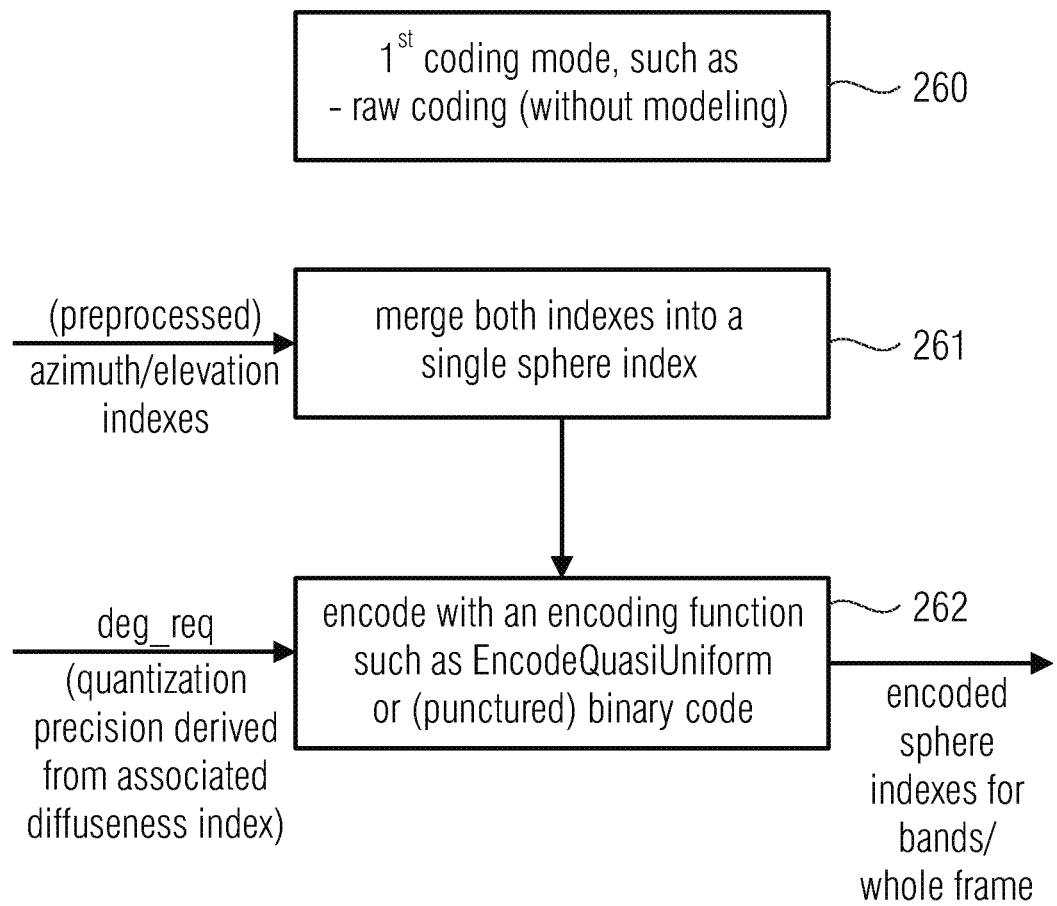
FIG. 5c illustrates the first coding mode in an embodiment.

FIG. 5c illustrates an implementation of the first coding mode 260, i.e., the raw coding mode without modeling. The preprocessed azimuth/elevation indexes are input into block 261 in order to merge both indexes into a single sphere index. Based on the quantization precision derived from the associated diffuseness index, i.e., deg_req, an encoding with an encoding function such as EncodeQuasiUniform or a (punctured) binary code is performed 262. Thus, encoded sphere indexes either for bands or for the whole frame are obtained. The encoded sphere indexes for the whole frame are obtained in the case of a low diffuseness only frame where the raw coding has been selected or in a high diffuseness only frame, where again the raw coding was selected or the encoded sphere indexes only for high diffuseness bands of a frame are obtained in the case of a mixed diffuseness frame indicated at 243 in FIG. 5a where, for the other bands, with low or medium diffuseness, a second encoding mode such as entropy coding with modeling has been selected.

Figure 5D:
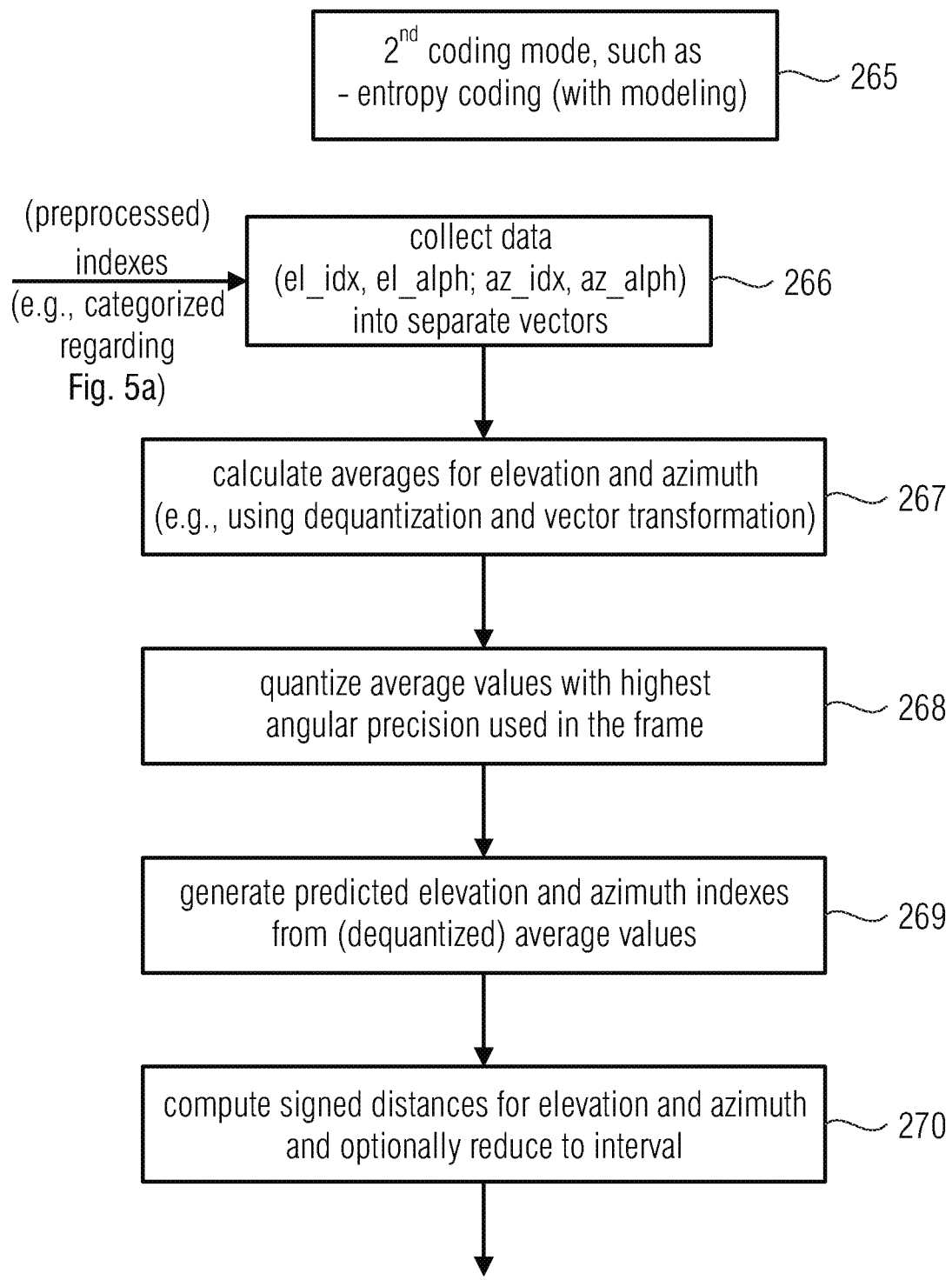
FIG. 5d illustrates an embodiment of the second coding mode.

FIG. 5d illustrates this second encoding mode which can, for example, be an entropy coding mode with modeling. The preprocessed indexes which are, for example, categorized for a mixed diffuseness frame as illustrated in FIG. 5a at 240 are input into a block 266 which collects corresponding quantization data such as elevation indexes, elevation alphabets, azimuth indexes, azimuth alphabets, and this data is collected into separate vectors for a frame. In block 267, averages are calculated for elevation and azimuth clearly based on information derived from dequantization and corresponding vector transformation as is discussed later on. These average values are quantized with the highest angular precision used in the frame indicated at block 268. Predicted elevation and azimuth indexes are generated from the average values as illustrated in block 269, and, signed distances for elevation and azimuth from the original indexes and related to the predicted elevation and azimuth indexes are computed and optionally reduced to another smaller interval of values.

Figure 5E:
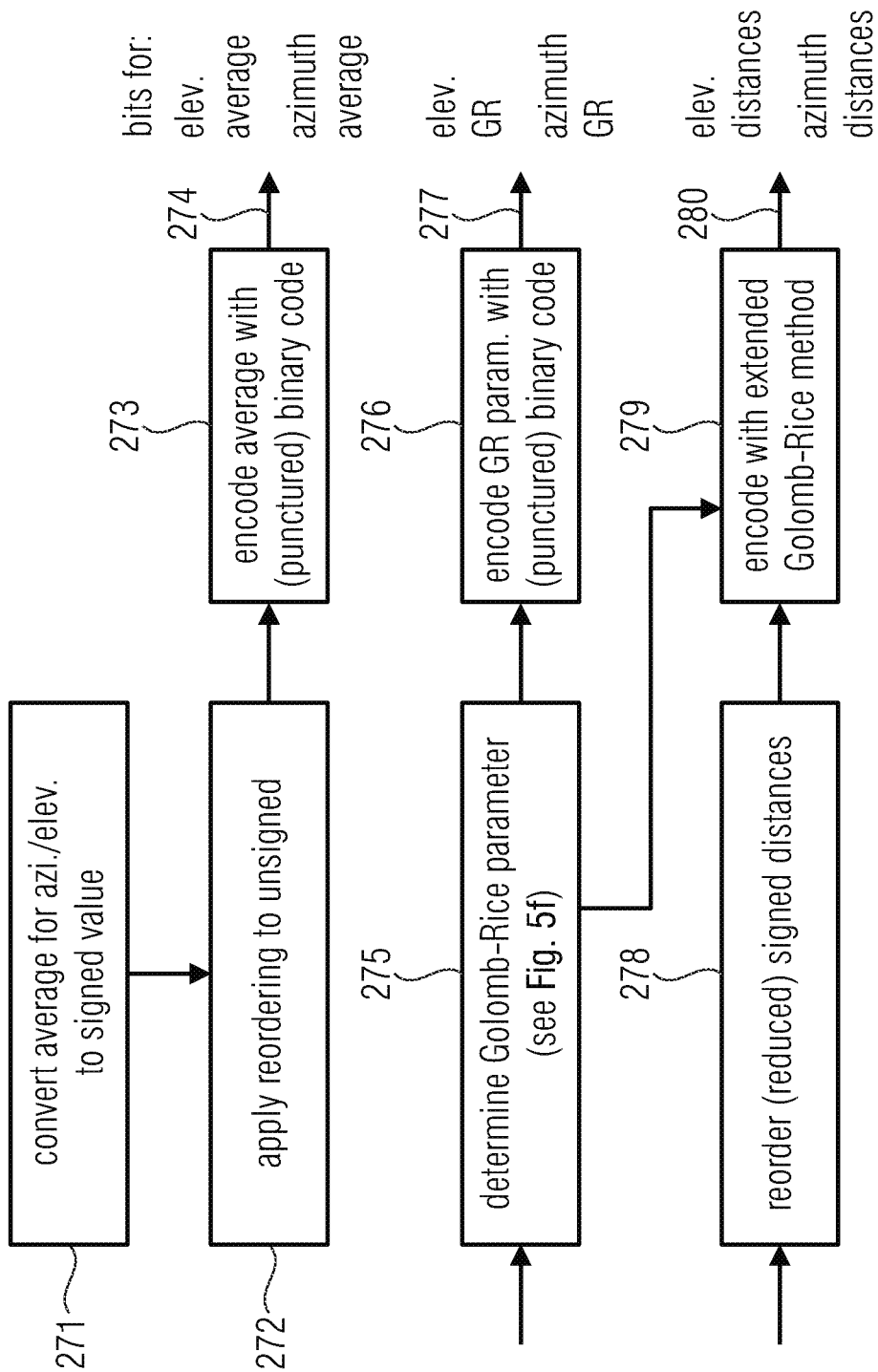
FIG. 5e illustrates an implementation of the entropy encoding of the signed distances and the corresponding averages using a GR encoding procedure.
Figure 5F:
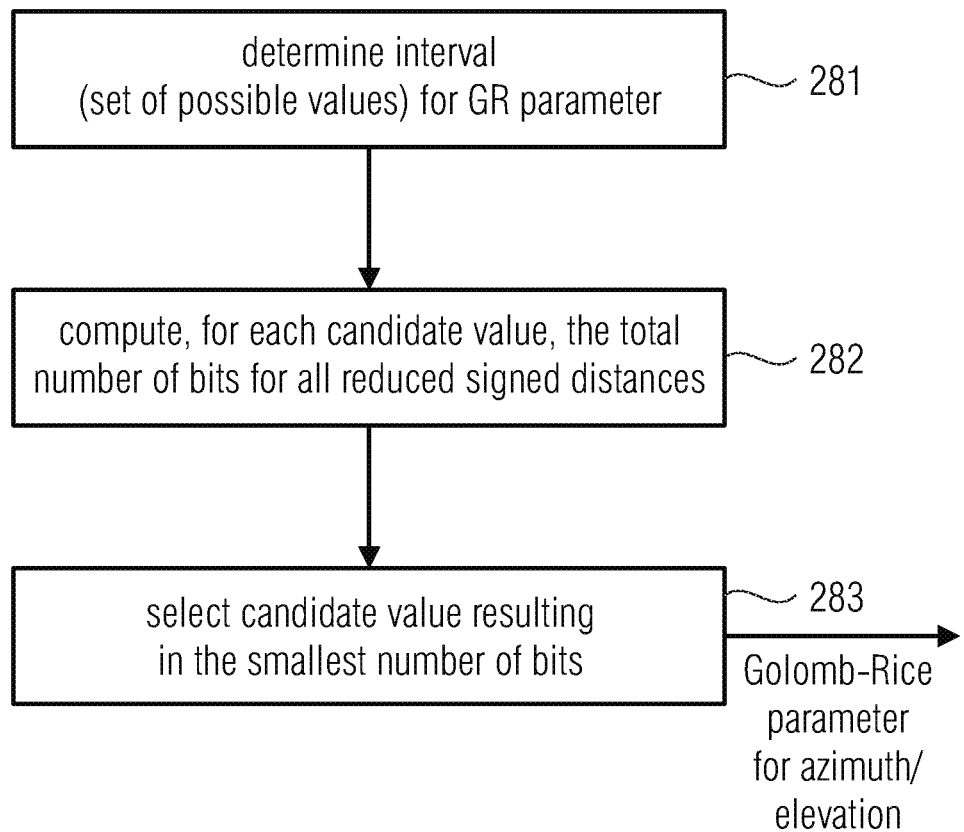
FIG. 5f illustrates an embodiment for the determination of the optimum Golomb-Rice parameter.

As illustrated in FIG. 5e, the data generated by the modeling operation using a projection operation for deriving prediction values illustrated in FIG. 5d is entropy encoded. This encoding operation illustrated in FIG. 5e finally generates encoding bits from the corresponding data. In block 271, the average values for azimuth and elevation are converted to signed values and, a certain reordering 272 is performed in order to have a more compact representation and, those average values are encoded 273 with a binary code or a punctured binary code in order to generate the elevation average bits 274 and the azimuth average bits. In block 275, a Golomb-Rice parameter is determined such as illustrated in FIG. 5f, and this parameter is then also encoded with a (punctured) binary code illustrated at block 276 in order to have the Golomb-Rice parameter for elevation and another Golomb-Rice parameter for azimuth illustrated at 277. In block 278, the (reduced) signed distances calculated by block 270 are reordered and then encoded with the extended Golomb-Rice method illustrated at 279 in order to have the encoded elevation distances and azimuth distances indicated at 280.

FIG. 5f illustrates an implementation for the determination of the Golomb-Rice parameter in block 275 which is performed both for the determination of the elevation Golomb-Rice parameter or the azimuth Golomb-Rice parameter. In block 281, an interval is determined for the corresponding Golomb-Rice parameter. In block 282, the total number of bits for all reduced signed distances are computed, for each candidate value and, in block 283, the candidate value resulting in the smallest number of bits is selected as the Golomb-Rice parameter for either azimuth or elevation processing.

Figure 5G:
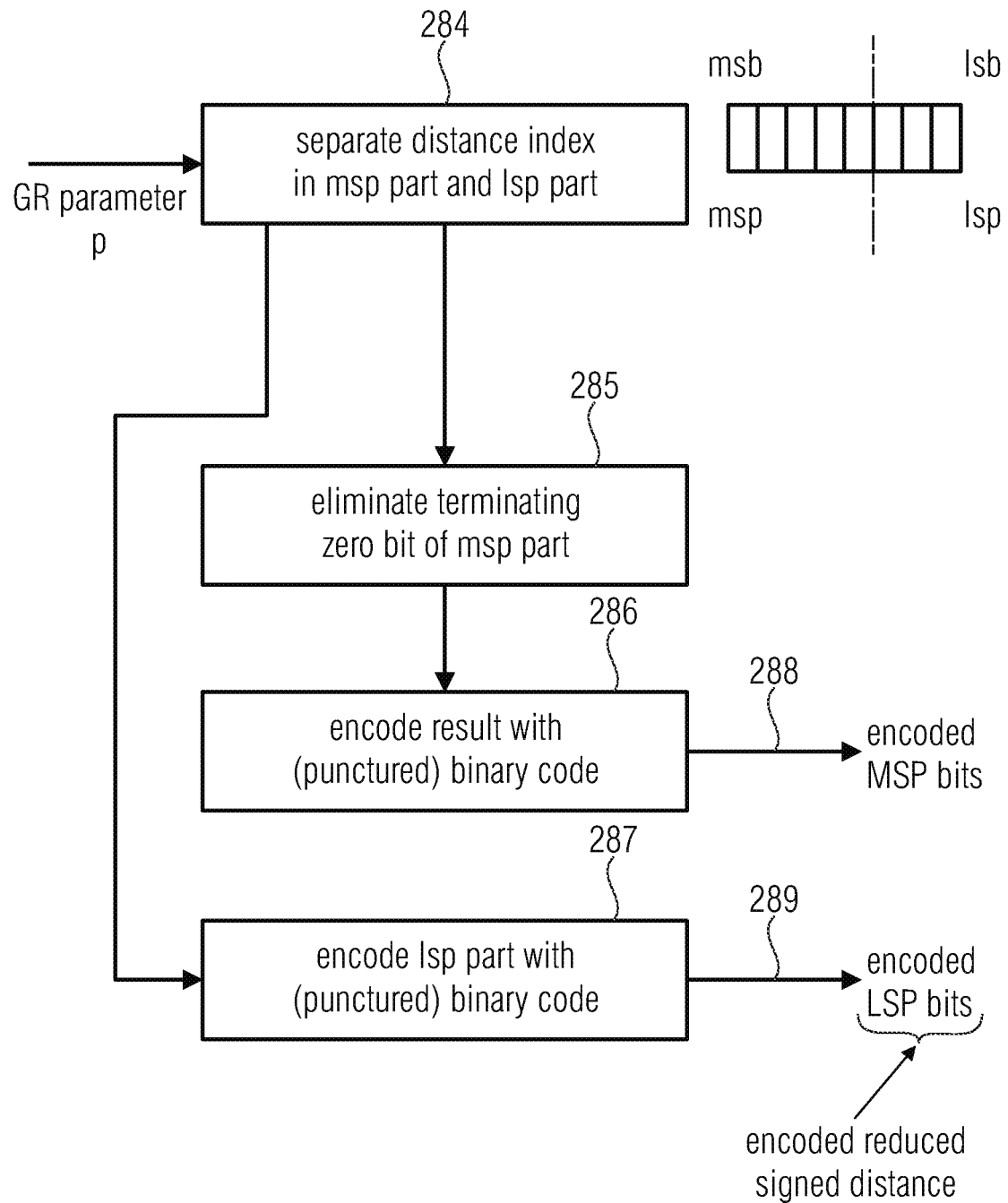
FIG. 5g illustrates an implementation of the extended Golomb-Rice procedure for the encoding of the reordered signed distances as indicated in block 279 of FIG. 5e.

Subsequently, FIG. 5g is discussed in order to further illustrate the procedure in block 279 of FIG. 5e, i.e., the extended Golomb-Rice method. Based on the selected Golomb-Rice parameter p, the distance index either for elevation or for azimuth is separated in a most significant part MSP and a least significant part LSP as illustrated to the right of block 284. In block 285, a terminating zero bit of the MSP part is eliminated, in the case when the MSP is the maximum possible value, and in block 286, the result is encoded with a (punctured) binary code.

The LSP part is also encoded with a (punctured) binary code illustrated at 287. Thus, on lines 288 and 289, the encoded bits for the most significant part MSP and the encoded bits for the least significant part LSP are obtained which together represent the corresponding encoded reduced signed distances either for elevation or for azimuth.

Figure 8A:
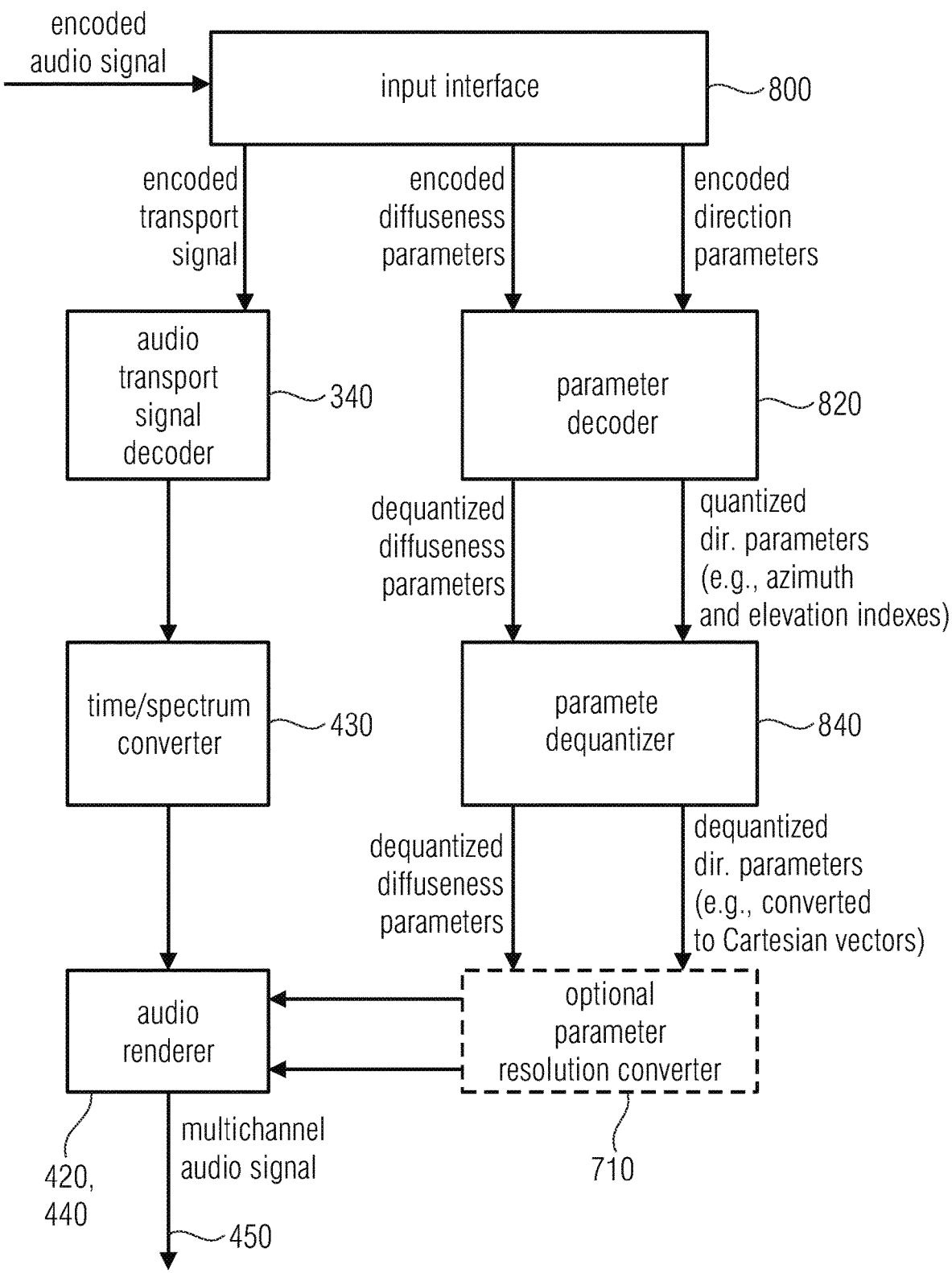
FIG. 8a illustrates a decoder for decoding an encoded audio signal in accordance with the second aspect.
Figure 8B:
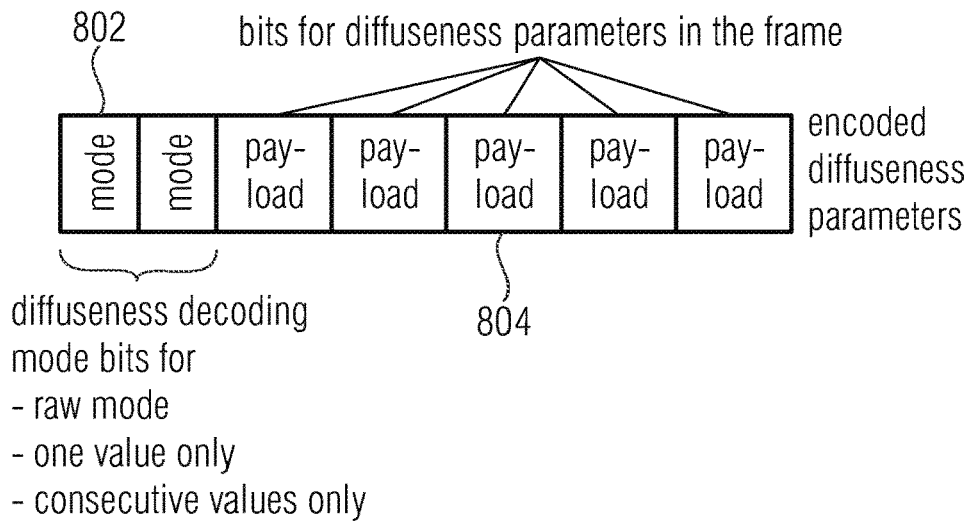
FIG. 8b illustrates a schematic bitstream representation for the encoded diffuseness parameters in an embodiment.
Figure 8C:
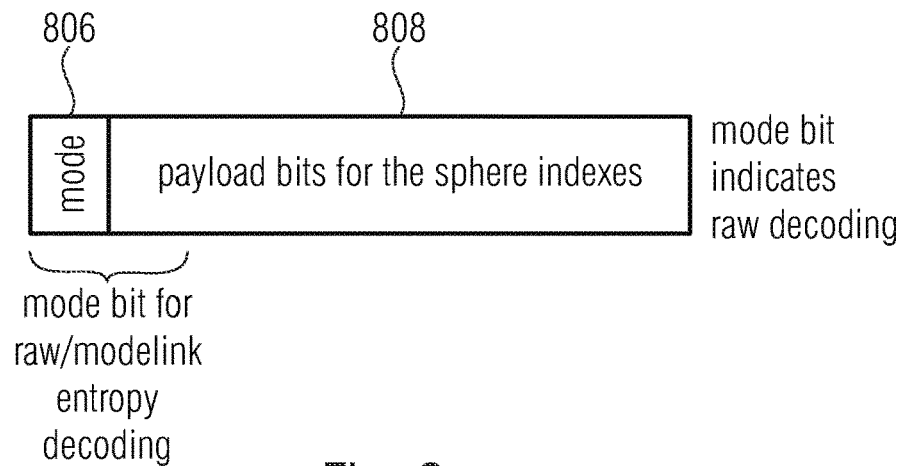
FIG. 8c illustrates an implementation of the bitstream when the raw encoding mode has been selected.
Figure 8D:
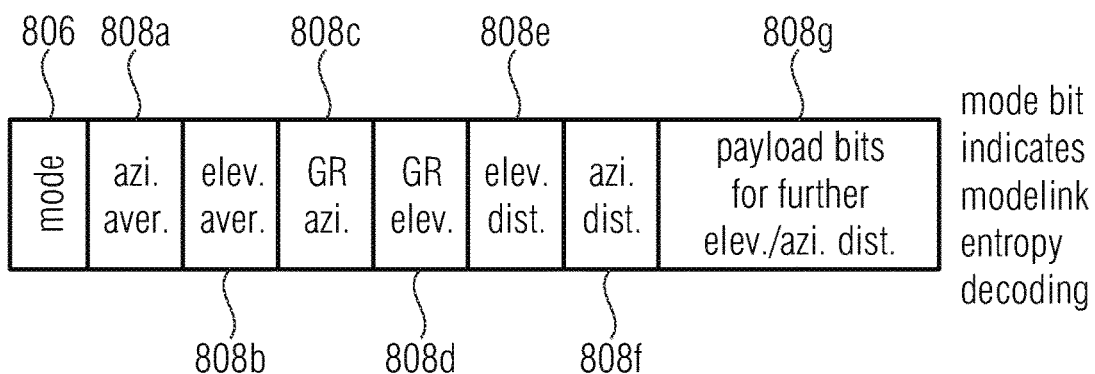
FIG. 8d illustrates a schematic bitstream when the other encoding mode, i.e., the entropy encoding mode with modeling has been selected.

FIG. 8d illustrates an example for an encoded direction. A mode bit 806 indicates the, for example, entropy encoding mode with modeling. Item 808a illustrates the azimuth average bits and item 808b illustrates the elevation average bits as discussed before with respect to item 274 of FIG. 5e. A Golomb-Rice azimuth parameter 808c and a Golomb-Rice elevation parameter 808d are also included in encoded form in the bitstream of FIG. 8d corresponding to what has been discussed before with respect to item 277. The encoded elevation distances and the encoded azimuth distances 808e and 808f are included in the bitstream as obtained at 288 and 289 or as discussed before with respect to item 280 in FIG. 5e and FIG. 5g. Item 808g illustrates further payload bits for a further elevation/azimuth distances. The averages for elevation and azimuth and the Golomb-Rice parameters for elevation and azimuth are only needed a single time for each frame, but could, if needed, also be calculated two times for a frame or so, if the frame is quite long or the signal statistics strongly change within a frame.

FIG. 8c illustrates the bitstream when the mode bit indicates raw coding as defined by FIG. 5c, block 260. The mode bit 806 indicates the raw coding mode and item 808 indicates the payload bits for the sphere indexes, i.e., the result of block 262 of FIG. 5c.

Entropy Coding of Direction Parameters

When coding a quantized direction, the elevation index el_idx is coded first, before the azimuth index az_idx. If the current configuration takes into account only the horizontal equatorial plane, then nothing is coded for the elevation and it is considered zero everywhere.

Before coding, signed values are mapped to unsigned values by using a generic reordering transformation, which interleaves the positive and negative numbers into unsigned numbers as u_val=2·|s_val|−(s_val<0), implemented by the ReorderGeneric function. The expression (condition) evaluates to 1 if condition is true, and evaluates to 0 if condition is false.

Because a number of the smaller unsigned values are coded more efficiently, with one bit less, using the EncodeQuasiUniform function, both the elevation and azimuth indexes, which are already unsigned, are converted to signed so that a signed index value of zero corresponds to an elevation or azimuth angle of zero, and only afterwards the ReorderGeneric function is applied. By first converting to signed, the zero value is situated in the middle of the signed interval of possible values, and after applying the ReorderGeneric function the resulting unsigned reordered elevation index value is el_idx_r=ReorderGeneric(el_idx−⌊el_alph÷2⌋), and the resulting unsigned reordered azimuth index value is az_idx_r=ReorderGeneric(az_idx−az_alph·(az_idx≥az_alph÷2)).

For raw coding, without modeling, the two unsigned reordered indexes are merged into a single unsigned sphere index sphere_idx=sphere_offsets(deg_req, el_idx_r)+az_idx_r, where the sphere_offsets function computes the sum of all azimuth alphabets az_alph corresponding to the unsigned reordered elevation indexes smaller than el_idx_r. For example, when deg_req=90, where el_idx_r=0 (elevation 0 degrees) has az_alph=4, el_idx_r=1 (elevation −90 degrees) has az_alph=1, and el_idx_r=2 (elevation 90 degrees) has az_alph=1, sphere_offsets(90,2) would take the value 4+1. If the current configuration takes into account only the horizontal equatorial plane, then el_idx_r is 0 and the unsigned sphere index simplifies to sphere_idx=az_idx_r. In general, the total number of points on the sphere, or sphere point count, is sphere_alph=sphere_offsets(deg_req, el_alph+1).

The unsigned sphere index shpere_idx is coded using the EncodeQuasiUniform function. For entropy coding, with modeling, the quantized directions are grouped into two categories. The first contains the quantized directions for diffuseness indexes diff_idx(b)≤ec_max which are entropy coded, and the second contains the quantized directions for diffuseness indexes diff_idx(b)>ec_max which are raw coded, where ec_max is a threshold optimally chosen depending on diff_alph. This approach implicitly excludes from entropy coding the frequency bands with high diffuseness, when frequency bands with low to medium diffuseness are also present in a frame, to avoid mixing statistics of the residuals. For a mixed diffuseness frame, raw coding is used for the frequency bands with high diffuseness. However, if all frequency bands have high diffuseness, diff_idx(b)>ec_max, the threshold is set in advance to ec_max=diff_alph in order to enable entropy coding for all frequency bands.

For the first category of quantized directions, which are entropy coded, the corresponding elevation indexes el_idx, elevation alphabets el_alph, azimuth indexes az_idx, and azimuth alphabets az_alph are collected into separate vectors for further processing.

An average direction vector is derived, by converting each quantized direction which is entropy coded back to a direction vector, computing either the mean, median, or mode of the direction vectors including renormalization, and converting the average direction vector into average elevation el_avg and azimuth az_avg. These two values are quantized using the best angular precision deg_req used by the quantized directions which are entropy coded, denoted by deg_req_avg, which is usually the needed angular precision corresponding to the smallest diffuseness index min(diff_idx (b)), for b∈{0, . . . , nbands−1} and diff_idx(b)≤ec_max.

Using the corresponding n_points_avg value derived from deg_req_avg, el_avg is quantized normally producing el_avg_idx and el_avg_alph, however, az_avg is quantized using the precision at the equator, producing az_avg_idx and az_avg_alph=4·n_points_avg.

For each direction to be entropy coded, the dequantized average elevation q_el_avg and azimuth q_az_avg are projected using the precision of that direction, to obtain predicted elevation and azimuth indexes. For an elevation index el_idx, its precision, which can be derived from el_alph, is used to compute the projected average elevation index el_avg_idx_p. For the corresponding azimuth index az_idx, its precision on the horizontal circle situated at the q_el elevation, which can be derived from az_alph, is used to compute the projected average azimuth index az_avg_idx_p.

The projection to obtain predicted elevation and azimuth indexes can be computed in several equivalent ways. For elevation, $$\text{el\_avg\_idx\_p} = \text{round}\left(\frac{\text{q\_el\_avg} + 90}{180} \cdot (\text{el\_alph} - 1)\right),$$

which can be easily simplified to $$\text{el\_avg\_idx\_p} = \text{round}\left(\frac{\text{el\_avg\_idx}}{\text{el\_avg\_alph} - 1} \cdot (\text{el\_alph} - 1)\right).$$

To facilitate bit-exact operation, the previous formula can be rewritten using integer only math, including division, as el_avg_idx_p=(2·el_avg_idx·(el_alph−1)+(el_avg_alph−1)) div(2·(el_avg_alph−1)). For azimuth, $$\text{az\_avg\_idx\_p} = \text{round}\left(\frac{\text{q\_az\_avg}}{360} \cdot \text{az\_alph}\right) \bmod \text{az\_alph},$$

which can be easily simplified to $$\text{az\_avg\_idx\_p} = \text{round}\left(\frac{\text{az\_avg\_idx}}{\text{az\_avg\_alph}} \cdot \text{az\_alph}\right)$$

mod az_alph. To facilitate bit-exact operation, the previous formula can be rewritten using integer only math, including division, as az_avg_idx_p=((2·az_avg_idx·az_alph+az_avg_alph) div (2·az_avg_alph)) mod az_alph. At the poles, where az_alph=1, we have az_idx=0 and set az_avg_idx_p=0 directly.

The signed distance el_idx_dist is computed as the difference between each elevation index el_idx and its corresponding el_avg_idx_p. Additionally, because the difference produces values in the interval {−el_alph+1, . . . , el_alph−1}, they are reduced to the interval {−[el_alph÷2], . . . , [el_alph÷2]} by adding el_alph for values which are too small and subtracting el_alph for values which are too large, like in modular arithmetic. If this reduced distance relative to el_avg_idx_p is interpreted using wrap-around, it can produce all values from to the unsigned alphabet containing el_alph values. Similarly, the signed distance az_idx_dist is computed as the difference between each azimuth index az_idx and its corresponding az_avg_idx_p. The difference operation produces values in the interval {-az_alph+1, . . . , az_alph−1}, which are reduced to the interval {−az_alph÷2, . . . , az_alph÷2−1} by adding az_alph for values which are too small and subtracting az_alph for values which are too large. When az_alph=1, the azimuth index is az_idx=0 and nothing needs to be coded.

Depending on their values, the quantized elevation and azimuth indexes can be coded using one of the two available methods: raw coding or entropy coding. The first bit (dir_use_raw_coding) indicates whether the raw coding method is used. For raw coding, the merged sphere_index single unsigned sphere indexes are directly coded using the EncodeQuasiUniform function.

Entropy coding is composed of several parts. All the quantized elevation and azimuth indexes corresponding to diffuseness indexes diff_idx(b)>ec_max are coded like for raw coding. Then, for the others, the elevation part is entropy coded first, followed by the azimuth part.

The elevation part consists of three components: the average elevation index, a Golomb-Rice parameter, and the reduced signed elevation distances. The average elevation index el_avg_idx is converted to signed, so that the zero value is in the middle of the signed interval of possible values, the ReorderGeneric function is applied, and the result is coded using the EncodeQuasiUniform function. The Golomb-Rice parameter, having an alphabet size depending on the maximum of the alphabet sizes of the elevation indexes, is coded using the EncodeQuasiUniform function. Finally, for each reduced signed elevation distance el_idx_dist, the ReorderGeneric function is applied to produce el_idx_dist_r, and the result is coded using the Extended Golomb-Rice method with the parameter indicated above.

For example, if the best angular precision deg_req_min used is 5 degrees, then the maximum of the elevation alphabet sizes el_alph will be el_alph_max=2·[90÷deg_req_min]+1=37. In this case, the Golomb-Rice parameter values (denoted as p in the description of the Golomb-Rice method below) are limited to the interval {0,1,2,3,4}. In general, the largest potentially useful value of the Golomb-Rice parameter is ⌈log₂ el_alph_max⌉−1, which produces binary codewords of a length equal or slightly longer than those produced by raw coding using the EncodeQuasiUniform function. The optimal value of the Golomb-Rice parameter el_gr_param is chosen by efficiently computing without coding, for each value in the interval above, the total size in bits for all the el_idx_dist_r values to be coded using the Extended Golomb-Rice method, and choosing the one which provides the smallest bit size.

The azimuth part also consists of three components: the average azimuth index, a Golomb-Rice parameter, and the reduced signed azimuth distances. The average azimuth index az_avg_idx is converted to signed, so that the zero value is in the middle of the signed interval of the possible values, the ReorderGeneric function is applied, and the result is coded using the EncodeQuasiUniform function. The Golomb-Rice parameter, having an alphabet size depending on the maximum of the alphabet sizes of the azimuth indexes, is coded using the EncodeQuasiUniform function. Finally, for each reduced signed azimuth distance az_idx_dist, the ReorderGeneric function is applied to produce az_idx_dist_r, and the result is coded using the Extended Golomb-Rice method with the parameter indicated above.

For example, if the best angular precision deg_req_min used is 5 degrees, then the maximum of the azimuth alphabet sizes az_alph will be az_alph_max=4⌈90÷deg_req_min⌉=72. In this case, the Golomb-Rice parameter values (denoted as p in the description of the Golomb-Rice method below) are limited to the interval {0,1,2,3,4,5}. The optimal value of the Golomb-Rice parameter az_gr_param is chosen by efficiently computing, for each value in the interval above, the total size in bits for all the az_idx_dist_r values to be coded using the Extended Golomb-Rice method, and choosing the one which provides the smallest bit size.

An important property to take into account for efficient entropy coding is that each reordered reduced elevation distance el_idx_dist_r may have a different alphabet size, which is exactly the el_alph of the original elevation index value el_idx, and depends on the corresponding diffuseness index diff_idx(b). Also, each reordered reduced azimuth distance az_idx_dist_r may have a different alphabet size, which is exactly the az_alph of the original azimuth index value az_idx, and depends both on the corresponding q_el of its horizontal circle and the diffuseness index diff_idx(b).

The existing Golomb-Rice entropy coding method, with an integer parameter p≥0, is used to code an unsigned integer u. First, u is split into the least significant part with p bits, u_lsp=u mod $2^p$, and the most significant part u_msp=⌊u÷$2^p$⌋. The most significant part is coded in unary, using u_msp one bits and a terminating zero bit, and the least significant part is coded in binary.

Because arbitrarily large integers can be coded, some coding efficiency may be lost when the actual values to be coded have a known and relatively small alphabet size. Another disadvantage is the possibility of decoding an out-of-range or invalid value, or of reading a very large number of one bits, in case of a transmission error or a purposely created invalid bitstream.

The Extended Golomb-Rice method combines three improvements over the existing Golomb-Rice method, for coding a vector of values, each with a known and potentially different alphabet size u_alph. First, the alphabet size of the most significant part can be computed as u_msp_alph=⌈u_alph÷$2^p$⌉. If the maximum possible value of the most significant part is coded, u_msp_alph−1, the terminating zero bit can be eliminated, because this condition can be implicitly detected at the decoder side, the modification being the existing Limited Golomb-Rice method. Additionally, for the same case when u_msp=u_msp_alph−1, the alphabet size of the least significant part u_lsp, which can be computed as u_alph−(u_msb_alph−1)·$2^p$, may be smaller than $2^p$, allowing to use the EncodeQuasiUniform function instead of binary coding with p bits. This is also useful when a particular value u has an alphabet u_alph smaller than $2^p$. Finally, when u_msp_alph≤3 the Limited Golomb-Rice method produces codes having only one length, of p or p+1 bits, or codes having only two lengths, of p+1 and p+2 bits. The EncodeQuasiUniform function is optimal for up to two lengths, therefore it is used instead.

The threshold of 3 is a special value, because when u_msp_alph=3 the codewords of the Limited Golomb-Rice for the most significant part are 0, 10, 11; therefore, the total lengths of the code are 1+p, 2+p, and 2+p, where p is the number of bits for the least significant part; because a punctured code is optimal for up to two lengths, it is used instead, replacing both the most and least significant parts.

Furthermore, it is to be outlined that the function EncodeQuasiUniform is exactly a punctured code, which implicitly becomes a binary code when the alphabet size is a power of two. Generally, a punctured code is optimal and uniquely determined given an alphabet size; it produces codes of one or two lengths only; for 3 or more consecutive code lengths, the possible codes are not quasi-uniform anymore and there are different choices for the number of possible codes of each length.

This invention is not limited to the exact description above. Alternatively, the invention can be easily extended in the form of an inter-frame predictive coding scheme, where for each parameter band an average direction vector is computed using previous direction vectors across time, from the current frame and also optionally from previous frames, rather than computing a single average direction vector for the entire current frame and quantizing and coding it as side information. This solution will have the advantage of being more efficient in coding but also less robust against possible packet loss.

Figure 6A:
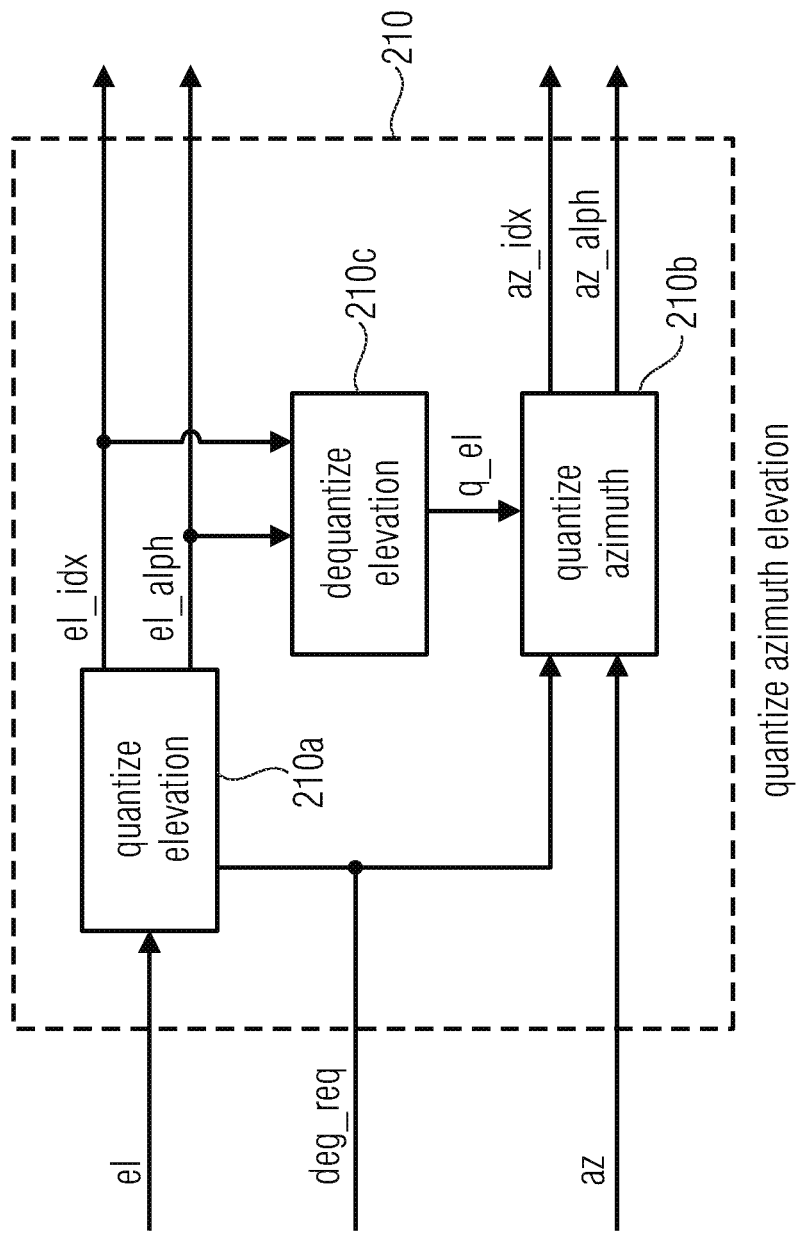
Figure 6B:
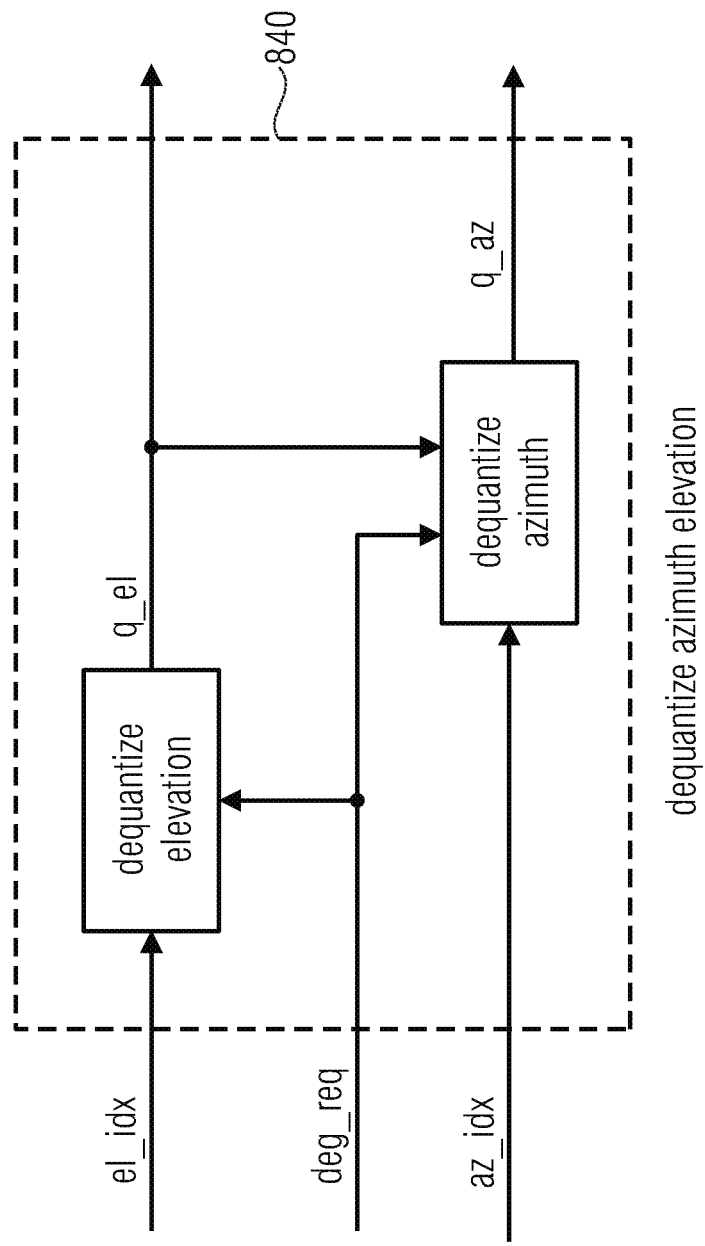
FIG. 6b illustrates an implementation of the functionalities for the parameter dequantizer also used in certain aspects in the encoder-side implementation.

FIGS. 6a to 6g illustrate further procedures performed in the encoder as discussed before. FIG. 6a illustrates a general overview of the parameter quantizer 210 consisting of a quantize elevation function 210a, a quantize azimuth function 210b and a dequantize elevation function 210c. The FIG. 6a embodiment illustrates the parameter quantizer having an azimuth function 210c relying on the quantized and again dequantized elevation value q_el.

Figure 6C:
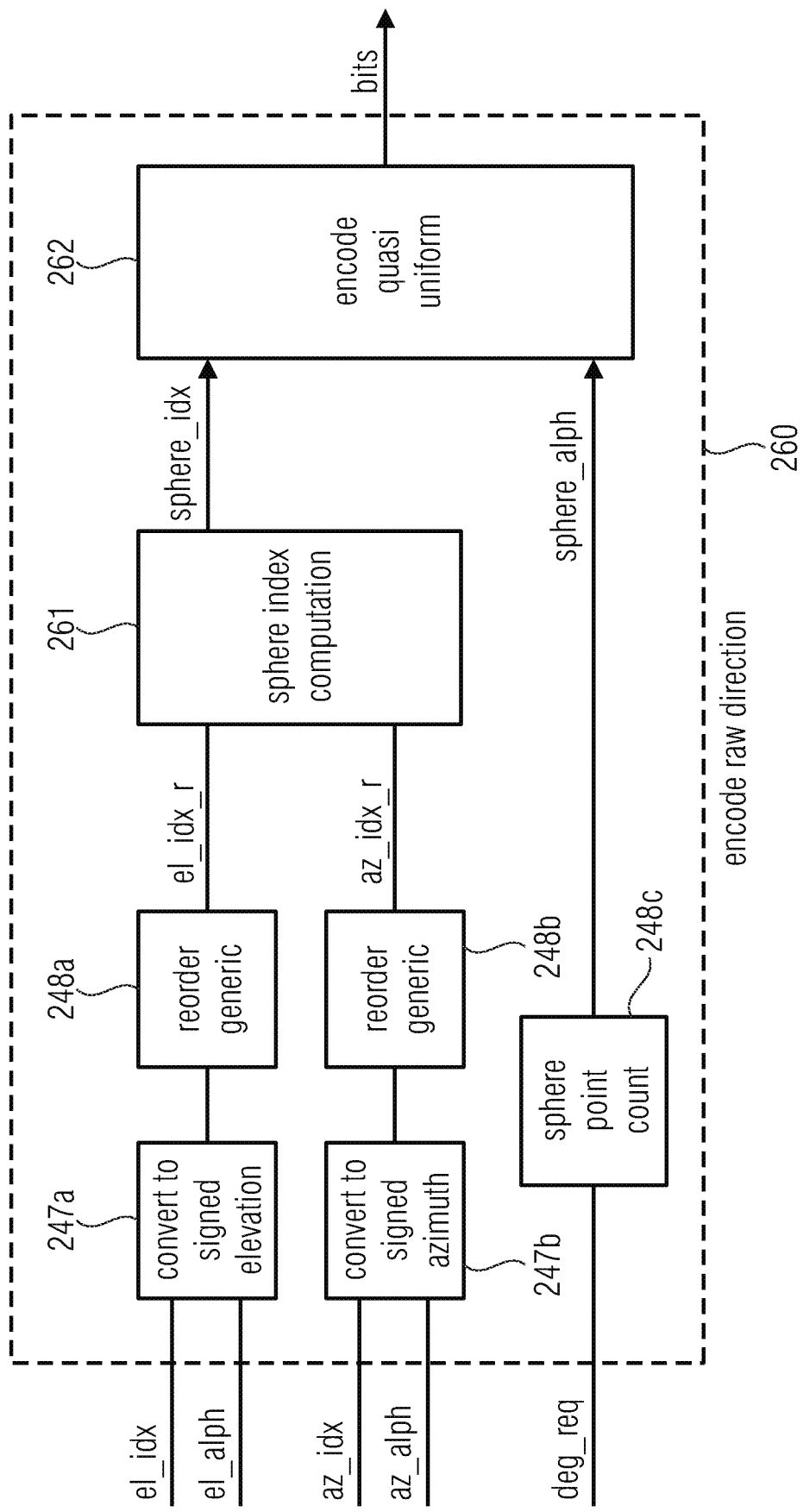
FIG. 6c illustrates an overview over an implementation of the raw direction encoding procedure.

FIG. 6c illustrates a corresponding dequantizer for dequantizing the elevation as it has been discussed before with respect to FIG. 6a for the encoder. However, the FIG. 6b embodiment is also useful for the dequantizer illustrated in item 840 of FIG. 8a. Based on the dequantization precision deg_req, the elevation index on the one hand and the azimuth index on the other hand are dequantized in order to finally obtain the dequantized elevation value q_el and the dequantized azimuth value q_az. FIG. 6c illustrates the first encoding mode, i.e., the raw coding mode as discussed with respect to items 260 to 262 in FIG. 5c. FIG. 6c additionally illustrates the preprocessing discussed in FIG. 5b showing a conversion of elevation data into signed values at 247a and the corresponding conversion of azimuth data into signed values at 247b. A reordering is done for elevation as indicated at 248a and for azimuth as indicated at 248b. A sphere point count procedure is performed in block 248c in order to calculate, based on the quantization or dequantization precision, the sphere alphabet. In block 261, the merging of both indexes into a single sphere index is performed and, the encoding in block 262 is performed with a binary or punctured binary code where, in addition to this sphere index, also the sphere alphabet for the corresponding dequantization precision is derived as also illustrated in FIG. 5c.

Figure 6D:
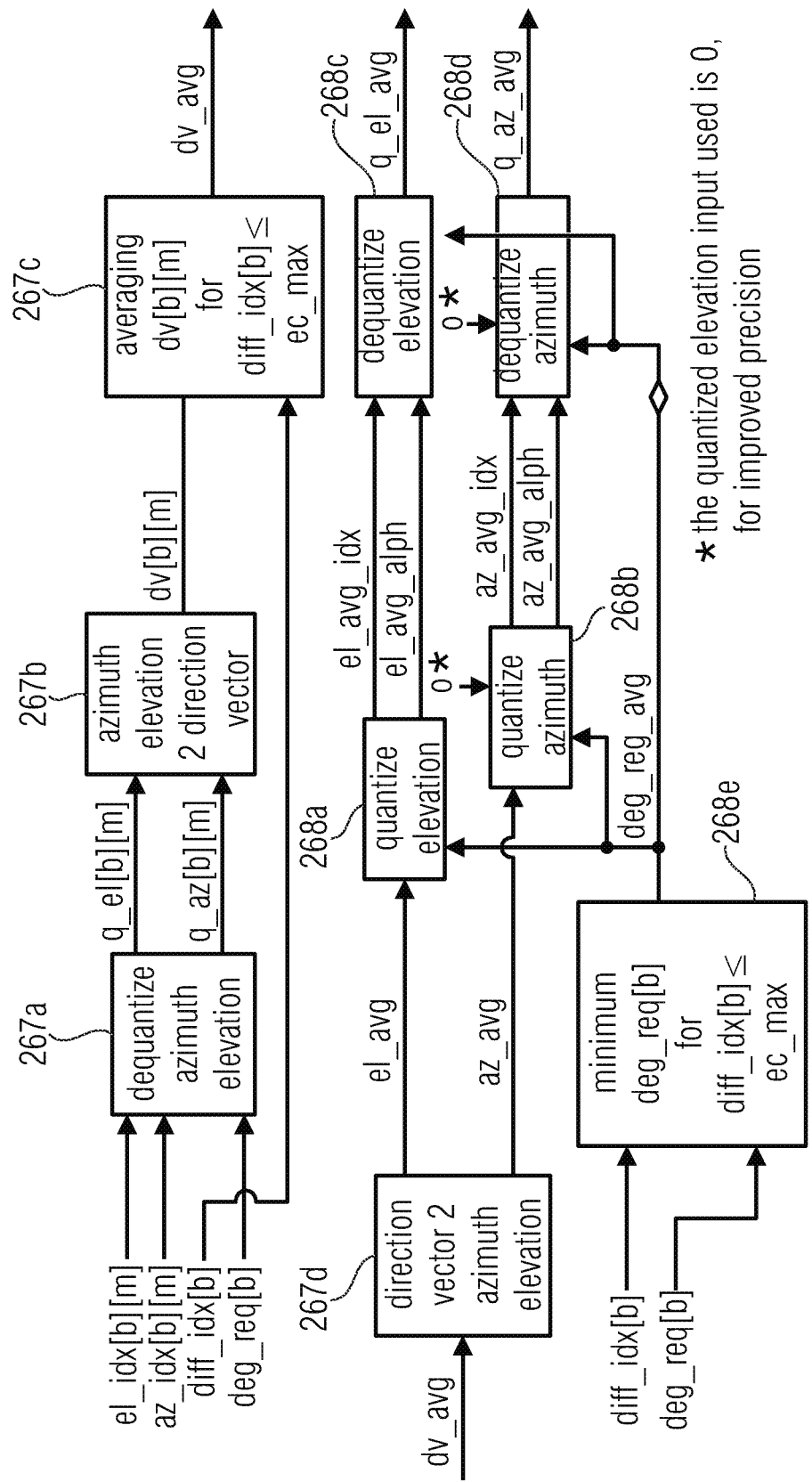
FIG. 6d illustrates an implementation of the computation and quantization and dequantization for the average direction for azimuth and elevation.

FIG. 6d illustrates the procedure performed for the entropy coding mode with modeling. In item 267a, a dequantization of the azimuth and elevation data is performed based on the corresponding indexes and the dequantization precision. The dequantized values are input into block 267b in order to calculate a direction vector from the dequantized values. In block 267c, an averaging is performed for the vectors having an associated diffuseness index below the corresponding threshold in order to obtain an averaged vector. In block 267d, the direction average direction vector is again converted back into an elevation average and an azimuth average and, these values are then quantized using the highest precision as determined by block 268e. This quantization is illustrated at 268a, 268b and the quantization results in corresponding quantized indexes and quantization alphabets where the alphabets are determined by means of the quantization precision for the average value. In blocks 268c and 268d, again a dequantization is performed to obtain a dequantized average value for elevation and azimuth.

Figure 6E:
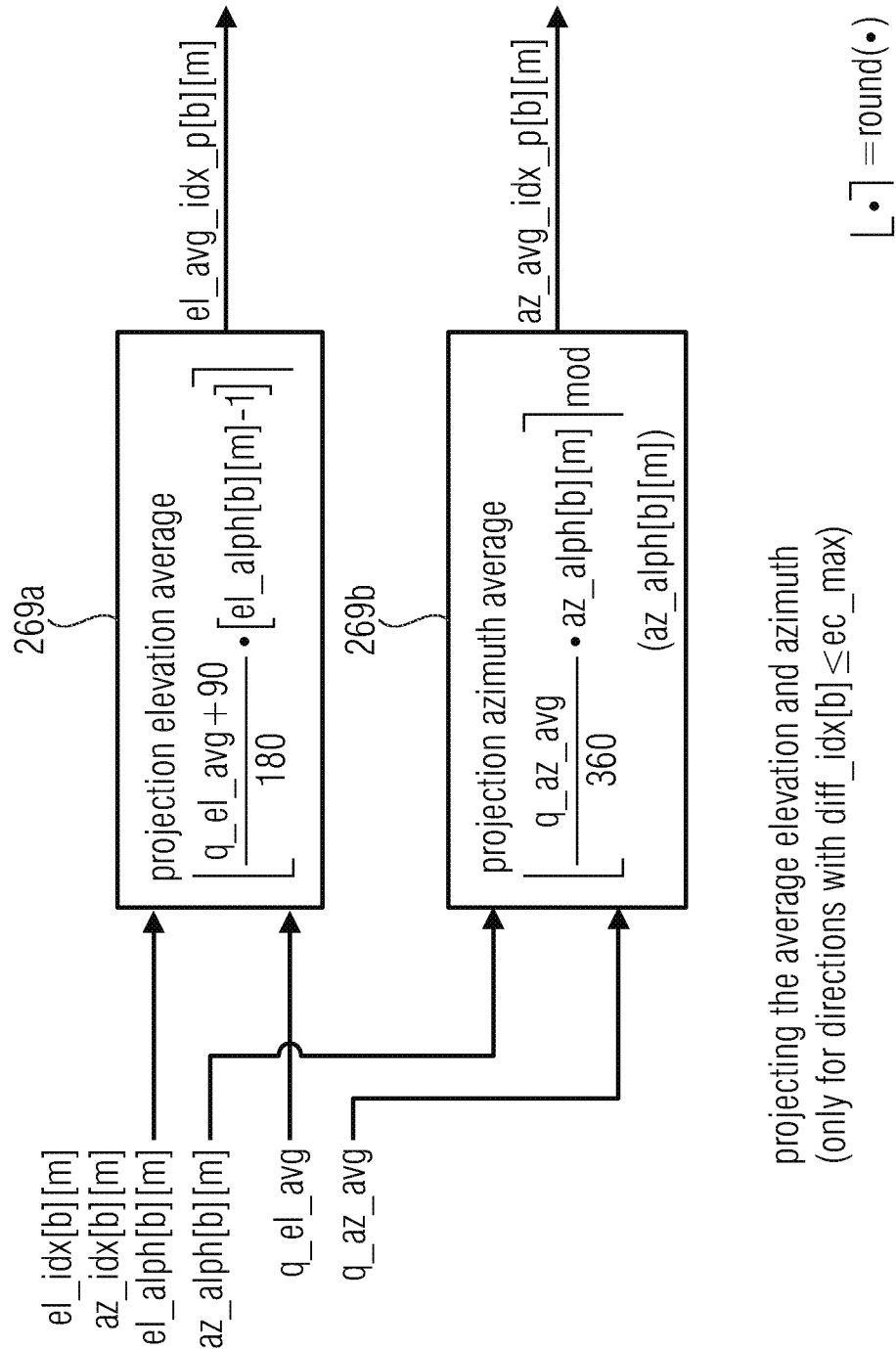
FIG. 6e illustrates the projection of the average elevation and azimuth data.

In FIG. 6e, a projected elevation average is calculated in block 269a and the projected azimuth average is calculated in block 269b, i.e., FIG. 6e illustrates a implementation of block 269 of FIG. 5d. As illustrated in FIG. 6e, blocks 269a, 269b receive the quantized and again dequantized average values for elevation and azimuth. Alternatively, the projection could also be performed on the output of block 267d directly, although the procedure with quantization and again dequantization is advantageous for higher precision and higher compatibility with the states on the encoder-side and on the decoder-side.

Figure 6F:
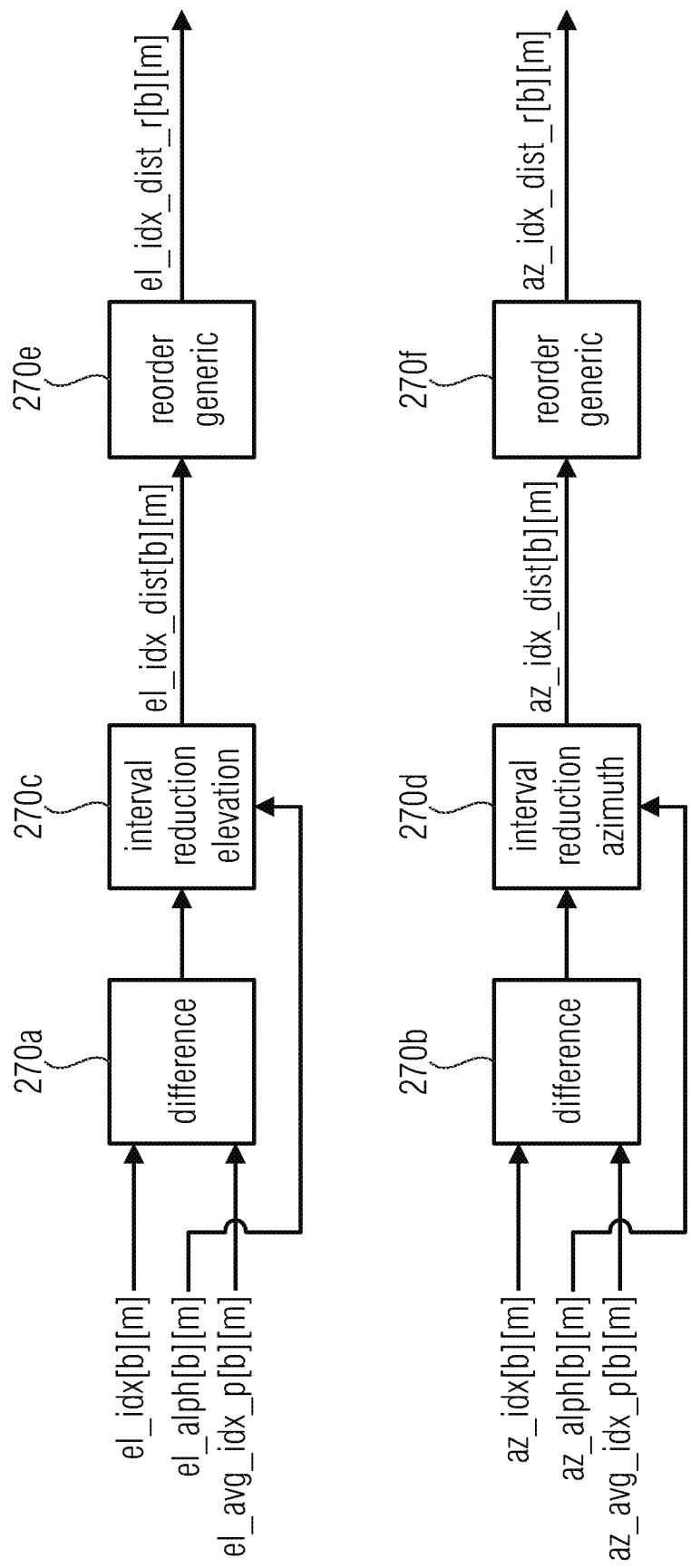
FIG. 6f illustrates the calculation of the distances for elevation and azimuth.

In FIG. 6f, the procedure is illustrated corresponding to block 270 of FIG. 5d in an embodiment. In blocks 278a, 278b, the corresponding differences or "distances" as they are called in block 270 of FIG. 5d are calculated between the original indexes and the projected indexes. A corresponding interval reduction is performed in blocks 270c for the elevation and 270d for the azimuth data. Subsequent to a reordering in block 270e, 270f, data to be subjected to the extended Golomb-Rice encoding as discussed before with respect to FIGS. 5e to 5g is obtained.

Figure 6G:
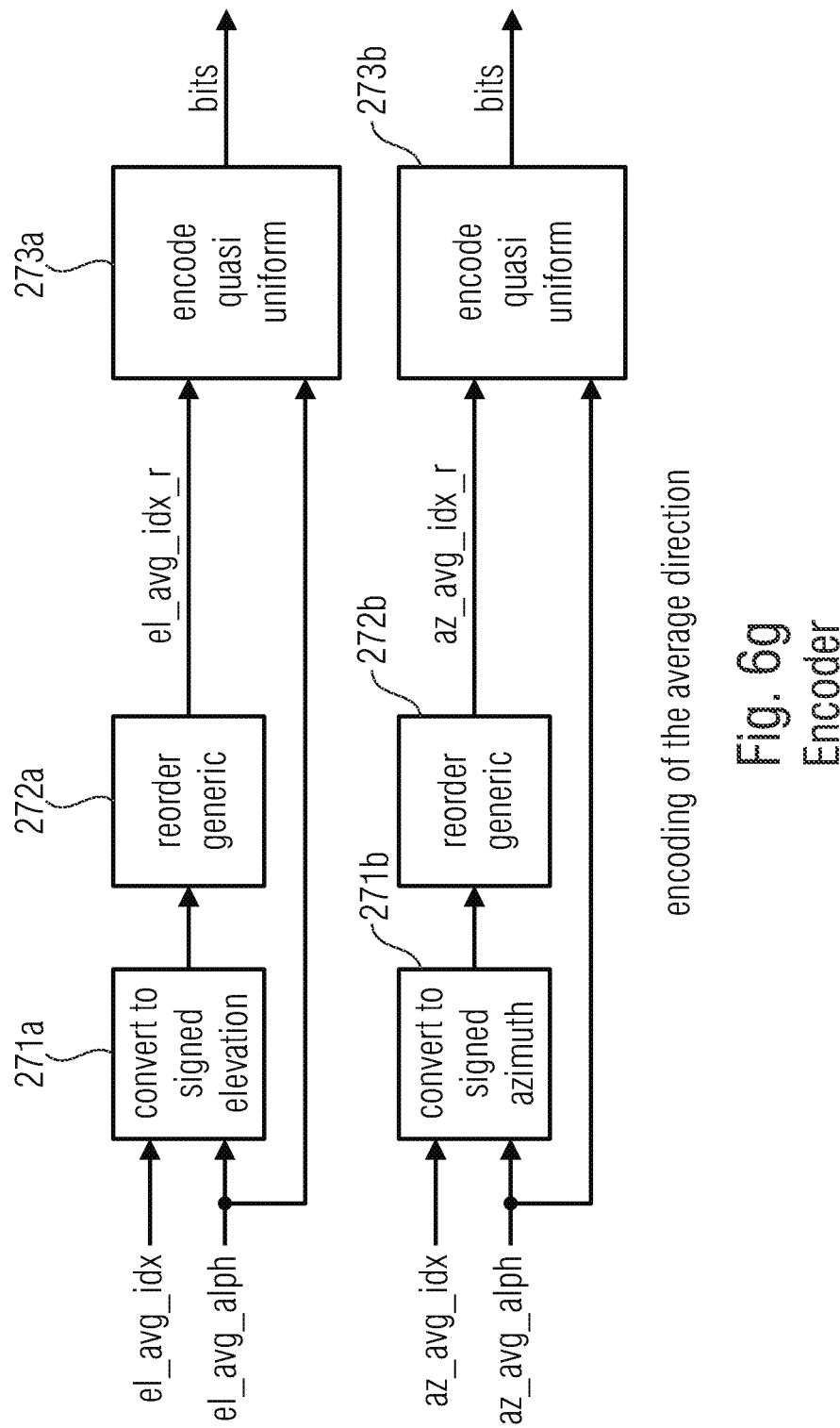
FIG. 6g illustrates an overview over the encoding of the average direction in the entropy encoding mode with modeling.

FIG. 6g illustrates further details regarding the procedure performed for generating the encoded bits for the elevation average and the azimuth average. Block 271a and 271 b illustrates the conversion of elevation and azimuth average data into signed data and the subsequently ReorderGeneric function is illustrated with respect to both kinds of data in block 272a and 272b. Items 273a and 273b illustrate the encoding of this data using a (punctured) binary code such as the above-discussed encode quasi-uniform function.

Figure 7A:
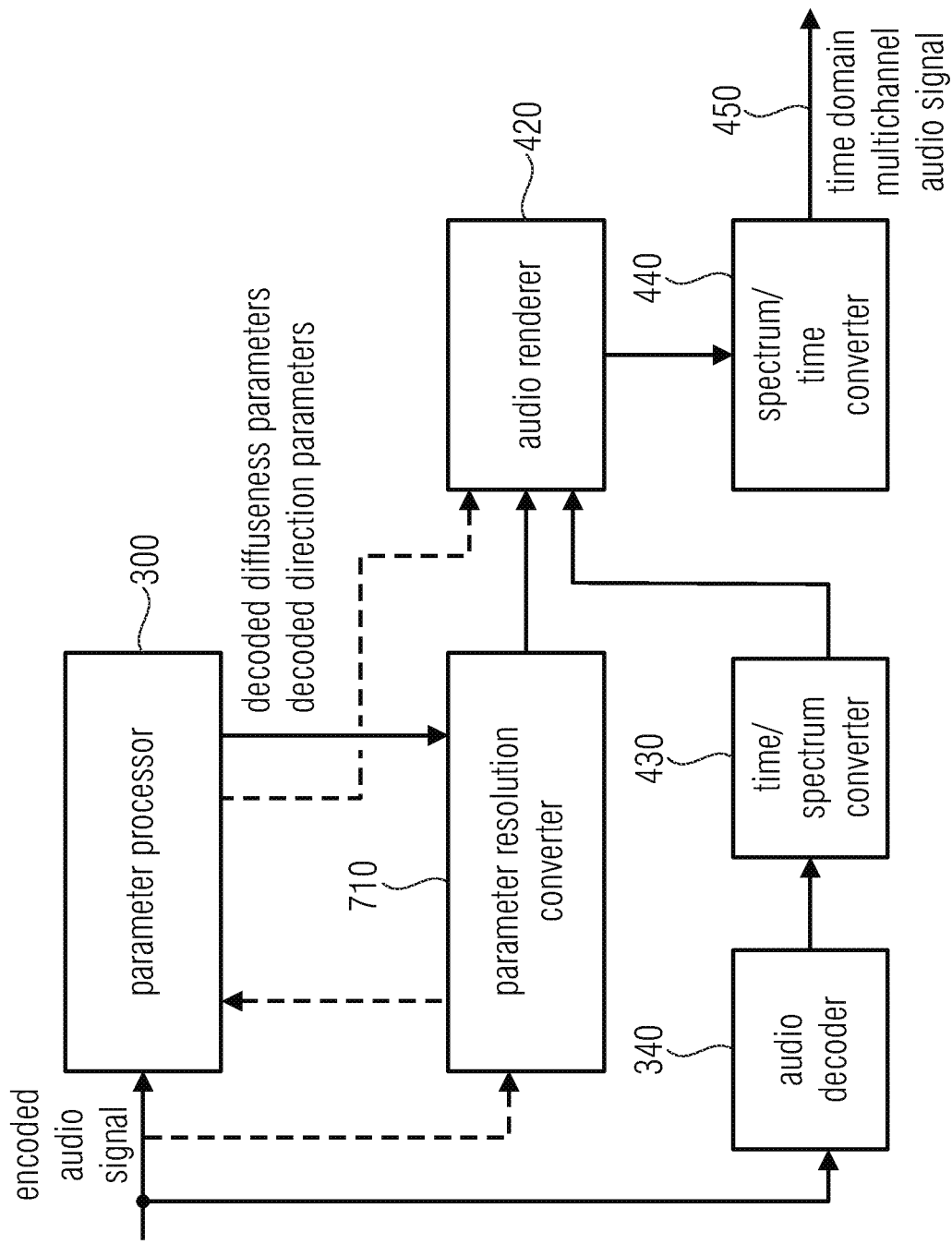
FIG. 7a illustrates a decoder for decoding an encoded audio signal in accordance with the first aspect.

FIG. 7a illustrates a decoder in accordance with the first aspect for decoding an encoded audio signal comprising encoded directional audio coding parameters, the encoded directional audio coding parameters comprising encoded diffuseness parameters and encoded direction parameters. The apparatus comprises a parameter processor 300 for decoding the encoded directional audio coding parameters to obtain decoded diffuseness parameters with a first time or frequency resolution and decoded direction parameters with a second time or frequency resolution. The parameter processor 300 is connected to a parameter resolution converter 710 for converting the decoded diffuseness parameters or the decoded direction parameters into converted diffuseness parameters or converted direction parameters. Alternatively, as illustrated by the hedged line, the parameter resolution converter 710 can already perform the parameter resolution processing with the encoded parametric data and the converted encoded parameters are sent from the parameter resolution converter 710 to the parameter processor 300. In this latter case, the parameter processor 300 then feeds the processed, i.e., decoded parameters directly to the audio renderer 420. However, it is advantageous to perform the parameter resolution conversion with the decoded diffuseness parameters and the decoded direction parameters.

The decoded direction and diffuseness parameters typically have a third or fourth time or frequency resolution when they are provided to the audio renderer 420, where the third or fourth resolution is greater than the resolution that is inherent to these parameters when they are output by the parameter processor 300.

The parameter resolution converter 710 is configured to perform a different parameter resolution conversion with the decoded diffuseness parameters and the decoded direction parameters, since the time or frequency resolutions inherent to the decoded diffuseness parameters and the decoded direction parameters is different from each other, and, typically, the decoded diffuseness parameters have a lower time or frequency resolution compared to the decoded direction parameters. As discussed before with respect to FIG. 3a to 3c, the highest resolution that is used by the audio renderer 420 is the one illustrated in FIG. 3b and the intermediate resolution as illustrated in FIG. 3c is the one that is inherent to the decoded direction parameters and the low resolution inherent to the decoded diffuseness parameters is the one illustrated in FIG. 3b.

FIGS. 3a to 3c are only examples illustrating three very specific time or frequency resolutions. Any other time or frequency resolution that has the same tendency in that there is a high time or frequency resolution, a medium resolution and a low resolution can also be applied by the present invention. A time or frequency resolution is lower than another time or frequency resolution when both these resolutions have the same frequency resolution but a different time resolution, or vice versa, as has been illustrated in the example of FIG. 3b and FIG. 3c. In this example, the frequency resolution is the same in FIG. 3b and FIG. 3c, but the time resolution is higher in FIG. 3c so that FIG. 3c illustrates a medium resolution while FIG. 3b illustrates a low resolution.

The result of the audio renderer 420 operating in the third or fourth high time or frequency resolution is then forwarded to a spectrum/time converter 440 that then generates the time domain multichannel audio signal 450 as has already been discussed before with respect to FIG. 1b. The spectrum/time converter 440 converts data from the spectral domain as generated by the audio renderer 420 into the time domain on line 450. The spectral domain, in which the audio renderer 420 operates comprises, for a frame, a first number of time slots and a second number of frequency bands. A frame comprises a number of time/frequency bins being equal to a multiplication result of the first number and the second number, wherein the first number and the second number define the third time or frequency resolution, i.e., the high time or frequency resolution.

The resolution converter 710 is configured to generate, from a diffuseness parameter associated with the first time or frequency resolution, a number of at least four diffuseness parameters, where two of these diffuseness parameters are for time/frequency bins being adjacent in time and the other two of those at least four diffuseness parameters are for time/frequency bins adjacent to each other in the frequency.

Since the time or frequency resolution for the diffuseness parameters is lower than for the direction parameters, the parameter resolution converter is configured to generate, for a decoded diffuseness parameter a multitude of converted diffuseness parameters and for a decoded direction parameter a second multitude of converted direction parameters, where the second multitude is higher than the first multitude.

Figure 7B:
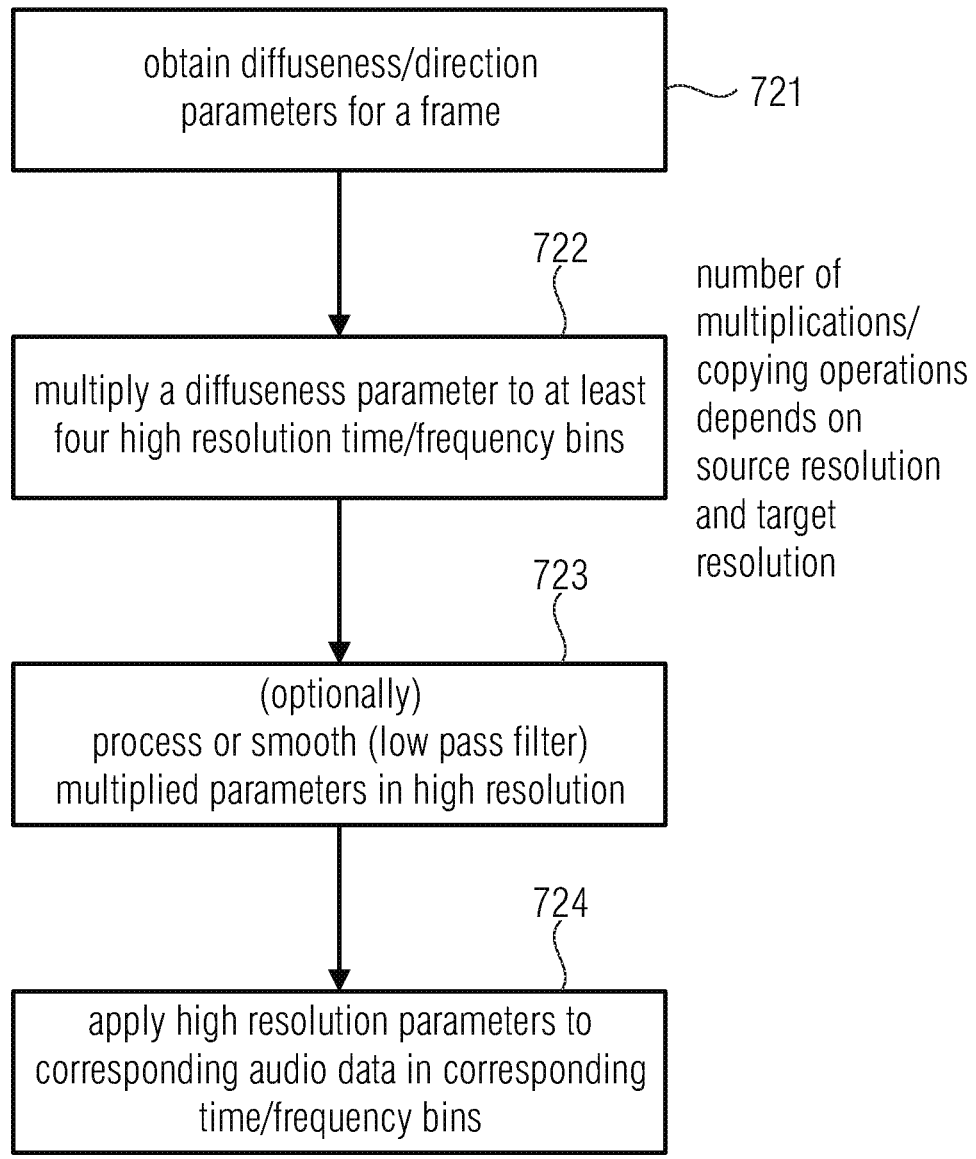
FIG. 7b illustrates an implementation of the parameter resolution converter of FIG. 7a and the subsequent audio rendering.

FIG. 7b illustrates a procedure performed by the parameter resolution converter. In block 721, the parameter resolution converter 710 obtains the diffuseness/direction parameters for a frame. In block 722, a multiplication of the diffuseness parameters or a copying operation to at least four high resolution time/frequency bins is performed. In block 723, an optional processing such as smoothing or a low pass filtering is performed to the multiplied parameters being in the high resolution representation. In block 724, the high resolution parameters are applied to corresponding audio data in the corresponding high resolution time/frequency bins.

FIG. 8a illustrates an implementation of a decoder for decoding an encoded audio signal comprising encoded directional audio coding parameters including encoded diffuseness parameters and encoded direction parameters in accordance with the first aspect. The encoded audio signal is input into an input interface. The input interface 800 receives the encoded audio signal and separates, from the encoded audio signal, the encoded diffuseness parameters and the encoded direction parameters, typically in a frame by frame manner. This data is input into a parameter decoder 820 that generates, from the encoded parameters, quantized diffuseness parameters and quantized direction parameters where the quantized direction parameters are, for example, azimuth indexes and elevation indexes. This data is input into a parameter dequantizer 840 for determining, from the quantized diffuseness parameters and the quantized direction parameters, dequantized diffuseness parameters and dequantized direction parameters. This data can then be used for converting one audio format into another audio format or can be used for rendering an audio signal into a multichannel signal or in any other representation such as an Ambisonics representation, an MPS representation or an SAOC representation.

The dequantized parameters output by block 840 can be input into an optional parameter resolution converter as discussed before with respect to FIG. 7a at block 710. The either converted or non-converted parameters can be input into the audio renderer 420, 440 illustrated in FIG. 8a. When the encoded audio signal additionally comprises an encoded transport signal, the input interface 800 is configured to separate the encoded transport signal out of the encoded audio signal and feeds this data into an audio transport signal decoder 340 that has already been discussed before with respect to FIG. 8b. The result is input into a time-spectrum converter 430 feeding the audio renderer 420. When the audio renderer 420 is implemented as illustrated in FIG. 1b, a conversion into the time domain is performed using a the synthesis filter bank 440 of FIG. 1b.

FIG. 8b illustrates the part of the encoded audio signal typically organized in a bitstream that refers to the encoded diffuseness parameters. The diffuseness parameters have associated therewith two mode bits 802 for indicating the three different modes illustrated in FIG. 8b and discussed before. The encoded data for the diffuseness parameters comprises payload data 804.

The bitstream portions for the direction parameters are illustrated in FIG. 8c and FIG. 8d as discussed before, where FIG. 8c illustrates the situation when the raw coding mode has been selected and FIG. 8d illustrates the situation where the entropy decoding mode with modeling has been selected/indicated by the mode bit or mode flag 806.

Figure 8E:
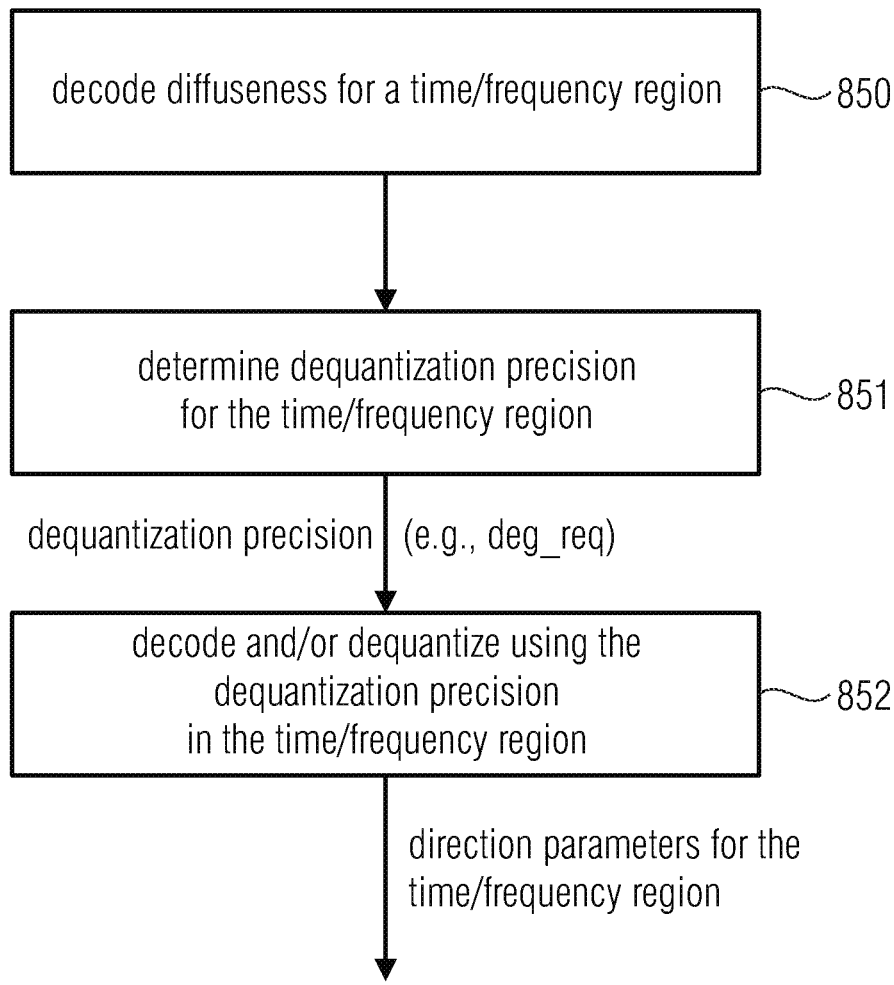
FIG. 8e illustrates an implementation of the parameter decoder and parameter dequantizer, where the dequantization precision is determined based on the diffuseness for a time/frequency region.

The parameter decoder 820 of FIG. 8a is configured to decode the diffuseness payload data for a time/frequency region as indicated in block 850, and the time/frequency region is a time/frequency region with the low resolution in the embodiment. In block 851, a dequantization precision for the time/frequency region is determined. Based on this dequantization precision, block 852 of FIG. 8e illustrates a decoding and/or dequantization of the direction parameters using the dequantization precision that is the same for the time/frequency region to which the diffuseness parameter is associated with. The output of FIG. 8e is a set of decoded direction parameters for the time/frequency region such as for one band of FIG. 3c, i.e., in the illustrated example, four direction parameters for one band in a frame.

Figure 8F:
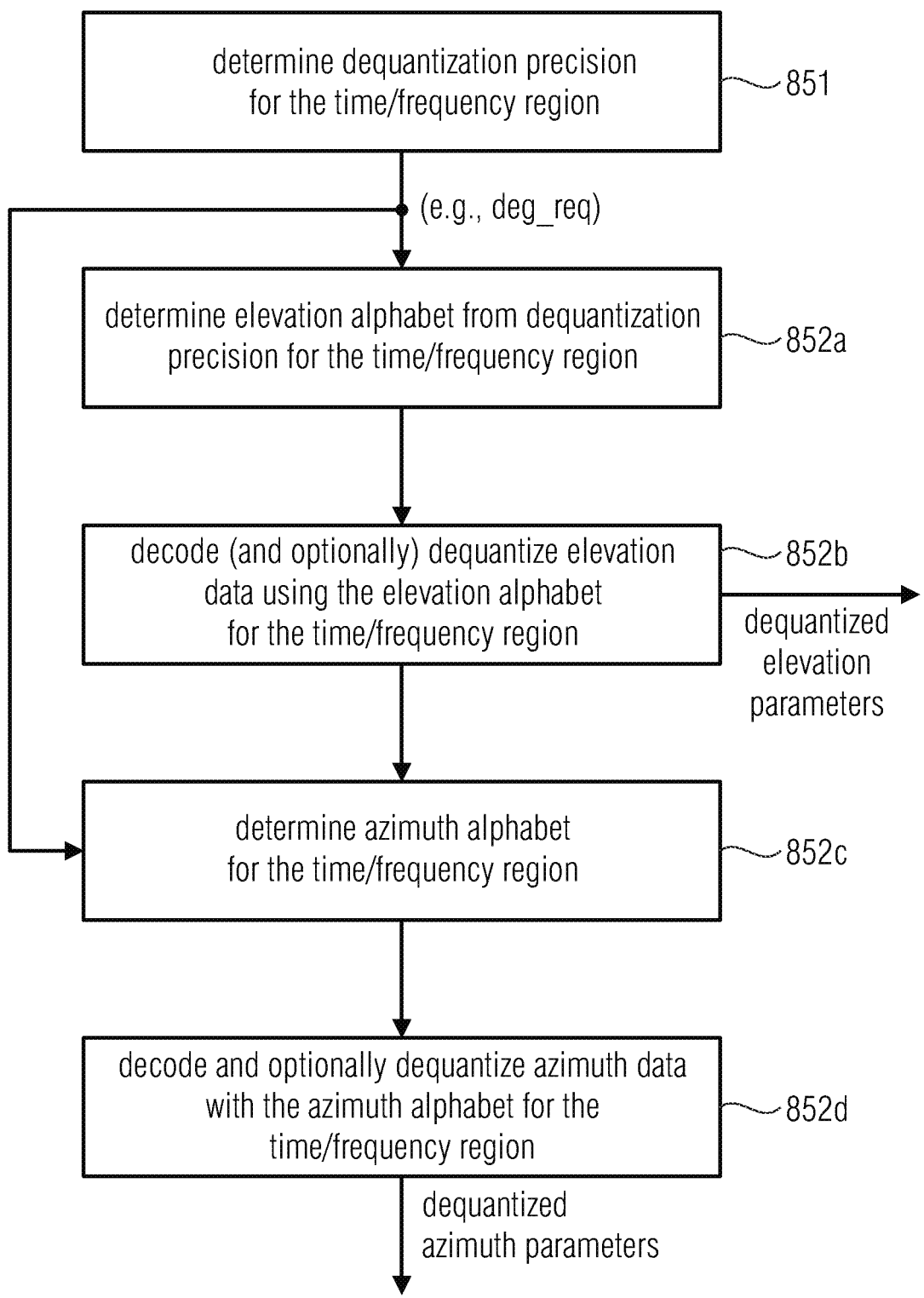
FIG. 8f illustrates an implementation of the parameter decoder and parameter dequantizer, where the elevation alphabet is determined from the dequantization precision and the azimuth alphabet is determined based on the dequantization precision and the elevation data for the time/frequency region.

FIG. 8f illustrates a further feature of the decoder and, particularly, the parameter decoder 820 and the parameter dequantizer 840 of FIG. 8a. Irrespective of whether the dequantization precision is determined based on a diffuseness parameter or is explicitly signaled or determined somewhere else, block 852a indicates the determination of an elevation alphabet from a signaled dequantization precision for a time/frequency region. In block 852b, the elevation data are decoded and optionally dequantized using the elevation alphabet for the time/frequency region in order to obtain, at the output of block 852b, dequantized elevation parameters. In block 852c, an azimuth alphabet for the time/frequency region is determined not only from the dequantization precision from block 851, but also from the quantized or dequantized elevation data as well in order to reflect the situation that has bene discussed before with respect to the quasi-uniform coverage of the unit sphere in FIG. 4d. In block 852d, a decoding and optionally dequantization of the azimuth data with the azimuth alphabet is performed for the time/frequency region.

The present invention in accordance with the second aspect combines those two features, but the two features, i.e., the one of FIG. 8a or the other of FIG. 8f can also be applied separately from each other.

Figure 8G:
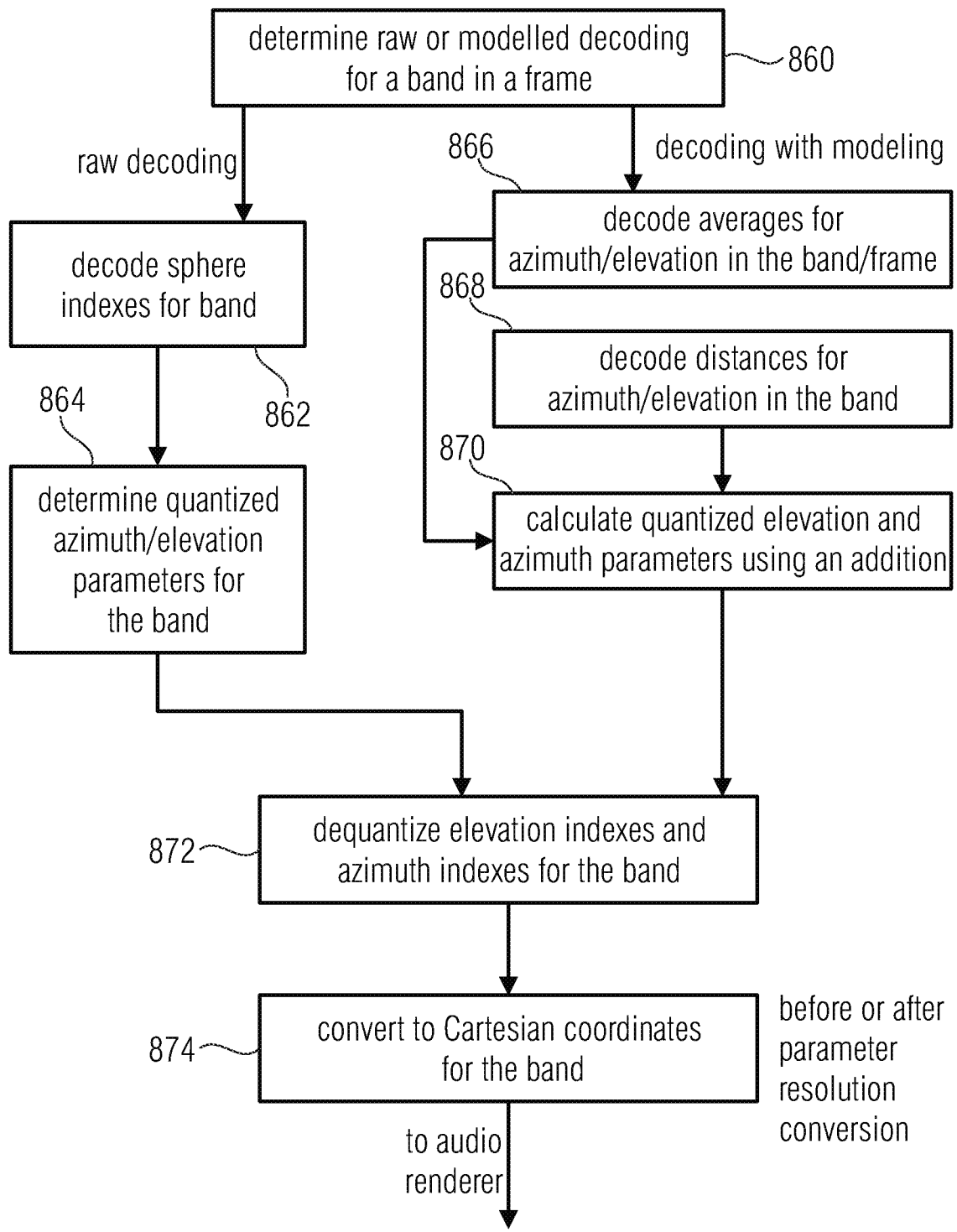
FIG. 8g illustrates an overview over the parameter decoder of FIG. 8a illustrating the two different decoding modes.

FIG. 8g illustrates the parameter decoding overview depending on whether a raw decoding mode is selected or a decoding mode with modeling as indicated by the mode bit 806 discussed in FIG. 8c and FIG. 8d. When a raw decoding is to be applied, then the sphere indexes for a band are decoded as indicated at 862 and the quantized azimuth/elevation parameters for the band are calculated from the decoded sphere indexes as indicated at block 864.

When decoding with modeling was indicated by the mode bit 806, then the averages for the azimuth/elevation data in the band/frame is decoded as indicated by block 866. In block 868, distances for the azimuth/elevation information in the band are decoded and, in block 870, the corresponding quantized elevation and azimuth parameters are calculated using typically an addition operation.

Independent on whether the raw decoding mode or the decoding mode with modeling has been applied, the decoded azimuth/elevation indexes are dequantized 872 as also illustrated at 840 in FIG. 8a, and in block 874, and the result can be converted to Cartesian coordinates for the band. Alternatively, when the azimuth and elevation data can be directly used in the audio renderer, then any such conversion in block 874 is not needed. Any potentially used parameter resolution conversion can be applied before or after the conversion if a conversion into Cartesian coordinates is done anyway.

Figure 9A:
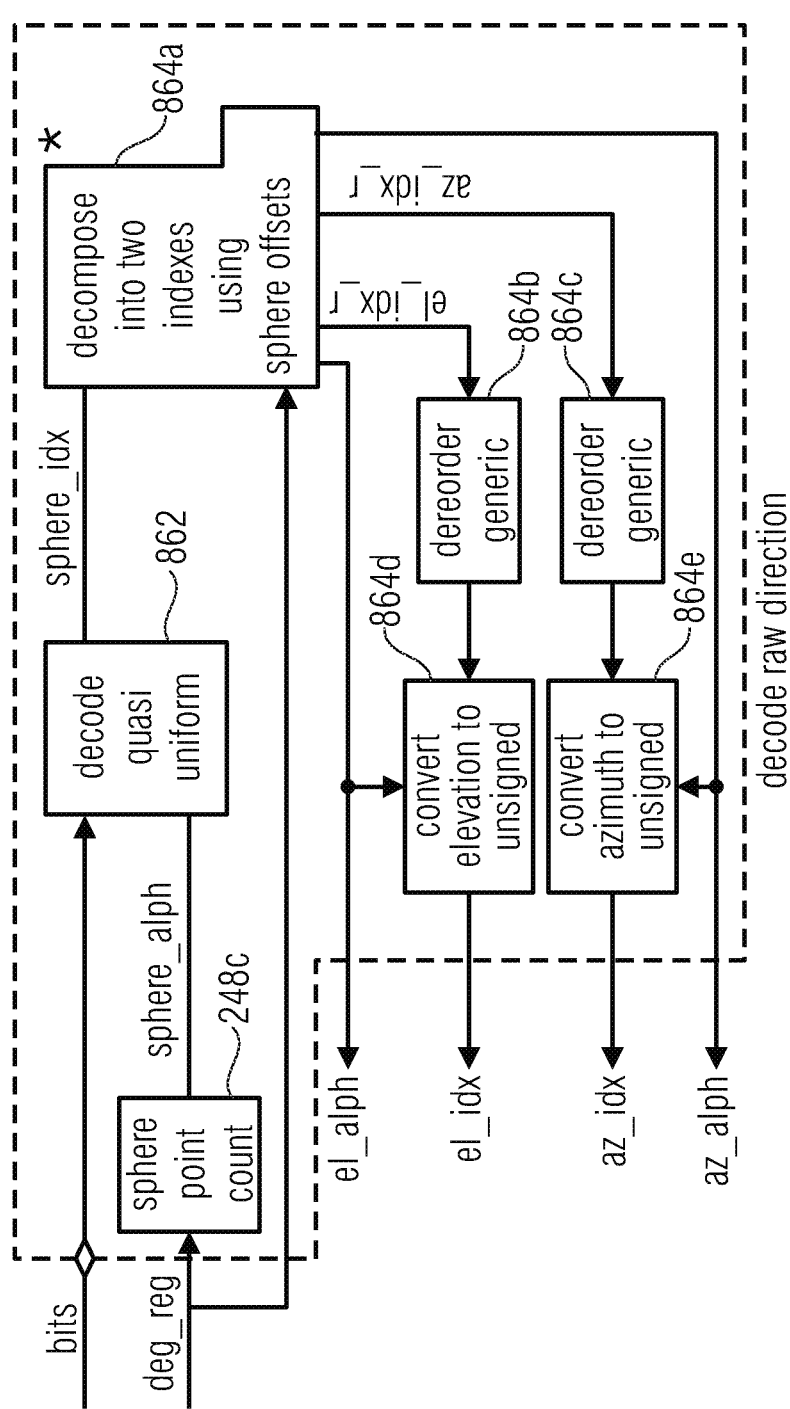
FIG. 9a illustrates a decoding operation, when the raw encoding mode is active.

Subsequently, reference is also made to FIGS. 9a to 9c with respect to additional implementations of the decoder. FIG. 9a illustrates the decoding operation illustrated in block 862. Depending on the dequantization precision as determined by block 851 in FIG. 8e or FIG. 8f, the functionality sphere point count of block 248c is performed in order to determine the actual sphere alphabet that has also been applied during encoding. The bits for the sphere index are decoded in block 862 and a decomposition into the two indexes is performed as illustrated at 864a and is given in more detail in FIG. 9a. Reordering functions 864b, 864c and corresponding conversion functions in block 864d and 864e are performed in order to finally obtain the elevation indexes, the azimuth indexes and the corresponding alphabets for the subsequent dequantization in block 872 of FIG. 8g.

Figure 9B:
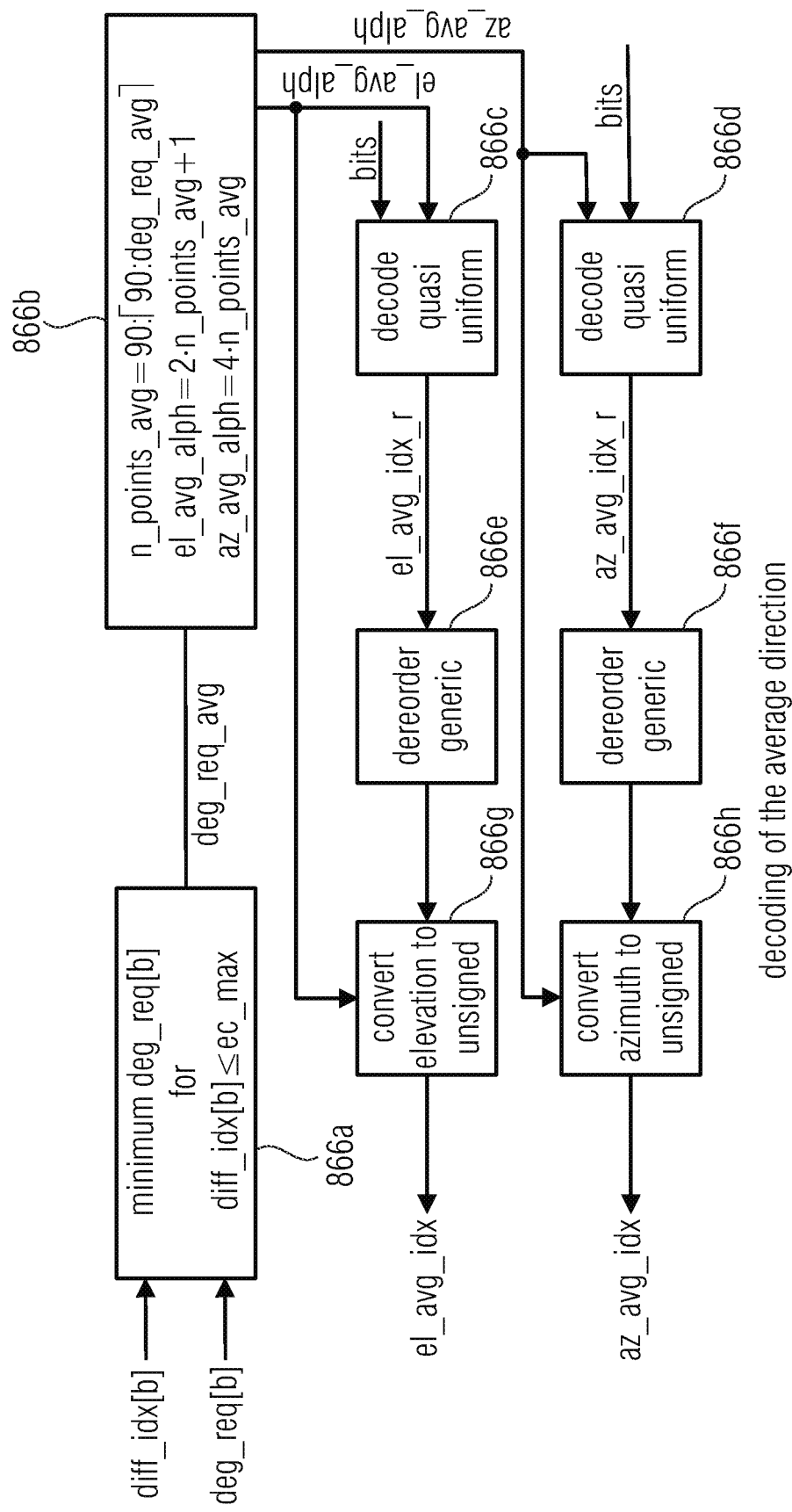
FIG. 9b illustrates a decoding of the average direction, when the entropy decoding mode with modeling is active.
Figure 10A:
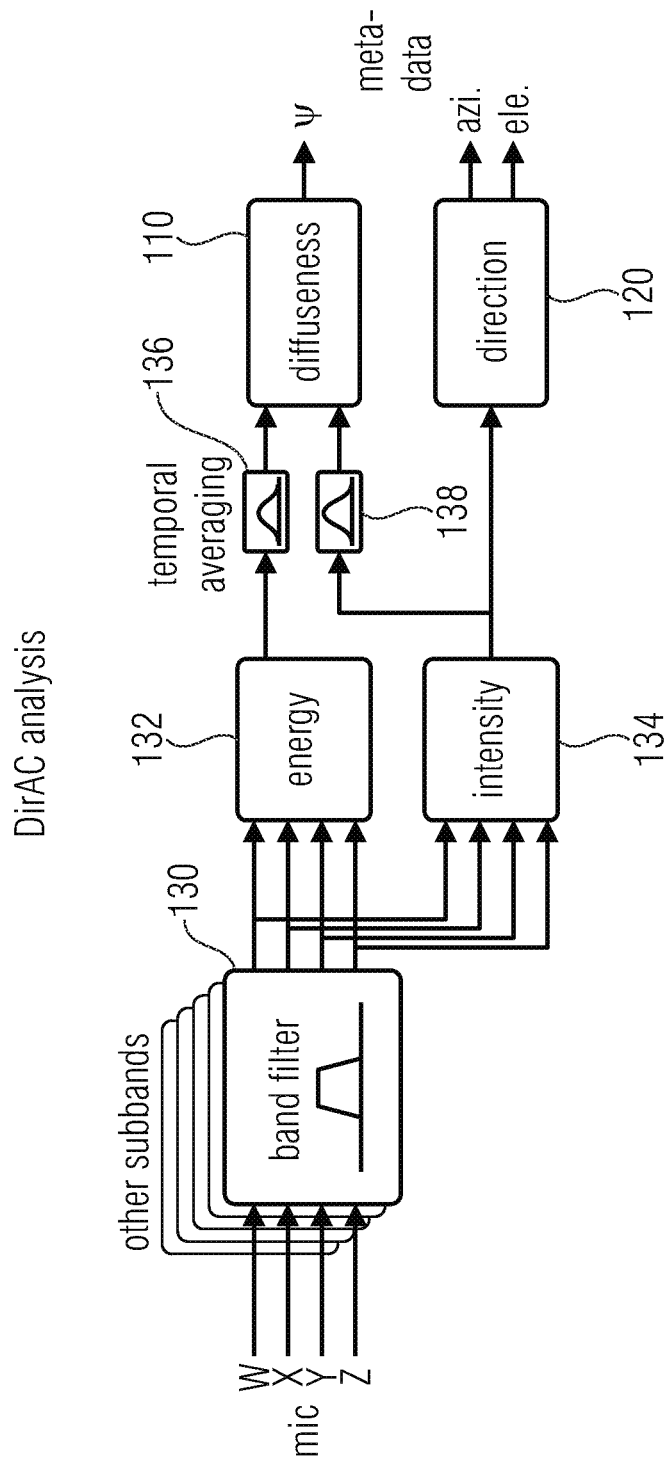
FIG. 10a illustrates a well-known DirAC analyzer.
Figure 10B:
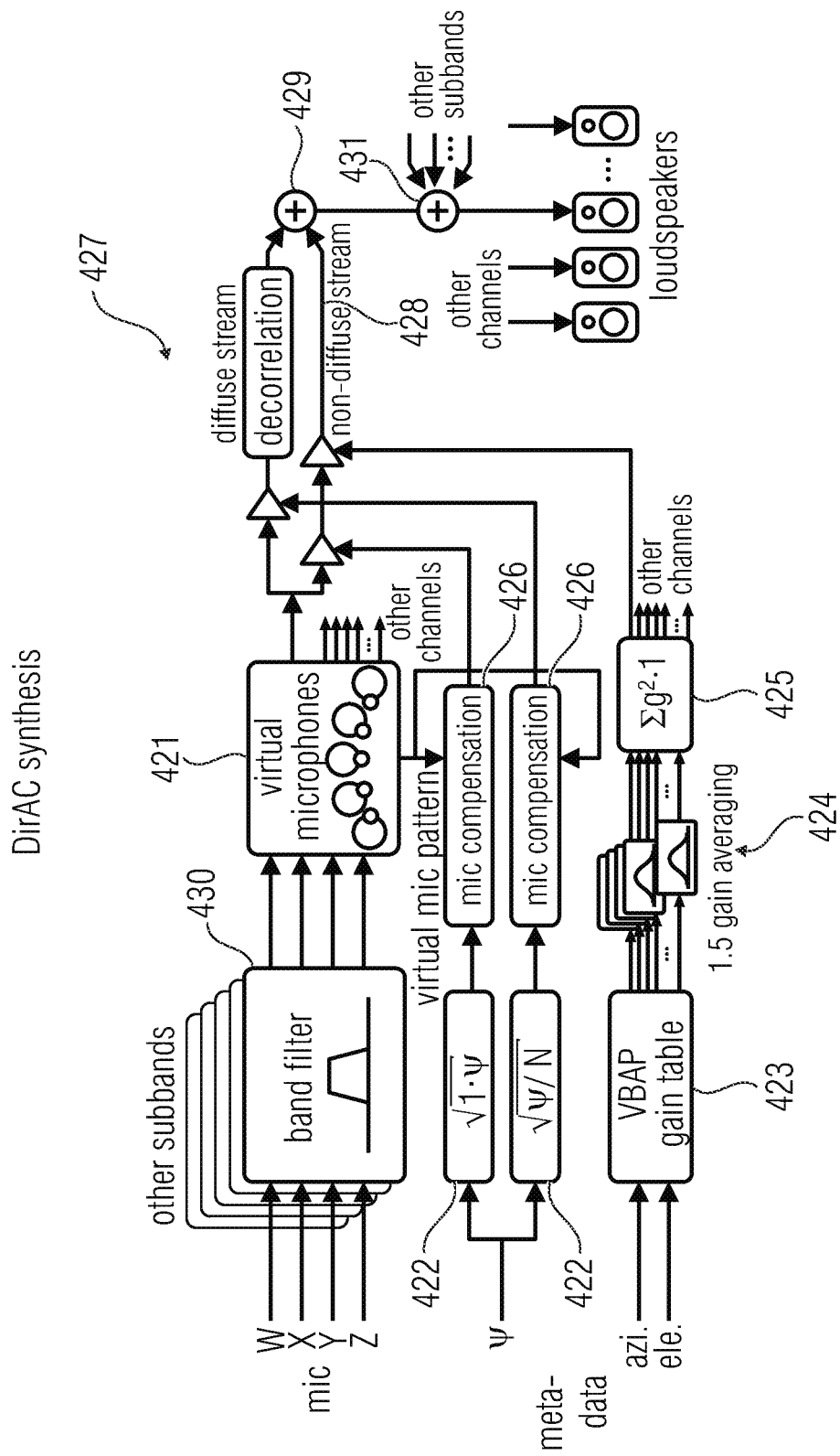
FIG. 10b illustrates a well-known DirAC synthesizer.

FIG. 9b illustrates corresponding procedures for the other decoding mode, i.e., the decoding mode with modeling. In block 866a, the dequantization precision for the averages are calculated in line with what has been discussed before with respect to the encoder side. The alphabets are calculated in block 866b and in blocks 866c and 866d, the corresponding bits 808a, 808b of FIG. 8d are decoded. Reordering functions 866e, 866f are performed in subsequent conversion operations 866g, 866h in order to undo or mimic corresponding operations performed on the encoder-side.

FIG. 9c additionally illustrates the complete dequantization operation 840 in an embodiment. Blocks 852a determines the elevation alphabet as has already been discussed with respect to FIG. 8f and a corresponding computation of the azimuth alphabet is performed in block 852c as well. The projection calculation operation 820a, 820e is also performed for elevation and azimuth. Reorder procedures for elevation 820b and azimuth 820f are performed as well and the corresponding addition operations 820c, 820g are performed as well. The corresponding interval reduction in blocks 820d for elevation and 820h for azimuth are performed as well and, a dequantization of elevation is performed in block 840a and 840b. FIG. 9c shows that this procedure implies a certain order, i.e., that the elevation data is processed first and based on the dequantized elevation data, the decoding and dequantization of the azimuth data is performed in an embodiment of the present invention.

Subsequently, Benefits and Advantages of Embodiments are summarized:

Efficient coding of spatial metadata generated by DirAC without compromising the generality of the model. It is a key-enabler for integrating DirAC into a low bit-rate coding scheme.

Grouping and averaging of the direction and diffuseness parameters with different time (or optionally frequency) resolutions: diffuseness is averaged over a longer time than direction, since diffuseness retains a longer term characteristic of the sound field than direction, which is a more reactive spatial cue.

Quasi-uniform dynamic coverage of the 3D sphere, fully symmetrical with respect to the X, Y, and Z coordinate axes, and any desired angular resolution is possible.

Quantization and dequantization operations are constant complexity (no search for the nearest code vector is needed).

Encoding and decoding of one quantized point index have constant or at most logarithmic complexity with respect to the total number of quantized points on the sphere.

Worst case entropy coding size of the entire DirAC spatial metadata for one frame is limited to only 2 bits more than that of raw coding.

Extended Golomb-Rice coding method, which is optimal for coding a vector of symbols with potentially different alphabet sizes.

Using an average direction for efficient entropy coding of directions, mapping the quantized average direction from the highest resolution to the resolution of each azimuth and elevation.

Use raw coding for directions with high diffuseness, above a predefined threshold, for mixed diffuseness frames.

Use an angular resolution for each direction as a function of its corresponding diffuseness.

The first aspect of the present invention is directed to processing diffuseness parameters and direction parameters with first and second time or frequency resolutions and a subsequent quantization and encoding of such values. This first aspect additionally refers to grouping of parameters with different time/frequency resolutions. A further aspect is related to performing an amplitude-measure related weighting within the grouping and a further additional aspect relates to a weighting for the averaging and grouping of direction parameters using corresponding diffuseness parameters as a basis for the corresponding weights. The above aspects are also described and elaborated in the first claim set.

The second aspect of the present invention that is subsequently elaborated more in the enclosed set of examples is directed to performing quantization and coding. This aspect can be performed without features outlined in the first aspect or can be used together with the corresponding features elaborated in the first aspect.

Thus, all the different aspects as elaborated in the claims and the set of examples and as elaborated in the different dependent claims of the claims and the examples can be used independent from each other or can be used together and it is particularly advantageous for an embodiment that all aspects of the set of claims are used together with all aspects of the set of examples.

The set of examples comprises the following examples:

1. Apparatus for encoding directional audio coding parameters comprising diffuseness parameters and direction parameters, comprising:
    a parameter quantizer (210) for quantizing the diffuseness parameters and the direction parameters;
    a parameter encoder (220) for encoding quantized diffuseness parameters and quantized direction parameters; and an output interface (230) for generating an encoded parameter representation comprising information on encoded diffuseness parameters and encoded direction parameters.

2. Apparatus of example 1,
    wherein the parameter quantizer (210) is configured to quantize the diffuseness parameters using a non-uniform quantizer to produce diffuseness indices.

3. Apparatus of example 2,
    wherein the parameter quantizer (210) is configured to derive the non-uniform quantizer using an inter-channel coherence quantization table to obtain thresholds and reconstruction levels of the non-uniform quantizer.

4. Apparatus of one of examples 1 to 3,
    wherein the parameter encoder (220) is configured
    to encode the quantized diffuseness parameters in a raw coding mode using a binary code if an encoding alphabet has a size being a power of two, or
    to encode the quantized diffuseness parameters in the raw coding mode using a punctured code, if the encoding alphabet is different from a power of two, or
    to encode the quantized diffuseness parameters in a one value only mode using a first specific indication and a code word for the one value from the raw coding mode, or
    to encode the quantized diffuseness parameters in a two consecutive values only mode using a second specific indication, a code for the smaller of the two consecutive values and a bit for a difference between an or each actual value and the smaller of the two consecutive values.

5. Apparatus of example 4,
   wherein the parameter encoder (220) is configured to determine, for all diffuseness values associated with a time portion or a frequency portion, whether the coding mode is the raw coding mode, the one value only mode or the two consecutive values only mode,
   wherein the raw mode is signaled using one of two bits, wherein the one value only mode is signaled using another of the two bits having a first value, and
   wherein the two consecutive values only mode is signaled using another one of the two bits having a second value.
6. Apparatus of one of the preceding examples, wherein the parameter quantizer (210) is configured
   to receive, for each direction parameter, a Cartesian vector having two or three components, and
   to convert the Cartesian vector to a representation having an azimuth value and an elevation value.
7. Apparatus of one of the preceding examples,
   wherein the parameter quantizer (210) is configured to determine, for the quantization of the direction parameter, a quantization precision, the quantization precision depending on a diffuseness parameter associated with the direction parameter, so that a direction parameter associated with a lower diffuseness parameter is quantized more precisely than a direction parameter associated with a higher diffuseness parameter.
8. Apparatus of example 7,
   wherein the parameter quantizer (210) is configured to determine the quantization precision
   so that the quantized points are quasi-uniformly distributed on a unit sphere, or
   so that the quantized points are distributed symmetrically with respect to an x-axis, a y-axis or a z-axis, or
   a quantization of a given direction to the closest quantization point or one of the several closest quantization points by mapping to an integer index is a constant time operation, or
   so that the computation of a corresponding point on the sphere from the integer index and dequantization to a direction is a constant or logarithmic time operation with respect to the total number of points on the sphere.
9. Apparatus of one of examples 6, 7 or 8,
   wherein the parameter quantizer (210) is configured to quantize the elevation angle having negative and positive values to a set of unsigned quantization indices, wherein a first group of quantization indices indicate negative elevation angles and the second group of quantization indices indicate positive elevation angles.
10. Apparatus of one of the preceding examples,
    wherein the parameter quantizer (210) is configured to quantize an azimuth angle using a number of possible quantization indices, wherein the number of quantization indices decreases from lower elevation angles to higher elevation angles so that the first number of possible quantization indices for
    a first elevation angle having a first magnitude is higher than a second number of possible quantization indices for a second elevation angle having a second magnitude, the second magnitude being greater in absolute value than the first magnitude.
11. Apparatus of example 10, wherein the parameter quantizer (210) is configured
   to determine from a diffuseness value associated with the azimuth angle a needed precision,
   to quantize an elevation angle associated with the azimuth angle using the needed precision, and
   to quantize the azimuth angle using the quantized elevation angle.
12. Apparatus of one of the preceding examples,
    wherein the quantized direction parameter has a quantized elevation angle and a quantized azimuth angle, and wherein the parameter encoder (220) is configured to firstly encode the quantized elevation angle and to then encode the quantized azimuth angle.
13. Apparatus of one of the preceding examples,
    wherein the quantized direction parameters comprise unsigned indices for a pair of azimuth and elevation angles,
    wherein the parameter encoder (220) is configured to convert the unsigned indices into signed indices, so that an index indicating a zero angle is situated in a middle of a signed interval of possible values and,
    wherein the parameter encoder (220) is configured to perform a reordering transformation to the signed indices to interleave positive and negative numbers into unsigned numbers.
14. Apparatus of one of the preceding examples,
    wherein the quantized direction parameters comprise reordered or non-reordered unsigned azimuth and elevation indices, and
    wherein the parameter encoder (220) is configured to merge the indices of the pair into a sphere index, and
    to perform a raw coding of the sphere index.
15. Apparatus of example 14,
    wherein the parameter encoder (220) is configured to derive the sphere index from a sphere offset and the current reordered or non-reordered azimuth index, and
    wherein the sphere offset is derived from a sum of azimuth alphabets corresponding to reordered or non-reordered elevation indices smaller than the current reordered or non-reordered elevation index.
16. Apparatus of one of the preceding examples, wherein the parameter encoder (220) is configured to perform entropy coding for quantized direction parameters being associated with diffuseness values being lower or equal than a threshold and to perform raw coding for quantized direction parameters being associated with diffuseness values being greater than the threshold.
17. Apparatus of example 16,
    wherein the parameter encoder (220) is configured to determine the threshold dynamically using a quantization alphabet and the quantization of the diffuseness parameters, or wherein the parameter encoder (220) is configured to determine the threshold based on the quantization alphabet of the diffuseness parameters.
18. Apparatus of one of the preceding examples,
    wherein the parameter quantizer (210) is configured to determine, as quantized direction parameters, elevation indices, elevation alphabets associated with the elevation indices, azimuth indices and azimuth alphabets associated with the azimuth indices,
    wherein the parameter encoder (220) is configured to derive an average direction vector from quantized direction vectors for a time portion or a frequency portion of an input signal, quantize the average direction vector using a best angular precision of the vectors for the time portion or the frequency portion, and encode the quantized average direction vector, or wherein the output interface (230) is configured to enter the encoded average direction vector into the encoded parameter representation as an additional side information.

19. Apparatus of example 18, wherein the parameter encoder (220) is configured to calculate predicted elevation indices and predicted azimuth indices using the average direction vector, and to calculate the signed distances between the elevation indices and the predicted elevation indices, and between the azimuth indices and the predicted azimuth indices.

20. Apparatus of example 19, wherein the parameter encoder (220) is configured to transform the signed distances into a reduced interval by adding a value for small values and subtracting a value for large values.

21. Apparatus of one of the preceding examples, wherein the parameter encoder (220) is configured to decide, whether the quantized direction parameters are encoded by either a raw coding mode or an entropy coding mode, and wherein the output interface (230) is configured to introduce a corresponding indication into the encoded parameter representation.

22. Apparatus of one of the preceding examples, wherein the parameter encoder (220) is configured to perform entropy coding using a Golomb-Rice method or a modification thereof.

23. Apparatus of one of examples 18 to 22, wherein the parameter encoder (220) is configured to convert components of the average direction vector into a signed representation so that a corresponding zero value is in the middle of a signed interval of possible values, perform a reordering transformation of the signed values to interleave positive and negative numbers into unsigned numbers, encode a result using an encoding function to obtain encoded components of the average direction vector; and encode a Golomb-Rice parameter using an alphabet size depending on a maximum of alphabet sizes for a corresponding component of the direction vector.

24. Apparatus of one of examples 19 to 23, wherein the parameter encoder (220) is configured to perform a reordering transformation of the signed distances or reduced signed distances to interleave positive and negative numbers into unsigned numbers, wherein the parameter encoder (220) is configured to encode the reordered signed distances or reordered reduced signed distances using a Golomb-Rice method or a modification thereof.

25. Apparatus of example 24, wherein the parameter encoder (220) is configured to apply a Golomb-Rice method or a modification thereof using determining a most significant part and a least significant part of a value to be coded;

calculating an alphabet for the most significant part;

calculating an alphabet for the least significant part; and encoding the most significant part in unary using the alphabet for the most significant part and encoding the least significant part in binary using the alphabet for the least significant part.

26. Apparatus of one of the preceding examples, wherein the parameter encoder (220) is configured to apply a Golomb-Rice method or a modification thereof, using determining a most significant part and a least significant part of a value to be coded; and calculating an alphabet for the most significant part, wherein when the alphabet of the most significant part is less than or equal to a predefined value, such as 3, an EncodeQuasiUniform method is used for encoding the entire value, wherein an exemplary EncodeQuasiUniform method, like a punctured code, produces codes of one length only or codes having two lengths only, or to encode the least significant part in a raw coding mode using a binary code if the encoding alphabet has a size of a power of two, or to encode the least significant part in the raw coding mode using a punctured code, if the encoding alphabet is different from a power of two.

27. Apparatus of one of the preceding examples, further comprising a parameter calculator for calculating the diffuseness parameters with a first time or frequency resolution and for calculating the direction parameters with a second time or frequency resolution as defined in any one of the attached claims 1 to 15.

28. Method of encoding directional audio coding parameters comprising diffuseness parameters and direction parameters, comprising:

quantizing the diffuseness parameters and the direction parameters;

encoding quantized diffuseness parameters and quantized direction parameters; and generating an encoded parameter representation comprising information on encoded diffuseness parameters and encoded direction parameters.

29. Decoder for decoding an encoded audio signal comprising encoded directional audio coding parameters comprising encoded diffuseness parameters and encoded direction parameters, comprising;

an input interface (800) for receiving the encoded audio signal and for separating, from the encoded audio signal, the encoded diffuseness parameters and the encoded direction parameters;

a parameter decoder (820) for decoding the encoded diffuseness parameters and the encoded direction parameters to obtain quantized diffuseness parameters and quantized direction parameters; and a parameter dequantizer (840) for determining, from the quantized diffuseness parameters and the quantized direction parameters, dequantized diffuseness parameters and dequantized direction parameters.

30. Decoder of example 29, wherein the input interface (800) is configured to determine, from a coding mode indication (806) included in the encoded audio signal, whether the parameter decoder (820) is to use a first decoding mode being a raw decoding mode or a second decoding mode being a decoding mode with modeling and being different from the first decoding mode, for decoding the encoded direction parameters.

31. Decoder of example 29 or 30,
- wherein the parameter decoder (820) is configured to decode an encoded diffuseness parameter (804) for a frame of the encoded audio signal to obtain a quantized diffuseness parameter for the frame,
- wherein the dequantizer (840) is configured to determine a dequantization precision for the dequantization of at least one direction parameter for the frame using the quantized or dequantized diffuseness parameter, and
- wherein the parameter dequantizer (840) is configured to dequantize a quantized direction parameter using the dequantization precision.

32. Decoder of example 29, 30 or 31,
- wherein the parameter decoder (820) is configured to determine, from a dequantization precision, a decoding alphabet for decoding the encoded direction parameter for the frame, and
- wherein the parameter decoder (820) is configured to decode the encoded direction parameter using the decoding alphabet to obtain the quantized direction parameter.

33. Decoder of one of examples 29 to 32,
- wherein the parameter decoder (820) is configured to derive a quantized sphere index from the encoded direction parameter, and to decompose the quantized sphere index into a quantized elevation index and the quantized azimuth index.

34. Decoder of one of examples 29 to 33, wherein the parameter decoder (820) is configured
- to determine, from a dequantization precision, an elevation alphabet or
- to determine, from a quantized elevation parameter or a dequantized elevation parameter, an azimuth alphabet.

35. Decoder of one of examples 29 to 34, wherein the parameter decoder (820) is configured
- to decode, from the encoded direction parameters, a quantized elevation parameter, and to decode, from the encoded direction parameters, a quantized azimuth parameter,
- wherein the parameter dequantizer (840) is configured to determine, from the quantized elevation parameter or a dequantized elevation parameter, an azimuth alphabet, wherein a size of the azimuth alphabet is greater for an elevation data indicating an elevation of a first absolute elevation angle compared to an elevation data indicating an elevation of a second absolute elevation angle, the second absolute elevation angle being greater than the first absolute elevation angle, and
- wherein the parameter decoder (820) is configured to use the azimuth alphabet for generating a quantized azimuth parameter, or wherein the parameter dequantizer is configured to use, for dequantizing the quantized azimuth parameter, the azimuth alphabet.

36. Decoder of one of examples 29 to 35,
- wherein the input interface (800) is configured to determine a decoding mode with modeling from a decoding mode indication (806) in the encoded audio signal,
- wherein the parameter decoder (820) is configured to obtain an average elevation index or an average azimuth index.

37. Decoder of example 36, wherein the parameter decoder (820) is configured to determine, from a quantized diffuseness index for a frame, a dequantization precision for the frame (851),
- to determine (852a) from the dequantization precision for the frame, an elevation average alphabet or an azimuth average alphabet, and
- to calculate the average elevation index using bits (808b) in the encoded audio signal and the elevation average alphabet, or to calculate the average azimuth index using bits (808a) in the encoded audio signal and the azimuth average alphabet.

38. Decoder of one of examples 36 or 37,
- wherein the parameter decoder (820) is configured to decode certain bits (808c) in the encoded audio signal to obtain a decoded elevation Golomb-Rice parameter, and to decode further bits (808c) in the encoded audio signal to obtain decoded elevation distances, or
- wherein the parameter decoder (820) is configured to decode certain bits (808a) in the encoded audio signal to obtain a decoded azimuth Golomb-Rice parameter, and to decode further bits (808f) in the encoded audio signal to obtain decoded azimuth distances,
- wherein the parameter decoder (820) is configured to calculate quantized elevation parameters from the elevation Golomb-Rice parameter and the decoded elevation distances and the elevation average index, or to calculate quantized azimuth parameters from the azimuth Golomb-Rice parameter and the decoded azimuth distances and the azimuth average index.

39. Decoder of one of examples 29 to 38,
- wherein the parameter decoder (820) is configured to decode a diffuseness parameter for a time and frequency portion from the encoded audio signal to obtain a quantized diffuseness parameter (850),
- wherein the parameter dequantizer (840) is configured to determine a dequantization precision from the quantized or a dequantized diffuseness parameter (851),
- wherein the parameter decoder (820) is configured to derive an elevation alphabet from the dequantization precision (852a) and to use the elevation alphabet to obtain a quantized elevation parameter for the time and frequency portion of the frame, and
- wherein the dequantizer is configured to dequantize the quantized elevation parameter using the elevation alphabet to obtain a dequantized elevation parameter for the time and frequency portion of the frame.

40. Decoder of one of examples 29 to 39,
- wherein the parameter decoder (820) is configured to decode an encoded direction parameter to obtain a quantized elevation parameter,
- wherein the parameter dequantizer (840) is configured to determine an azimuth alphabet from the quantized elevation parameter or a dequantized elevation parameter (852c), and
- wherein the parameter decoder (820) is configured to calculate a quantized azimuth parameter using the azimuth alphabet (852d), or wherein the parameter dequantizer (840) is configured to dequantize the quantized azimuth parameter using the azimuth alphabet.

41. Decoder of one of examples 29 to 40, wherein the parameter dequantizer (840) is configured
- to determine an elevation alphabet using a dequantization precision (852a), and to determine an azimuth alphabet (852c) using the dequantization precision and the quantized or dequantized elevation parameter generated using the elevation alphabet, and wherein the parameter decoder (820) is configured to use the elevation alphabet for decoding the encoded direction parameter to obtain a quantized elevation parameter and to use the azimuth alphabet for decoding the encoded direction parameter to obtain a quantized azimuth parameter, or wherein the parameter dequantizer (840) is configured to dequantize the quantized elevation parameter using the elevation alphabet and to dequantize the quantized azimuth parameter using the azimuth alphabet.

42. Decoder of example 33, wherein the parameter decoder (820) is configured
   to calculate a predicted elevation index or a predicted azimuth index using the average elevation index or average azimuth index, and
   to perform a Golomb-Rice decoding operation, or a modification thereof, to obtain a distance for an azimuth or elevation parameter, and
   to add the distance for the azimuth or elevation parameter to the average elevation index or the average azimuth index to obtain the quantized elevation index or the quantized azimuth index.

43. Decoder of one of examples 29 to 42, further comprising:
   a parameter resolution converter (710) for converting a time/frequency resolution of the dequantized diffuseness parameter or a time or frequency resolution of the dequantized azimuth or elevation parameter or a parametric representation derived from the dequantized azimuth parameter or dequantized elevation parameter into a target time or frequency resolution, and
   an audio renderer (420) for applying the diffuseness parameters and the direction parameters in the target time or frequency resolution to an audio signal to obtain a decoded multi-channel audio signal.

44. Decoder of example 43, comprising:
   a spectrum/time converter (440) for converting the multi-channel audio signal form a spectral domain representation into a time domain representation having a time resolution higher than the time resolution of the target time or frequency resolution.

45. Decoder of one of examples 29 to 44,
   wherein the encoded audio signal comprises an encoded transport signal,
   wherein the input interface (800) is configured to extract the encoded transport signal,
   wherein the decoder comprises a transport signal audio decoder (340) for decoding the encoded transport signal,
   wherein the decoder furthermore comprises a time/spectrum converter (430) for converting the decoded transport signal into a spectral representation, and
   wherein the decoder comprises an audio renderer (420, 440) for rendering a multi-channel audio signal using the dequantized diffuseness parameters and the dequantized direction parameters, and
   wherein the decoder further comprises a spectrum/time converter (440) for converting a rendered audio signal into a time domain representation.

46. Method for decoding an encoded audio signal comprising encoded directional audio coding parameters comprising encoded diffuseness parameters and encoded direction parameters, comprising;
   receiving (800) the encoded audio signal and for separating, from the encoded audio signal, the encoded diffuseness parameters and the encoded direction parameters;
   decoding (820) the encoded diffuseness parameters and the encoded direction parameters to obtain quantized diffuseness parameters and quantized direction parameters; and
   determining (840), from the quantized diffuseness parameters and the quantized direction parameters, dequantized diffuseness parameters and dequantized direction parameters.

47. Computer program for performing, when running on a computer or a processor, the method of example 28 or 46.

An inventively encoded audio signal comprising a parameter representation can be stored on a digital storage medium or a non-transitory storage medium or can be transmitted on a transmission medium such as a wireless transmission medium or a wired transmission medium such as the Internet.

Although some aspects have been described in the context of an apparatus, it is clear that these aspects also represent a description of the corresponding method, where a block or device corresponds to a method step or a feature of a method step. Analogously, aspects described in the context of a method step also represent a description of a corresponding block or item or feature of a corresponding apparatus.

Depending on certain implementation requirements, embodiments of the invention can be implemented in hardware or in software. The implementation can be performed using a digital storage medium, for example a floppy disk, a DVD, a CD, a ROM, a PROM, an EPROM, an EEPROM or a FLASH memory, having electronically readable control signals stored thereon, which cooperate (or are capable of cooperating) with a programmable computer system such that the respective method is performed.

Some embodiments according to the invention comprise a data carrier having electronically readable control signals, which are capable of cooperating with a programmable computer system, such that one of the methods described herein is performed.

Generally, embodiments of the present invention can be implemented as a computer program product with a program code, the program code being operative for performing one of the methods when the computer program product runs on a computer. The program code may for example be stored on a machine readable carrier.

Other embodiments comprise the computer program for performing one of the methods described herein, stored on a machine readable carrier or a non-transitory storage medium.

In other words, an embodiment of the inventive method is, therefore, a computer program having a program code for performing one of the methods described herein, when the computer program runs on a computer.

A further embodiment of the inventive methods is, therefore, a data carrier (or a digital storage medium, or a computer-readable medium) comprising, recorded thereon, the computer program for performing one of the methods described herein.

A further embodiment of the inventive method is, therefore, a data stream or a sequence of signals representing the computer program for performing one of the methods described herein. The data stream or the sequence of signals may for example be configured to be transferred via a data communication connection, for example via the Internet.

A further embodiment comprises a processing means, for example a computer, or a programmable logic device, configured to or adapted to perform one of the methods described herein.

A further embodiment comprises a computer having installed thereon the computer program for performing one of the methods described herein.

In some embodiments, a programmable logic device (for example a field programmable gate array) may be used to perform some or all of the functionalities of the methods described herein. In some embodiments, a field programmable gate array may cooperate with a microprocessor in order to perform one of the methods described herein. Generally, the methods are performed by any hardware apparatus.

While this invention has been described in terms of several advantageous embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations, and equivalents as fall within the true spirit and scope of the present invention.

REFERENCES

[1] V. Pulkki, M-V. Laitinen, J. Vilkamo, J. Ahonen, T. Lokki, and T. Pihlajamäki, "Directional audio coding—perception-based reproduction of spatial sound", International Workshop on the Principles and Application on Spatial Hearing, November 2009, Zao; Miyagi, Japan.

[2] V. Pulkki, "Virtual source positioning using vector base amplitude panning", J. Audio Eng. Soc., 45(6): 456-466, June 1997.

[3] J. Ahonen and V. Pulkki, "Diffuseness estimation using temporal variation of intensity vectors", in Workshop on Applications of Signal Processing to Audio and Acoustics WASPAA, Mohonk Mountain House, New Paltz, 2009.

[4] T. Hirvonen, J. Ahonen, and V. Pulkki, "Perceptual compression methods for metadata in Directional Audio Coding applied to audiovisual teleconference", AES 126th Convention, 2009, May 7-10, Munich, Germany.

The invention claimed is:

1. An apparatus for encoding directional audio coding parameters comprising diffuseness parameters and direction parameters, comprising:
a parameter calculator for calculating the diffuseness parameters with a first time or frequency resolution and for calculating the direction parameters with a second time or frequency resolution; and
a quantizer and encoder processor for generating a quantized and encoded representation of the diffuseness parameters and the direction parameters.

2. The apparatus of claim 1, wherein the parameter calculator is configured to calculate the diffuseness parameters and the direction parameters so that the first time resolution is lower than the second time resolution, or the second frequency resolution is greater that the first frequency resolution, or the first time resolution is lower than the second time resolution and the first frequency resolution is equal to the second frequency resolution.

3. The apparatus of claim 1,
wherein the parameter calculator is configured to calculate the diffuseness parameters and the direction parameters for a set of frequency bands, wherein a band comprising a lower center frequency is narrower than a band comprising a higher center frequency.

4. The apparatus of claim 1,
wherein the parameter calculator is configured to acquire initial diffuseness parameters comprising a third time or frequency resolution and to acquire initial direction parameters comprising a fourth time or frequency resolution, and
wherein the parameter calculator is configured to group and average the initial diffuseness parameters so that the third time or frequency resolution is higher than the first time or frequency resolution, or
wherein the parameter calculator is configured to group and average the initial direction parameters so that the fourth time or frequency resolution is higher than the second time or frequency resolution.

5. The apparatus of claim 4,
wherein the third time or frequency resolution and the fourth time or frequency resolution are equal to each other.

6. The apparatus of claim 5,
wherein the third time resolution or frequency resolution is a constant time or frequency resolution, so that each initial diffuseness parameter is associated with a time slot or a frequency bin having the same size, or
wherein the fourth time or frequency resolution is a constant time or frequency resolution, so that each initial direction parameter is associated with a time slot or a frequency bin having the same size, and
wherein the parameter calculator is configured to average over a first plurality of diffuseness parameters associated with a first plurality of time slots, or
wherein the parameter calculator is configured to average over a second plurality of diffuseness parameters associated with a second plurality of frequency bins, or
wherein the parameter calculator is configured to average over a third plurality of direction parameters associated with a third plurality of time slots, or
wherein the parameter calculator is configured to average over a fourth plurality of direction parameters associated with a fourth plurality of frequency bins.

7. The apparatus of claim 1,
wherein the parameter calculator is configured to average using a weighted average, in which a diffuseness parameter or a direction parameter derived from an input signal portion comprising a higher amplitude-related measure is weighted using a higher weighting factor compared to a diffuseness parameter or a direction parameter derived from an input signal portion comprising a lower amplitude-related measure.

8. The apparatus of claim 7,
wherein the amplitude-related measure is a power or an energy in the time portion or the frequency portion or a power or an energy exponentiated by a real non-negative number equal or different from 1 in the time portion or the frequency portion.

9. The apparatus of claim 4,
wherein the parameter calculator is configured to perform the average so that the diffuseness parameter or the direction parameter is normalized with respect to an amplitude-related measure derived from a time portion of an input signal corresponding to the first or the second time or frequency resolution.

10. The apparatus of claim 4,
wherein the parameter calculator is configured to group and average the initial direction parameters using a weighted averaging, wherein the first direction parameter being associated with a first time portion comprising a first diffuseness parameter indicating a lower diffuseness is weighted stronger than a second direction parameter being associated with a second time portion comprising a second diffuseness parameter indicating a higher diffuseness.

11. The apparatus of claim 1,
wherein the parameter calculator is configured to calculate the initial direction parameters so that the initial direction parameters each comprise a Cartesian vector comprising a component for each of two or three directions, and wherein the parameter calculator is configured to perform the averaging for each individual component of the Cartesian vector separately, or wherein the components are normalized so that the sum of squared components of the Cartesian vector for a direction parameter is equal to unity.

12. The apparatus of claim 1, further comprising:
a time-frequency decomposer for decomposing an input signal comprising a plurality of input channels into a time-frequency representation for each input channel, or
wherein the time-frequency decomposer is configured for decomposing the input signal comprising a plurality of input channels into a time-frequency representation for each input channel comprising the third time or frequency resolution or the fourth time or frequency resolution.

13. The apparatus of claim 12,
wherein the time-frequency decomposer comprises a modulated filter bank resulting in complex values for each sub-band signal, wherein each sub-band signal comprises a plurality of time slots per frame and frequency band.

14. The apparatus of claim 1,
wherein the apparatus is configured to associate an indication of the first or the second time or frequency resolution into the quantized and encoded representation for transmission to a decoder or for storage.

15. The apparatus of claim 1, wherein the quantizer and encoder processor for generating a quantized and encoded representation of the diffuseness parameters and the direction parameters comprises a parameter quantizer for quantizing the diffuseness parameters and the direction parameters and a parameter encoder for encoding quantized diffuseness parameters and quantized direction parameters.

16. A method for encoding directional audio coding parameters comprising diffuseness parameters and direction parameters, comprising:
calculating the diffuseness parameters with a first time or frequency resolution and for calculating the direction parameters with a second time or frequency resolution; and
generating a quantized and encoded representation of the diffuseness parameters and the direction parameters.

17. A decoder for decoding an encoded audio signal comprising directional audio coding parameters comprising encoded diffuseness parameters and encoded direction parameters, the decoder comprising:
a parameter processor for decoding the encoded directional audio coding parameters to acquire decoded diffuseness parameters with a first time or frequency resolution and decoded direction parameters with a second time or frequency resolution; and
a parameter resolution converter for converting the encoded or decoded diffuseness parameters or the encoded or decoded direction parameters into converted diffuseness parameters or converted direction parameters comprising a third time or frequency resolution.

18. The decoder of claim 17, further comprising an audio renderer operating in a spectral domain, the spectral domain comprising, for a frame, a first number of time slots and a second number of frequency bands, so that a frame comprises a number of time/frequency bins being equal to a multiplication result of the first number and the second number, wherein the first number and the second number define the third time or frequency resolution.

19. The decoder of claim 17, further comprising an audio renderer operating in a spectral domain, the spectral domain comprising, for a frame, a first number of time slots and a second number of frequency bands, so that a frame comprises a number of time/frequency bins being equal to a multiplication result of the first number and the second number, wherein the first number and the second number define a fourth time-frequency resolution, wherein the fourth time or frequency resolution is equal or higher than the third time or frequency resolution.

20. The decoder in accordance with claim 17,
wherein the first time or frequency resolution is lower than the second time or frequency resolution, and
wherein the parameter resolution converter is configured to generate, from a decoded diffuseness parameter, a first multitude of converted diffuseness parameters and to generate, from a decoded direction parameter, a second multitude of converted direction parameters, wherein the second multitude is greater than the first multitude.

21. The decoder of claim 17,
wherein the encoded audio signal comprises a sequence of frames, wherein each frame is organized in frequency bands, wherein each frame comprises only one encoded diffuseness parameter per frequency band and at least two time-sequential direction parameters per frequency band, and
wherein the parameter resolution converter is configured to associate the decoded diffuseness parameter to all time bins in the frequency band or to each time/frequency bin comprised in the frequency band in the frame, and
to associate one of the at least two direction parameters of the frequency band to a first group of time bins and to each time/frequency bin comprised in the frequency band, and to associate a second decoded direction parameter of the at least two direction parameters to a second group of the time bins and to each time/frequency bin comprised in the frequency band, wherein the second group does not comprise any of the time bins in the first group.

22. The decoder of claim 17, wherein the encoded audio signal comprises an encoded audio transport signal, wherein the decoder comprises:
an audio decoder for decoding the encoded transport audio signal to acquire a decoded audio signal, and
a time/frequency converter for converting the decoded audio signal into a frequency representation comprising the third time or frequency resolution.

23. The decoder of claim 17, comprising:
an audio renderer for applying the converted diffuseness parameters and the converted direction parameters to a spectral representation of an audio signal in the third time or frequency resolution to acquire a synthesis spectrum representation; and
a spectrum/time converter for converting the synthesis spectrum representation in the third or fourth time or frequency resolution to acquire a synthesized time domain spatial audio signal comprising a time resolution being higher than the resolution of the third time or frequency resolution.

24. The decoder of claim 17,
wherein the parameter resolution converter is configured to multiply a decoded direction parameter using a copying operation or to multiply a decoded diffuseness parameter using a copying operation or to smooth or low pass filter a set of multiplied direction parameters or a set of multiplied diffuseness parameters.

25. The decoder of claim 17
wherein the second time or frequency resolution is different from the first time or frequency resolution.

26. The decoder of claim 17,
wherein the first time resolution is lower than the second time resolution, or the second frequency resolution is greater than the first frequency resolution, or the first time resolution is lower than the second time resolution and the first frequency resolution is equal to the second frequency resolution.

27. The decoder of claim 17,
wherein the parameter resolution converter is configured to multiply the decoded diffuseness parameters and decoded direction parameters into a corresponding number of frequency adjacent converted parameters for a set of bands, wherein a band comprising a lower center frequency receives less multiplied parameters than a band comprising a higher center frequency.

28. The decoder of claim 17,
wherein the parameter processor is configured to decode an encoded diffuseness parameter for a frame of the encoded audio signal to acquire a quantized diffuseness parameter for the frame, and wherein the parameter processor is configured to determine a dequantization precision for the dequantization of at least one direction parameter for the frame using the quantized or dequantized diffuseness parameter, and
wherein the parameter processor is configured to dequantize a quantized direction parameter using the dequantization precision.

29. The decoder of claim 17,
wherein the parameter processor is configured to determine, from a dequantization precision, to be used by the parameter processor for dequantizing, a decoding alphabet for decoding an encoded direction parameter for the frame, and
wherein the parameter processor is configured to decode the encoded direction parameter using the determined decoding alphabet and to determine a dequantized direction parameter.

30. The decoder of claim 17,
wherein the parameter processor is configured to determine, from a dequantization precision to be used by the parameter processor for dequantizing the direction parameter, an elevation alphabet for the processing of an encoded elevation parameter and to determine, from an elevation index acquired using the elevation alphabet, an azimuth alphabet, and
wherein the parameter processor is configured to dequantize an encoded azimuth parameter using the azimuth alphabet.

31. A method of decoding an encoded audio signal comprising directional audio coding parameters comprising encoded diffuseness parameters and encoded direction parameters, the method comprising:
decoding the encoded directional audio coding parameters to acquire decoded diffuseness parameters with a first time or frequency resolution and decoded direction parameters with a second time or frequency resolution; and
converting the encoded or decoded diffuseness parameters or the encoded or decoded direction parameters into converted diffuseness parameters or converted direction parameters comprising a third time or frequency resolution.

32. A non-transitory digital storage medium having a computer program stored thereon to perform the method for encoding directional audio coding parameters comprising diffuseness parameters and direction parameters, the method comprising:
calculating the diffuseness parameters with a first time or frequency resolution and for calculating the direction parameters with a second time or frequency resolution; and
generating a quantized and encoded representation of the diffuseness parameters and the direction parameters,
when said computer program is run by a computer.

33. A non-transitory digital storage medium having a computer program stored thereon to perform the method of decoding an encoded audio signal comprising directional audio coding parameters comprising encoded diffuseness parameters and encoded direction parameters, the method comprising:
decoding the encoded directional audio coding parameters to acquire decoded diffuseness parameters with a first time or frequency resolution and decoded direction parameters with a second time or frequency resolution; and
converting the encoded or decoded diffuseness parameters or the encoded or decoded direction parameters into converted diffuseness parameters or converted direction parameters having a third time or frequency resolution,
when said computer program is run by a computer.

* * * * *